United States Patent
Ogata et al.

(10) Patent No.: US 9,171,928 B2
(45) Date of Patent: Oct. 27, 2015

(54) MANUFACTURING METHOD OF SEMICONDUCTOR DEVICE

(71) Applicant: RENESAS ELECTRONICS CORPORATION, Kawasaki-shi, Kanagawa (JP)

(72) Inventors: Tamotsu Ogata, Kawasaki (JP); Toshifumi Iwasaki, Kawasaki (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 58 days.

(21) Appl. No.: 14/091,247

(22) Filed: Nov. 26, 2013

(65) Prior Publication Data
US 2014/0147982 A1    May 29, 2014

(30) Foreign Application Priority Data

Nov. 28, 2012    (JP) .................................. 2012-260354

(51) Int. Cl.
  *H01L 29/66* (2006.01)
  *H01L 21/8234* (2006.01)
  *H01L 21/8238* (2006.01)
  *H01L 29/78* (2006.01)

(52) U.S. Cl.
  CPC .... *H01L 29/6656* (2013.01); *H01L 21/823418* (2013.01); *H01L 21/823425* (2013.01); *H01L 21/823814* (2013.01); *H01L 29/665* (2013.01); *H01L 29/6653* (2013.01); *H01L 29/6659* (2013.01); *H01L 29/7833* (2013.01); *H01L 21/823475* (2013.01)

(58) Field of Classification Search
None
See application file for complete search history.

(56) References Cited

U.S. PATENT DOCUMENTS

| | | | | |
|---|---|---|---|---|
| 5,783,475 | A * | 7/1998 | Ramaswami | 438/303 |
| 5,882,973 | A * | 3/1999 | Gardner et al. | 438/279 |
| 6,187,620 | B1 * | 2/2001 | Fulford et al. | 438/230 |
| 6,291,354 | B1 * | 9/2001 | Hsiao et al. | 438/701 |
| 6,734,114 | B2 * | 5/2004 | Hinoue et al. | 438/770 |

FOREIGN PATENT DOCUMENTS

| | | |
|---|---|---|
| JP | 2000236090 A | 8/2000 |
| JP | 201040734 | 2/2010 |

* cited by examiner

*Primary Examiner* — Andres Munoz
(74) *Attorney, Agent, or Firm* — McDermott Will & Emery LLP

(57) ABSTRACT

Provided is a semiconductor device with improved performance and production yield. Insulating films IL2 and IL3 are formed over a semiconductor substrate in that order to cover a gate electrode. Then, the insulating films IL3 and IL2 are etched back to form sidewall spacers including the insulating films IL2 and IL3 over sidewalls of the gate electrode. The source/drain region is formed in the semiconductor substrate by ion implantation using the gate electrode and the sidewall spacer as a mask. Then, the sidewall spacers are isotropically etched on conditions where the insulating film IL2 is less likely to be etched than the third insulating film IL3 to thereby decrease the thickness of the sidewall spacer. Thereafter, a reaction layer between the metal and the source/drain region is formed over the source/drain region.

14 Claims, 36 Drawing Sheets

MANUFACTURING METHOD OF SEMICONDUCTOR DEVICE

CROSS-REFERENCE TO RELATED APPLICATIONS

The disclosure of Japanese Patent Application No. 2012-260354 filed on Nov. 28, 2012 including the specification, drawings and abstract is incorporated herein by reference in its entirety.

BACKGROUND

The present invention relates to manufacturing methods of semiconductor devices, and more specifically, to a technique suitably applied to a manufacturing method of a semiconductor device having a metal-insulator-semiconductor field-effect transistor (MISFET).

A MISFET can be fabricated by forming a gate insulating film over a semiconductor substrate, forming a gate electrode over the gate insulating film, and then forming source and drain regions by ion implantation or the like. After forming the MISFET, an interlayer insulating film is formed over the semiconductor substrate to cover the MISFET, contact holes are formed in the interlayer insulating film, conductive plugs are formed to fill in the contact holes, and then wirings are formed, which can produce a semiconductor device having the MISFET.

Japanese Unexamined Patent Publication No. 2000-236090 (Patent Document 1), and Japanese Unexamined Patent Publication No. 2010-40734 (Patent Document 2) disclose techniques that involve forming source and drain regions by implantation of impurities using sidewalls as a mask and then etching the sidewalls.

RELATED ART DOCUMENTS

Patent Documents

[Patent Document 1]
 Japanese Unexamined Patent Publication No. 2000-236090
[Patent Document 2]
 Japanese Unexamined Patent Publication No. 2010-40734

SUMMARY

Even the semiconductor device having the MISFET is still desired to improve its performance as much as possible, or to improve its production yield. Alternatively, the semiconductor device is required to achieve both features.

Other problems and new features of the present invention will be better understood after a reading of the following detailed description of the specification in connection with the accompanying drawings.

According to one embodiment of the invention, a first insulating film and a second insulating film are formed over a semiconductor substrate in that order to cover a gate electrode. The second insulating film and the first insulating film are etched back to thereby form a sidewall spacer including the first and second insulating films over each sidewall of the gate electrode. Then, ion implantation is performed in the semiconductor substrate using the gate electrode and the sidewall spacers as a mask, which forms the source and drain regions SD in the semiconductor substrate. Thereafter, the sidewall spacers are isotropically etched on conditions in which the first insulating film is less likely to be etched than the second insulating film, which decreases the thickness of each sidewall spacer.

According to one embodiment of the invention, the semiconductor device can improve its performance or its production yield. Alternatively, the semiconductor device can achieve both features.

DETAILED DESCRIPTION

Figure 1:
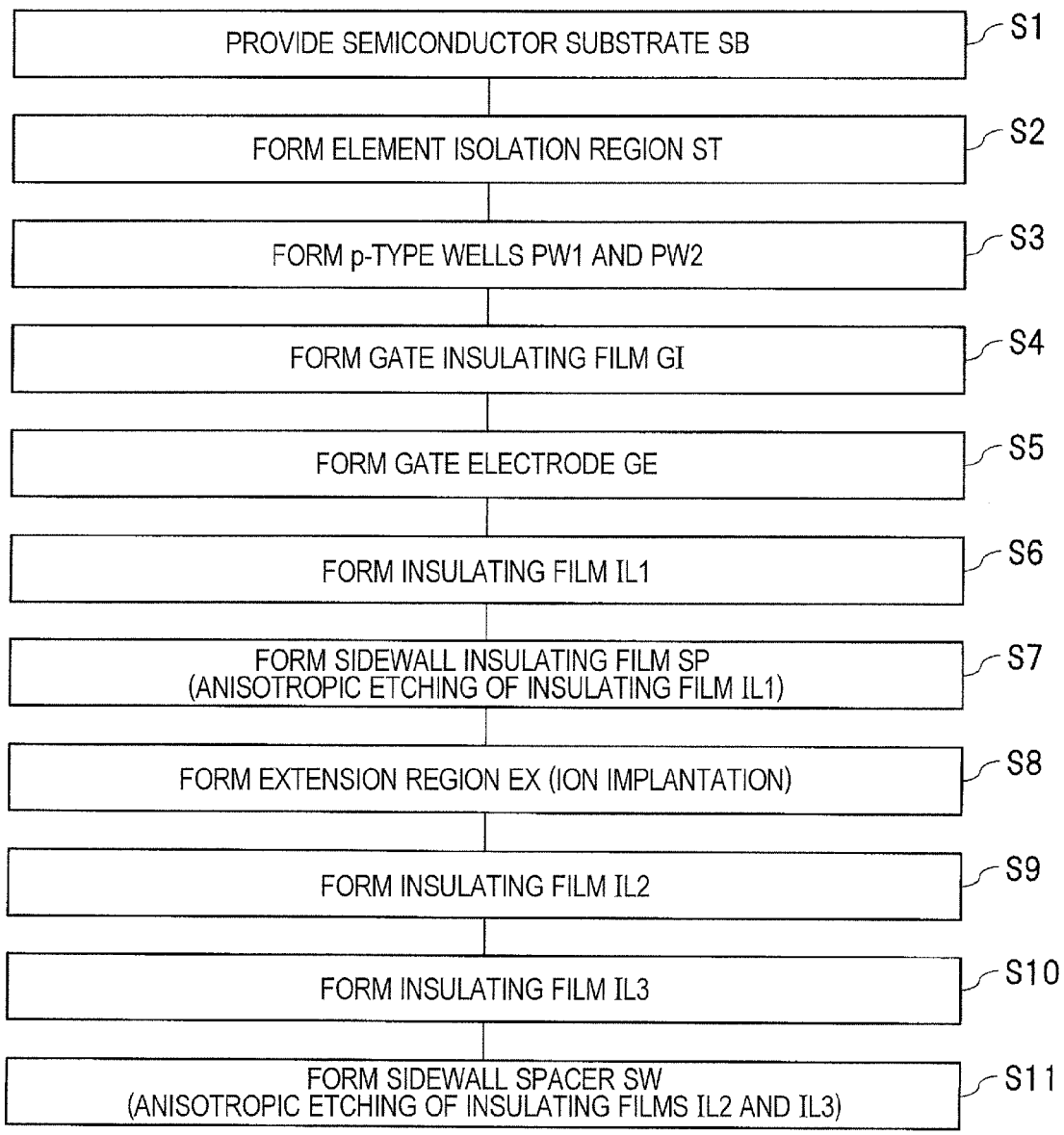
FIG. 1 is a flowchart showing manufacturing steps of a semiconductor device in one embodiment.

The following preferred embodiments of the invention may be described below by being divided into a plurality of sections or embodiments for convenience, if necessary, which are not independent from each other unless otherwise specified. One of the sections or embodiments may be a modified example, a detailed description, or supplementary explanation of a part or all of the other. Even when referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when obviously limited to the specific number in principle. The components (including steps) in the following embodiments are not necessarily essential unless otherwise specified, and except when clearly considered to be essential in principle. Likewise, when referring to the shape of one component, or the positional relationship between the components in the following embodiments, any shape or positional relationship substantially similar or approximate to that described herein may be included in the invention unless otherwise specified and except when clearly considered not to be so in principle. The same goes for the above numerical value, the range, and the like.

Now, the preferred embodiments of the invention will be described in detail below with reference to the accompanying drawing. In each drawing for explaining the embodiments, the same or like parts having the same function are indicated by the same or similar reference characters, and its description will not be repeated in principle. In the embodiments below, the description of the same or like parts will not be repeated in principle if not necessary.

In the accompanying drawings used in the embodiments, even some cross-sectional views may omit hatching for easy understanding. On the other hand, even some plan views may be designated by hatching for easy understanding.

First Embodiment

Manufacturing Process

Manufacturing steps of a semiconductor device according to one embodiment of the invention will be described below with reference to the accompanying drawings.

Figure 2:
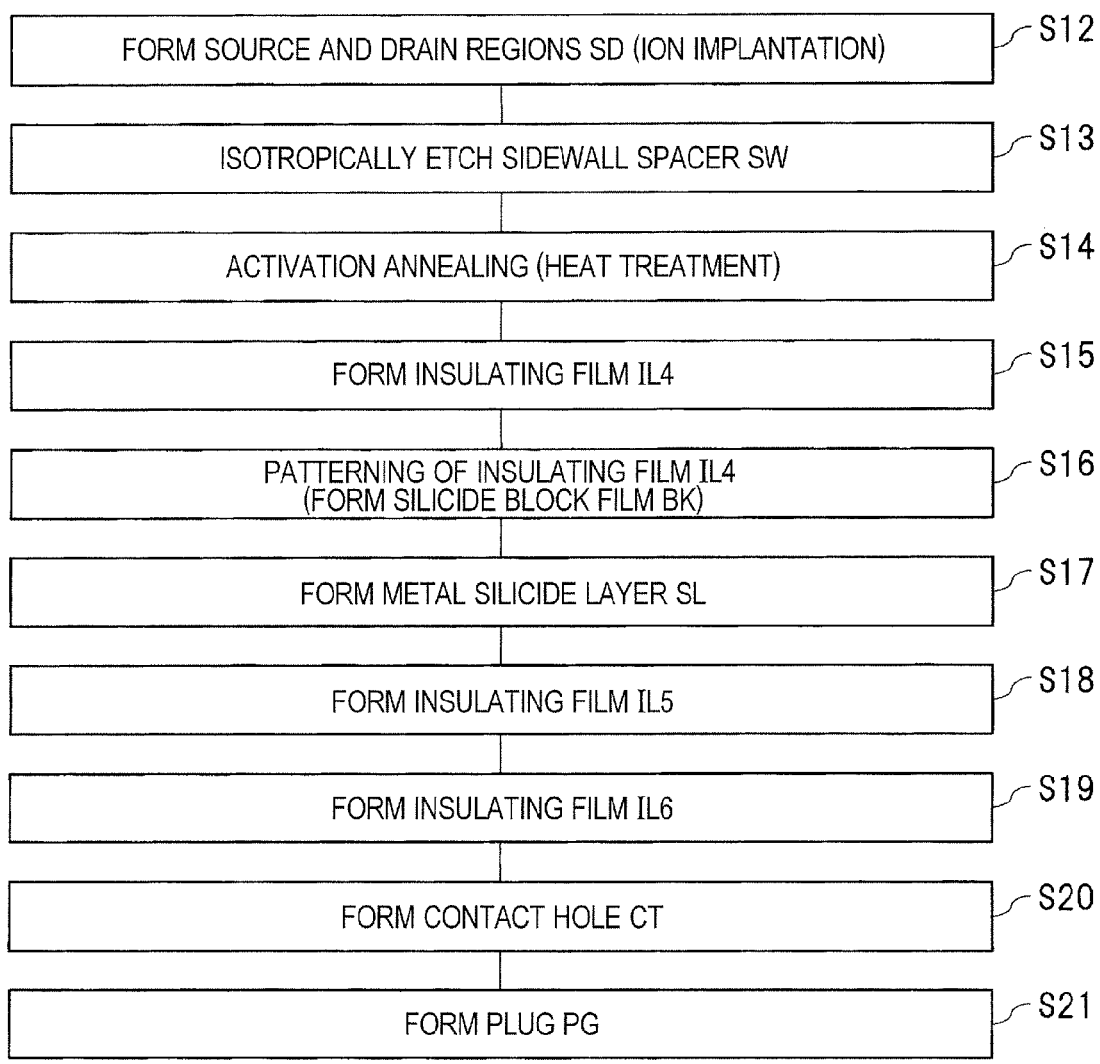
FIG. 2 is another flowchart showing other manufacturing steps of the semiconductor device following the flowchart shown in FIG. 1.

FIGS. 1 and 2 are manufacturing process flowcharts showing parts of manufacturing steps of the semiconductor device having a metal insulator semiconductor field effect transistor (MISFET) in the one embodiment. FIGS. 3 to 22 are cross-sectional views of main parts of the manufacturing steps of the semiconductor device of this embodiment, that is, the semiconductor device having the MISFET. In this embodiment, an n-channel MISFET is formed as the MISFET by way of example. However, this embodiment can be applied to the formation of a p-channel MISFET instead of the n-channel MISFET. Further, this embodiment can be also applied to the formation of a complementary metal insulator semiconductor field effect transistor (CMISFET) instead of the n-channel MISFET.

Figure 3:
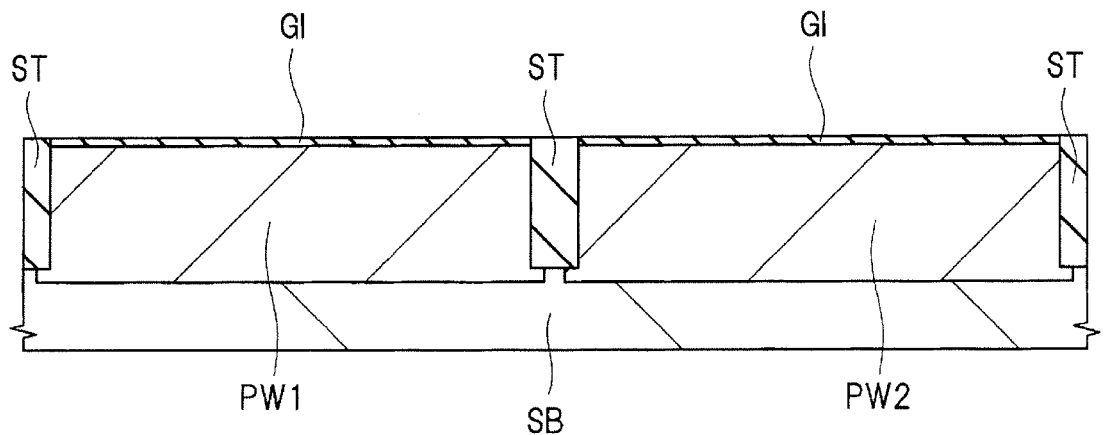
FIG. 3 is a cross-sectional view of a main part of a manufacturing step of the semiconductor device in the one embodiment.

As shown in FIG. 3, first, a semiconductor substrate (semiconductor wafer) SB made of p-type monocrystalline silicon is provided (in step S1 shown in FIG. 1). The substrate has a specific resistance of, for example, about 1 to 10 Ωcm.

Then, element isolation regions ST are formed at the main surface of the semiconductor substrate SB (in step S2 shown in FIG. 1).

Each element isolation region ST is formed of an insulator, such as silicon oxide, for example, by a shallow trench isolation (STI) method or a local oxidization of silicon (LOCOS) method. For example, the element isolation region ST can be formed by forming a trench (element isolation trench) in the semiconductor substrate SB, and then filling the trench with an insulating film. In that case, the element isolation region ST is formed of the insulating film embedded in the trench (element isolation trench) formed in the semiconductor substrate SB.

Then, well regions, that is, p-type wells (well regions) PW1 and PW2 are formed in a predetermined depth from the main surface of the semiconductor substrate SB (in step S3 shown in FIG. 1).

The p-type wells PW1 and PW2 can be formed, for example, by ion-implanting p-type impurities, such as boron (B), in the semiconductor substrate SB. The p-type well PW1 and the p-type well PW2 have the same conduction type, and can be formed in the same ion implantation step or in different ion implantation steps. In another embodiment, when the wells PW1 and PW2 have different conduction types (that is, when the one of the wells PW1 and PW2 is a p-type well, and the other is an n-type well), the different ion implantation steps can be performed.

Then, after cleansing (cleaning) the surface of the semiconductor substrate SB, for example, by wet etching using a hydrofluoric acid (HF) aqueous solution, a gate insulating film GI is formed over the surface of the semiconductor substrate SB (that is, the surfaces of the p-type wells PW1 and PW2) (in step S4 shown in FIG. 1).

The gate insulating film GI can be formed of, for example, a thin silicon oxide film, by a thermal oxidation method or the like. The gate insulating film GI can be formed of a silicon oxynitride film, instead of the silicon oxide film. In this case, for example, the silicon oxide film formed by the thermal oxidation can be subjected to nitriding treatment, which can produce the silicon oxynitride film as the gate insulating film GI.

Figure 4:
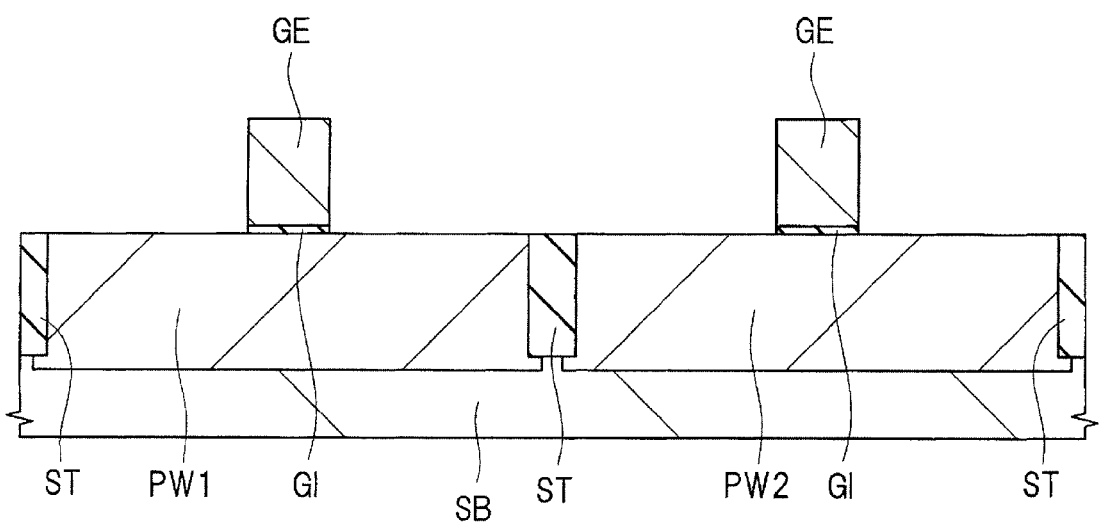
FIG. 4 is a cross-sectional view of a main part of another manufacturing step of the semiconductor device, following the step shown in FIG. 3.

Then, as shown in FIG. 4, the gate electrodes GE are formed (in step S5 shown in FIG. 1).

The gate electrode GE can be formed, for example, in the following way. First, a silicon film, such as a polycrystalline silicon (polysilicon) film, is formed as a conductive film (conductive membrane) for formation of the gate electrode over the semiconductor substrate SB (that is, gate insulating film GI). The silicon film is preferably converted into a semiconductor film having a low resistivity (doped polysilicon film) by introducing impurities into the silicon film in or after deposition. The silicon film can be formed, for example, by a chemical vapor deposition (CVD) method, and can have its thickness (formation thickness) of, for example, about 100 nm. Then, the silicon film is patterned by photolithography or dry etching to thereby form the gate electrode GE. In this case, the gate electrode GE is comprised of the patterned silicon film (doped silicon film).

Each gate electrode GE is formed over the gate insulating film GI formed over the semiconductor substrate SB. That is, the gate electrodes GE are formed over the semiconductor substrate SB via the gate insulating film GI (specifically, over the p-type wells PW1 and PW2). As shown in FIG. 4, the gate electrode GE is formed over the p-type well PW1 via the gate insulating film GI, and the gate electrode GE is formed over the p-type well PW2 over the gate insulating film GI.

The gate insulating film GI remaining under the gate electrode GE serves as a gate insulating film of the MISFET, and the gate electrode GE serves as the gate electrode of the MISFET. The gate insulating film GI except for a part of the gate insulating film GI not covered with the gate electrode GE can be removed by dry etching for processing the gate electrode GE, and then by the following wet etching.

Figure 5:
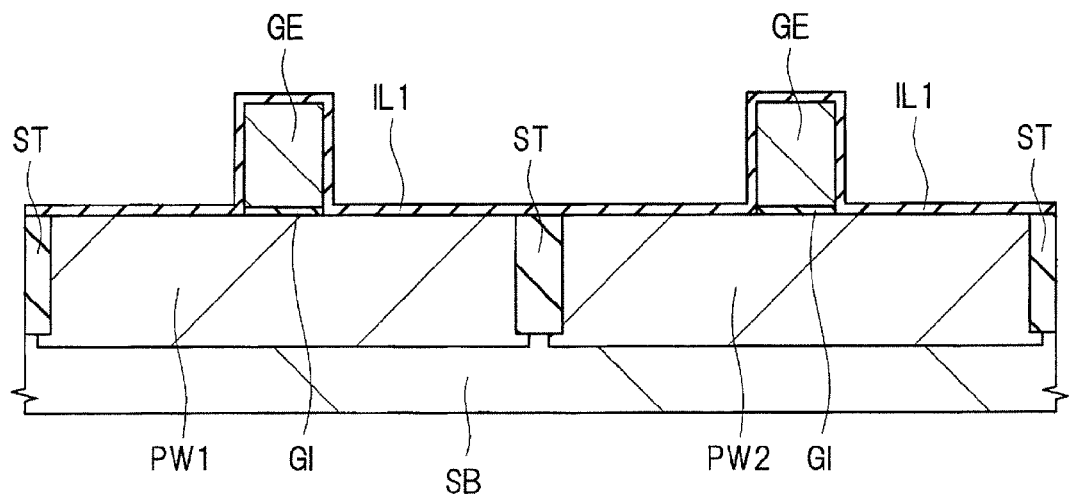
FIG. 5 is a cross-sectional view of a main part of another manufacturing step of the semiconductor device, following the step shown in FIG. 4.

Then, as shown in FIG. 5, an insulating film IL1 for an offset spacer is formed over the main surface of the semiconductor substrate SB to cover the gate electrode GE (in step S6 of FIG. 1). The insulating film IL1 is made of a silicon oxide film or silicon nitride film. The formation thickness (thickness) of the insulating film IL1 can be, for example, in a range of about 3 to 5 nm. The insulating film IL1 can be formed, for example, using the CVD method or the like.

Figure 6:
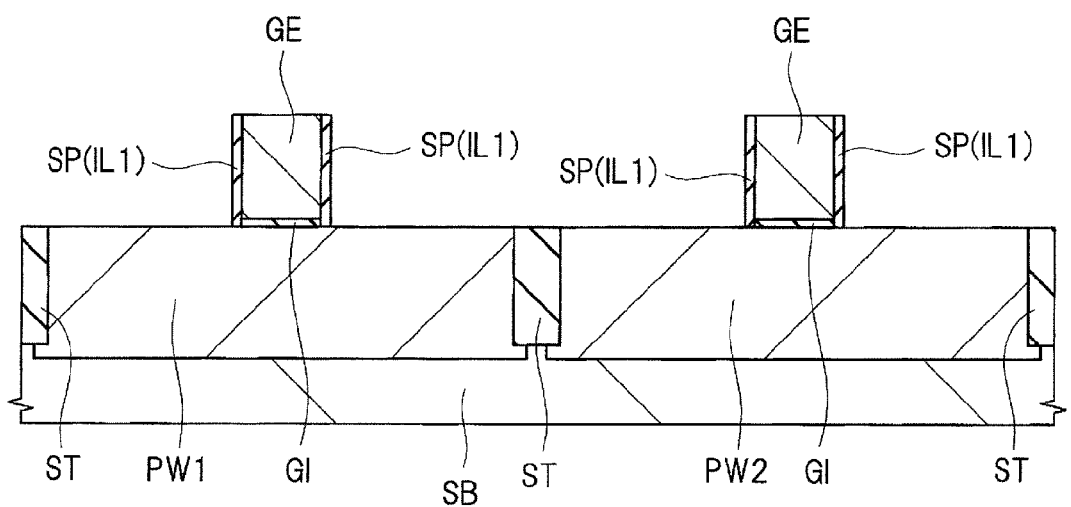
FIG. 6 is a cross-sectional view of a main part of another manufacturing step of the semiconductor device, following the step shown in FIG. 5.

Then, as shown in FIG. 6, the insulating film IL1 is subjected to anisotropic etching (etched back) by a reactive ion etching (RIE) method to leave the insulating film IL1 on each sidewall of the gate electrode GE and to remove the insulating film IL1 in other regions (over the gate electrodes GE and over regions of the semiconductor substrate SB not covered with the gate electrode GE). Thus, a sidewall insulating film (offset spacer) SP is formed of the remaining insulating film IL1 over each sidewall of the gate electrode GE (in step S7 of FIG. 1).

The sidewall insulating film SP is formed over each sidewall of the gate electrode GE. When the sidewall insulating film SP is not necessarily positioned on each sidewall of the gate electrode GE, the process for forming the insulating film IL1 in step S6 and the process for anisotropic etching of the insulating film IL1 in step S7 can be omitted.

The sidewall insulating film SP is formed before ion implantation for forming an extension region EX to be described later, and serves as an ion implantation blocking mask against the ion implantation for forming the extension region EX. The sidewall spacer SW is formed before ion implantation for forming a source/drain region SD as will be described later, and serves as an ion implantation blocking mask against the ion implantation for forming the source/drain region SD to be described later.

In forming a CMISFET, an n-channel MISFET and a p-channel MISFET differ in thickness of the sidewall insulating film SP (thickness in the gate length).

Figure 7:
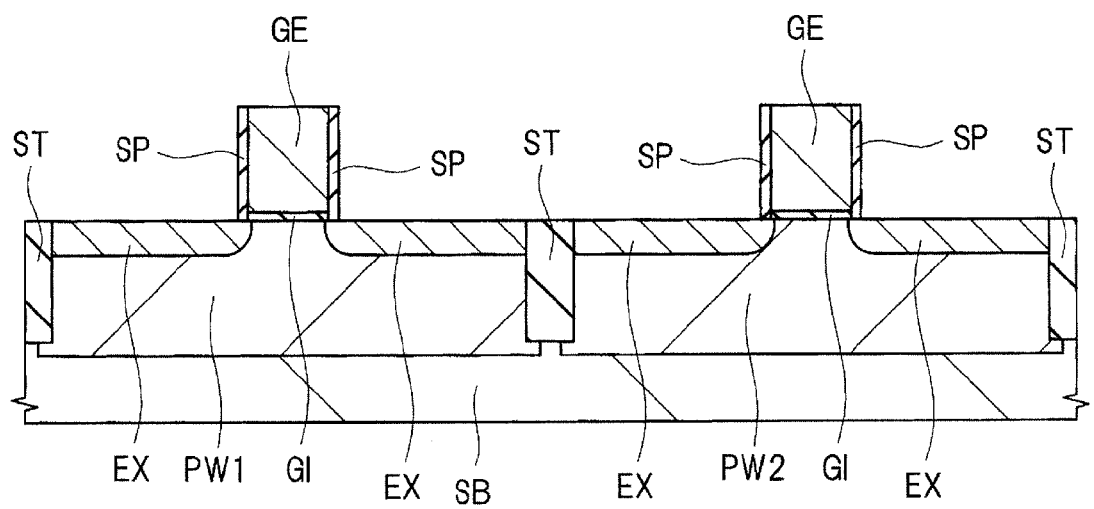
FIG. 7 is a cross-sectional view of a main part of another manufacturing step of the semiconductor device, following the step shown in FIG. 6.

Then, as shown in FIG. 7, conductive impurities (dopants) are ion-implanted into regions of the semiconductor substrate SB (p-type wells PW1 and PW2) on both sides of the gate electrode GE to form the extension regions (source and drain extension regions, n⁻-semiconductor region, n-type impurity diffusion layer) EX (in step S8 shown in FIG. 1).

Herein, the formation of the n-channel MISFET is described. The extension region EX is a semiconductor region formed by ion-implanting n-type impurities, such as phosphorus (P) or arsenic (As). In order to form the p-channel MISFET, p-type impurities, such as boron (B), are ion-implanted.

The extension region EX has a lower concentration of impurities than the source and drain regions SD to be formed later. The depth (junction depth) of the extension region EX is shallower than that of the source and drain regions SD to be formed later. In the ion implantation for forming the extension regions EX, the gate electrode GE and the sidewall insulating film SP can serve as a mask (ion implantation blocking mask).

In regions of the semiconductor substrate SB (p-type wells PW1, PW2) directly under the gate electrode GE and the sidewall insulating film SP, the ion implantation of impurities is interrupted by the gate electrode GE and the sidewall insulating film SP over each sidewall. Thus, the extension regions EX are formed in the regions of the semiconductor substrate SB (p-type wells PW1, PW2) on both sides of the gate electrode GE and the sidewall insulating film SP. The extension region EX is formed to be self-aligned with the side surface (side surface opposite to the side adjacent to the gate electrode GE) of the sidewall insulating film SP over each sidewall of the gate electrode GE.

In the ion implantation, the impurities (dopants) are sometimes expanded in the horizontal direction. After the ion implantation, the substrate is subjected to heat treatment, so that the impurities (dopants) are diffused in the horizontal direction. Thus, a part of the extension region EX can also invade (extend) under each sidewall insulating film SP and the gate electrode GE (this state being shown in FIG. 7).

In another embodiment, the sidewall insulating film SP may not be formed over each sidewall of the gate electrode GE. In that case, in the ion implantation for forming the extension regions EX, the gate electrode GE can serve as a mask (ion implantation blocking mask). Since the ion implantation of impurities is interrupted by the gate electrode GE in a region directly under the gate electrode GE of the semiconductor substrate SB (p-type wells PW1, PW2), the extension regions EX are formed in the regions on both sides of the gate electrode GE in the semiconductor substrate SB (p-type wells PW1, PW2).

Irrespective of formation of the sidewall insulating film SP, the ion implantation for forming the extension region EX needs to be performed at least after the formation of the gate electrode GE and before the formation of the sidewall spacers SW over the sidewalls of the gate electrode GE to be described later. In the case of forming the sidewall insulating film SP over each sidewall of the gate electrode GE, the ion implantation for forming the extension region EX is preferably performed after the formation of the sidewall insulating film SP over each sidewall of the gate electrode GE and before the formation of the sidewall spacers SW to be described later.

In the ion implantation for forming the extension region EX, n-type impurities can also be implanted into the gate electrode GE (silicon film included therein).

Figure 8:
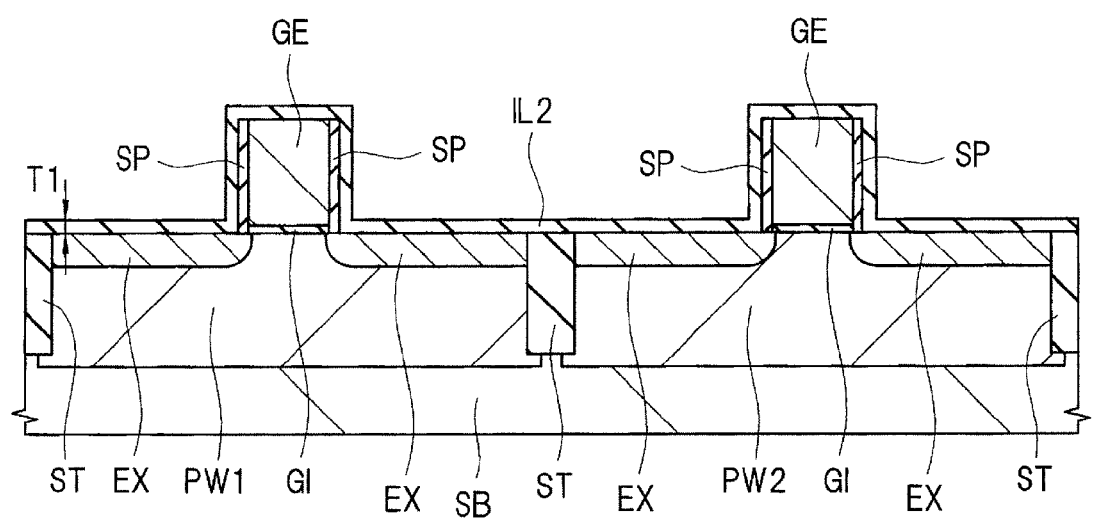
FIG. 8 is a cross-sectional view of a main part of another manufacturing step of the semiconductor device, following the step shown in FIG. 7.
Figure 9:
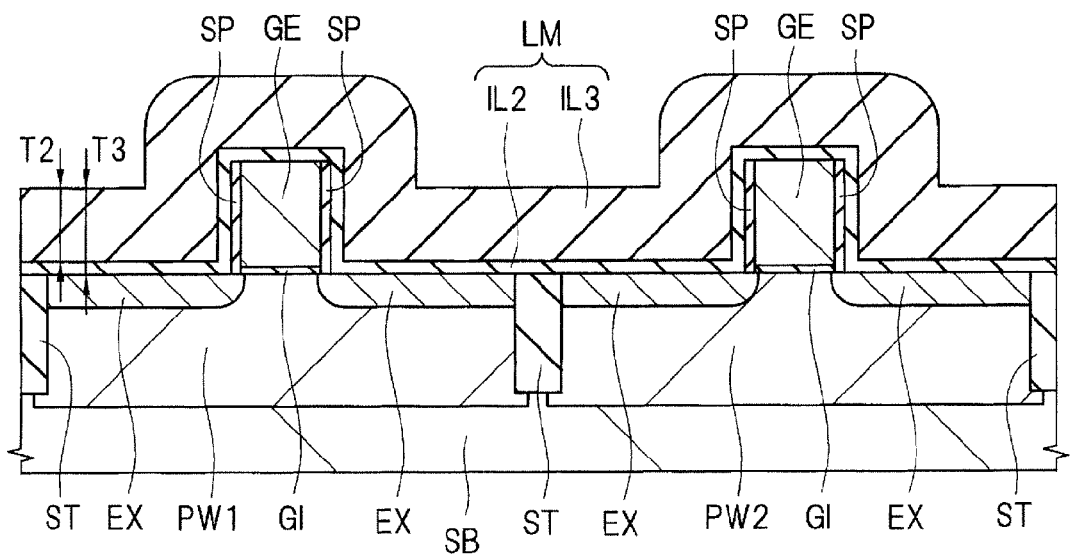
FIG. 9 is a cross-sectional view of a main part of another manufacturing step of the semiconductor device, following the step shown in FIG. 8.

Then, as shown in FIG. 8, an insulating film IL2 is formed over the main surface (entire main surface) of the semiconductor substrate SB to cover the gate electrodes GE (in step S9 of FIG. 1). Then, as shown in FIG. 9, an insulating film IL3 is formed over the main surface (entire main surface) of the semiconductor substrate SB, that is, over the insulating film IL2 (in step S10 of FIG. 1). The formation process of the insulating film IL2 in step S9 and the formation process of the insulating film IL3 in step S10 form a lamination film LM of the insulating film IL2 and the insulating film IL3 over the insulating film IL2 located over the main surface of the semiconductor substrate SB to cover the gate electrode GE.

Thus, the insulating film IL2 and the insulating film IL3 are formed of different insulating materials. Preferably, the insulating film IL2 is formed of a silicon oxide film, and the insulating film IL3 is formed of a silicon nitride film. The insulating films IL2 and IL3 can be formed, for example, using the CVD method or the like. The thickness (formation thickness) T2 of the insulating film IL3 is more (thicker) than the thickness (formation thickness) T1 of the insulating film IL2 (that is, T2>T1). The thickness (formation thickness) T1 of the insulating film IL2 can be in a range of, for example, about 3 to 5 nm, and the thickness (formation thickness) T2 of the insulating film IL3 can be in a range of, for example, about 28 to 32 nm.

Figure 10:
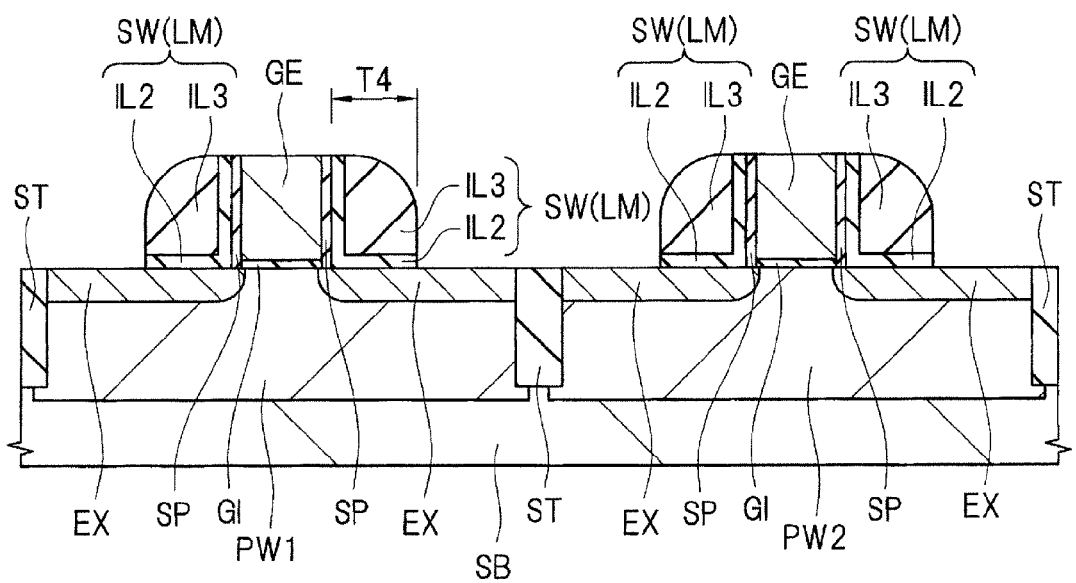
FIG. 10 is a cross-sectional view of a main part of another manufacturing step of the semiconductor device, following the step shown in FIG. 9.

The thickness (width) T4 of the sidewall spacer SW to be formed later substantially corresponds to the thickness T3 of the laminated film LM (T4≈T3), so that the use of the thickness T3 of the laminated film LM can control a distance of the source/drain region SD to be formed later to the end of the gate electrode GE (end in the gate length direction). The thickness T3 of the laminated film LM corresponds to the sum of the thickness T1 of the insulating film IL2 and the thickness T2 of the insulating film IL3 (that is, T3=T1+T2). The thickness T4 of the sidewall spacer SW (which is shown in FIG. 10 to be described later) corresponds to the thickness (dimension) of the sidewall spacer SW in the gate length direction (corresponding to the gate length direction of the gate electrode GE with the sidewall spacer SW formed over its sidewall). The sum of the thickness (thickness in the gate length direction) of the sidewall insulating film SP and the thickness T4 of the sidewall spacer SW can be, for example, in a range of about 34 to 42 nm.

Then, as shown in FIG. 10, the laminated film LM (laminated film LM comprising of the insulating film IL2 and the insulating film IL3) is etched back (subjected to etching, dry etching, or anisotropic etching) by the anisotropic etching technique to thereby form the sidewall spacers SW (sidewalls, sidewall insulating films) SW over both sidewalls of the gate electrode GE (in step S11 shown in FIG. 1). That is, in step S11, the insulating film IL3 and the insulating film IL2 are etched back to form the sidewall spacers SW comprised of the insulating films IL3 and IL2 over both sidewalls of the gate electrode GE. The anisotropic etching technique can be applied, for example, using the RIE method.

In the etching back process of step S11, the laminated film LM is subjected to anisotropic etching (etched back) by the deposition thickness of the laminated film LM (laminated film LM including the insulating film IL2 and the insulating film IL3) to remain the laminated film LM over both sidewalls (side surfaces) of the gate electrode GE to form the sidewall spacers SW, while removing portions of the laminated film LM in other regions. Thus, as shown in FIG. 10, the sidewall spacers SW are formed of the lamination film LM remaining over both sidewalls of the gate electrode GE. In the case of forming the sidewall insulating film SP on each sidewall of the gate electrode GE (that is, in performing the steps S6 and S7), the sidewall spacer SW is formed over each sidewall of the gate electrode GE via the sidewall insulating film SP.

The sidewall spacer SW is formed of the laminated film LM comprised of the insulating film IL2 and the insulating film IL3 over the insulating film IL2. Specifically, each sidewall spacer SW is formed of the insulating film IL2 continuously extending from over the semiconductor substrate SB to each sidewall of the gate electrode GE (to each side surface of the sidewall insulating film SP in formation of the sidewall insulating film SP), and the insulating film IL3 spaced apart from the semiconductor substrate SB and the gate electrode GE (sidewall insulating film SP in formation of the sidewall insulating film SP) via the insulating film IL2.

The insulating film IL2 serving as the sidewall spacer SW extends from over the semiconductor substrate SB to each sidewall of the gate electrode GE substantially in the same (uniform) thickness. That is, the insulating film IL2 forming the sidewall spacer SW includes one part extending over the semiconductor substrate SB, and the other part extending over each sidewall of the gate electrode GE (via the sidewall insulating film SP), these parts being integral with each other to have the same thickness. The insulating film IL3 forming the sidewall spacer SW is located spaced apart from the semiconductor substrate SB by the thickness of the insulating film IL2, and from the gate electrode GE by the thickness of the sidewall insulating film SP and the thickness of the insulating film IL2. That is, the insulating film IL2 forming the sidewall spacer SW intervenes in between the semiconductor substrate SB and the insulating film IL3 forming the sidewall spacer SW, and in between the gate electrode GE (sidewall insulating film SP in formation of the sidewall insulating film SP) and the insulating film IL3 forming the sidewall spacer SW.

Figure 11:
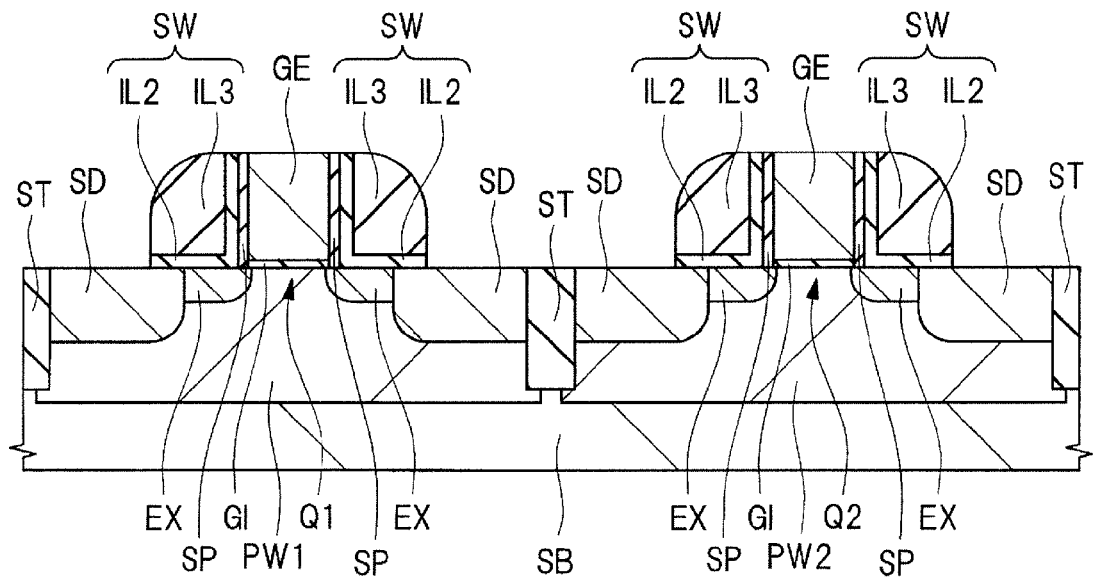
FIG. 11 is a cross-sectional view of a main part of another manufacturing step of the semiconductor device, following the step shown in FIG. 10.

Then, as shown in FIG. 11, conductive impurities (dopant) are ion-implanted into regions of the semiconductor substrate SB (p-type wells PW1 and PW2) on both sides of the gate electrode GE and the sidewall spacer SW to form source and drain regions (n$^+$-type semiconductor region, n-type impurity diffusion layer) SD (in step S12 shown in FIG. 2). The source and drain regions SD are semiconductor regions for the source and drain.

Herein, the formation of the n-channel MISFET is described. The source and drain regions SD are formed by ion-implanting n-type impurities, such as phosphorus (P) or arsenic (As). Each of the source and drain regions SD is an n-type semiconductor region. In order to form the p-channel MISFET, p-type impurities, such as boron (B), are ion-implanted.

In the ion implantation for forming the source and drain regions SD, the sidewall spacer SW located over the gate electrode GE and its sidewall can serve as a mask (ion implantation blocking mask). When the sidewall insulating film SP is formed over each sidewall of the gate electrode GE (that is, after steps S6 and S7), in addition to the sidewall spacer SW over the gate electrode GE and its sidewall, the sidewall insulating film SP intervening in between the gate electrode GE and the sidewall spacer SW can also serve as a mask (ion implantation blocking mask) against the ion implantation for formation of the source and drain regions SD.

In regions of the semiconductor substrate SB (p-type wells PW1, PW2) directly under the gate electrode GE and the sidewall spacers SW, the ion implantation of impurities is interrupted by the gate electrode GE and the sidewall spacer SW. Thus, the source and drain regions SD are formed in the regions of the semiconductor substrate SB (p-type wells PW1, PW2) on both sides of the gate electrode GE and the sidewall spacer SW. Thus, the source and drain regions SD are formed to be self-aligned with each side surface (side surface opposite to the side adjacent to the gate electrode GE via the sidewall insulating film SP) of the sidewall spacer SW over the sidewall of the gate electrode GE.

In the ion implantation, the impurities (dopants) are sometimes expanded in the horizontal direction. After the ion implantation, the substrate is subjected to heat treatment, so that the impurities (dopants) are further diffused in the horizontal direction. Thus, parts of the source/drain region SD can also invade (extend) under each sidewall spacer SW (this state being shown in FIG. 11).

The source/drain region SD has the same conduction type as that of the extension region EX (in the n-channel MISFET, the conduction type being the n-type), and has a higher concentration of impurities than that of the extension region EX. As a result, a semiconductor region serving as the source or drain of the MISFET (in the n-channel MISFET, the n-type semiconductor region) is formed of the source/drain region SD and the extension region EX. That is, the combination of the extension region EX and the source/drain region SD having the higher impurity concentration than that of the extension region serves as the semiconductor region for the source or drain having the lightly doped drain (LDD) structure (in the n-channel MISFET, the n-type semiconductor region). The source/drain region SD has a larger junction depth than that of the extension region EX.

A region of the semiconductor substrate SB located under the gate electrode GE is a region where a channel of the MISFET is formed (namely, a channel formation region). The extension regions EX are formed in the regions of the semiconductor substrate SB spaced apart from each other with the channel formation region sandwiched therebetween, and the source and drain regions SD are formed outside the respective extension regions EX (each on the side apart from the channel formation region). In other words, the extension region EX is adjacent to the channel formation region, and the source/drain region SD is spaced apart from the channel formation region by the thickness of the extension region EX (spaced apart in the channel length direction), and formed adjacent to the extension region EX.

As mentioned above, the sidewall spacer SW serves as the ion implantation blocking mask used in the ion implantation for formation of the source and drain regions SD (ion implantation in step S12). Thus, the thickness T4 of the sidewall spacer SW can control the distance of the source/drain region SD to the end of the gate electrode GE (end in the gate length direction).

In order to form the CMISFET, in the ion implantation for forming the source and drain regions for the n-channel MISFET, a region for forming a p-channel MISFET is covered with a photoresist layer, and in the ion implantation for forming the source and drain regions for the p-channel MISFET, a region for forming an n-channel MISFET is covered with another photoresist layer.

In this way, the n-channel MISFET (metal insulator semiconductor field effect transistor) Q1 is formed as a field-effect transistor in the p-type well PW1. The n-channel MISFET (metal insulator semiconductor field effect transistor) Q2 is formed as the field-effect transistor in the p-type well PW2. The steps described above produce the structure shown in FIG. 11.

That is, the gate electrode GE for the MISFETQ1 is formed over the p-type well PW1 via the gate insulating film GI for the MISFETQ1, and also the extension regions EX and the source and drain regions SD for the MISFETQ1 are formed in the p-type well PW1, so that the MISFETQ1 is formed in the p-type well PW1. The gate electrode GE for the MISFETQ2 is formed over the p-type well PW2 via the gate insulating film GI for the MISFETQ2, and also the extension regions EX and the source and drain regions SD for the MISFETQ2 are formed in the p-type well PW2, so that the MISFETQ2 is formed in the p-type well PW2. The sidewall spacer SW formed over each sidewall of the gate electrode GE for the MISFETQ1 is hereinafter referred to as a "sidewall spacer SW for the MISFETQ1", and the sidewall spacer SW formed over the sidewall of the gate electrode GE for the MISFETQ2 is hereinafter referred to as a "sidewall spacer SW for the MISFETQ2".

When the MISFETQ1 and the MISFETQ2 have the same conduction type (both are of the n-channel type, or p-channel type), the source/drain region SD for the MISFETQ1 and the source/drain region SD for the MISFETQ2 may be formed in the same ion implantation process, or in different ion implantation processes. When the MISFETQ1 and the MISFETQ2 have different conduction types (one of the MISFETs is of the n-channel type, and the other is of the p-channel type), the source/drain region SD for the MISFETQ1 and the source/drain region SD for the MISFETQ2 are formed in different ion implantation processes.

When the MISFETQ1 and the MISFETQ2 have the same conduction type (both are of the n-channel type, or p-channel type), the extension region EX for the MISFETQ1 and the extension region EX for the MISFETQ2 may be formed in the same ion implantation process, or in different ion implantation processes. When the MISFETQ1 and the MISFETQ2 have different conduction types (one of the MISFETs is of the n-channel type, and the other is of the p-channel type), the extension region EX for the MISFETQ1 and the extension region for the MISFETQ2 are formed in different ion implantation processes.

Figure 12:
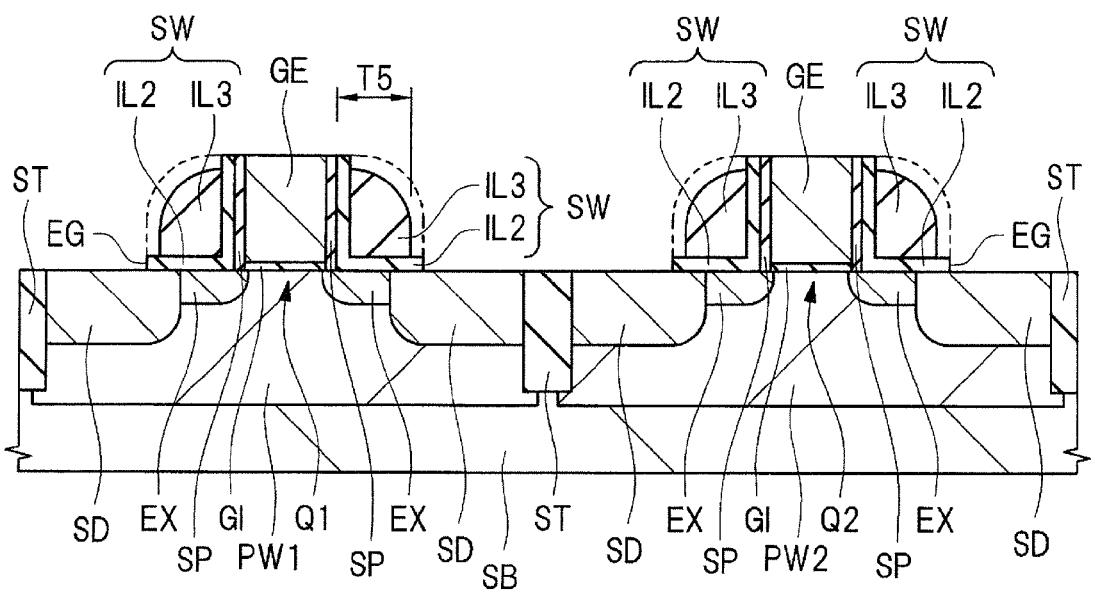
FIG. 12 is a cross-sectional view of a main part of another manufacturing step of the semiconductor device, following the step shown in FIG. 11.

Then, as shown in FIG. 12, the sidewall spacers SW are subjected to isotropic etching (in step S13 of FIG. 2). The etching process in step S13 can be preferably performed by wet etching. FIG. 12 shows the position of the surface of the insulating film IL3 forming the sidewall spacer SW by a dotted line in the stage before the etching in step S13 (that is, in the stage shown in FIG. 11).

The etching in step S13 (isotropic etching) is performed on conditions (etching conditions) in which the insulating film IL2 is less likely to be etched than the insulating film IL3. That is, in step S13, the etching is performed on the conditions in which an etching rate of the insulating film IL2 is smaller (lower) than that of the insulating film IL3. In other words, the etching in step S13 (isotropic etching) is performed on conditions (etching conditions) in which the insulating film IL3 is more likely to be etched than the insulating film IL2. That is, in step S13, the etching is performed on the conditions in which the etching rate of the insulating film IL3 is larger (higher) than that of the insulating film IL2. The insulating film IL2 and the insulating film IL3 are formed of different insulating materials, which can ensure the adequate etching selectivity of the insulating film IL3 with respect to the insulating film IL2.

Thus, in the etching process of step S13, the insulating film IL3 forming the sidewall spacer SW is selectively etched, and the insulating film IL2 forming the sidewall spacer SW is suppressed from being etched. Since the process in step S13 is the isotropic etching, in the etching process of step S13, the insulating film IL3 forming the sidewall spacer SW is also etched (side-etched) in the lateral direction (that is, in the direction substantially parallel to the gate length direction of the gate electrode GE with the sidewall spacers SW formed thereover).

The etching process in step S13 decreases (thins) the thickness of the sidewall spacer SW. The etching process in step S13 decreases (thins) the thickness of the sidewall spacer SW.

That is, before the etching process in step S13, the thickness of the sidewall spacer SW is a thickness T4, but the etching process in step S13 decreases the thickness of the sidewall spacer SW to a thickness T5 which is smaller than the thickness T4 (T5<T4). The thickness T5 is a thickness of the sidewall spacer SW directly after the etching process in step S13.

The thickness of the sidewall spacer SW (for example, thickness T4 or T5) corresponds to the thickness (dimension) of the sidewall spacer SW in the gate length direction (corresponding to the gate length direction of the gate electrode GE with the sidewall spacers SW formed over its sidewalls). The thickness of the sidewall spacer SW corresponds to a distance from the side surface of the sidewall spacer SW on the side adjacent to the sidewall of the gate electrode GE (via the sidewall insulating film SP) to the side surface of the insulating film IL3 forming the sidewall spacer SW (the side surface on the side opposite to the side adjacent to the gate electrode GE via the sidewall insulating film SP and the insulating film IL2).

In step S13, the insulating film IL3 forming the sidewall spacer SW is etched in the lateral direction (in the direction substantially parallel to the gate length direction of the gate electrode GE), so that the side surface of the insulating film IL3 (side surface on the side opposite to the side adjacent to the gate electrode GE via the sidewall insulating film SP and the insulating film IL2) forming the sidewall spacer SW is set back toward the gate electrode GE side. The etching in step S13 decreases (thins) the thickness of the sidewall spacer SW.

By performing the etching in step S13, an edge EG of the insulating film IL2 of the sidewall spacer SW extending over the semiconductor substrate SB (p-type wells PW1 and PW2) is protruded with respect to the side surface of the insulating film IL3 of the sidewall spacer SW (the side surface on the side opposite to the side adjacent to the gate electrode GE via the sidewall insulating film SP and the insulating film IL2).

In other words, directly before the etching in step S13, the edge EG of the insulating film IL2 of the sidewall spacer SW extending over the semiconductor substrate SB (p-type wells PW1 and PW2) is positioned to be flush (aligned) with the side surface of the insulating film IL3 of the sidewall spacer SW. However, in the etching process of step S13, while the side etching of the insulating film IL3 of the sidewall spacer SW is proceeding, the etching of the insulating film IL2 itself of the sidewall spacer SW is suppressed. This is why after the etching in step S13, the edge EG of the insulating film IL2 of the sidewall spacer SW extending over the semiconductor substrate SB protrudes from the side surface of the insulating film IL3 of the sidewall spacer SW. The term "side surface of the insulating film IL3 forming the sidewall spacer SW" means a side surface of the insulating film IL3 on the side opposite to the side adjacent to the gate electrode GE via the sidewall insulating film SP and the insulating film IL2.

Before the process in step S13, the sidewall spacer SW is comprised of the insulating film IL2 and the insulating film IL3. In step S13, not all of the insulating film IL3 forming the sidewall spacer SW, but a part (superficial part) of the insulating film IL3 forming the sidewall spacer SW is removed by the etching. Thus, after the process in step S13, the sidewall spacer SW is also comprised of the insulating film IL2 and the insulating film IL3.

In step S13, a substrate region (Si region) of the semiconductor substrate SB is preferably suppressed from being etched as much as possible. Thus, in step S13, the etching is preferably performed on the conditions (etching conditions) in which an etching rate of the semiconductor substrate SB is smaller (lower) than that of the insulating film IL3. In other words, in step S13, the etching is preferably performed on the conditions (etching conditions) in which the etching rate of the insulating film IL3 is larger (higher) than that of the semiconductor substrate SB. That is, in step S13, the etching is preferably performed on the conditions (etching conditions) in which the semiconductor substrate SB is less likely to be etched than the insulating film IL3. The process in step S13 can suppress or prevent the semiconductor substrate SB from being etched, while removing the insulating film IL3 forming the sidewall spacer SW by the etching.

In step S13, the insulating film IL3 forming the sidewall spacer SW is preferably etched using the etching method that can selectively etch the film IL3 isotropically, for example, wet etching. Silicon nitride can be etched with a high etching selectivity with respect to silicon oxide or silicon. In this case, the wet etching can be suitably used. Thus, when the insulating film IL2 is formed of silicon oxide, and the insulating film IL3 is formed of silicon nitride, the wet etching is used to isotropically etch the insulating film IL3 forming the sidewall spacer SW to decrease the thickness of the sidewall spacer SW, while appropriately suppressing or preventing the etching of the semiconductor substrate SB and the insulating film IL2 forming the sidewall spacer SW. In this case, suitable chemicals for use in the wet etching can include hot phosphoric acid. The temperature of the hot phosphoric acid can be set if necessary, to about 150° C. by way of example. Thus, the insulating film IL2 and the insulating film IL3 are made of different materials, but more preferably, the insulating film IL3 is formed of a silicon nitride film, and the insulating film IL2 is a silicon oxide film.

That is, in order to ensure the high etching selectivity of the insulating film IL3 with respect to the semiconductor substrate SB and the insulating film IL2, respective materials for the insulating films IL2 and IL3 are preferably selected. In this aspect, preferably, the insulating film IL3 is the silicon nitride film, and the insulating film IL2 is the silicon oxide film.

Next, in order to activate the impurities introduced by the ion implantations, the annealing process (heat treatment) is performed (in step S14 shown in FIG. 1). The heat treatment (annealing process) in step S14 can be performed by spike annealing, for example, at a temperature of about 1025° C. (which is annealing, for example, at the maximum temperature (herein, of 1025° C.) for a holding time of less than 1 second). The heat treatment in step S14 can activate the impurities (dopants) introduced in the extension regions EX and the source and drain regions SD.

Then, a metal silicide layer SL is formed by a self aligned silicide (Salicide) technique as will be described later. However, before using the salicide technique, a silicide block film BK is formed to prevent the formation of the metal silicide layer SL in a region where the formation of the metal silicide layer SL is to be prevented as will be described later. Now, the formation of the metal silicide layer will be specifically described below.

Figure 13:
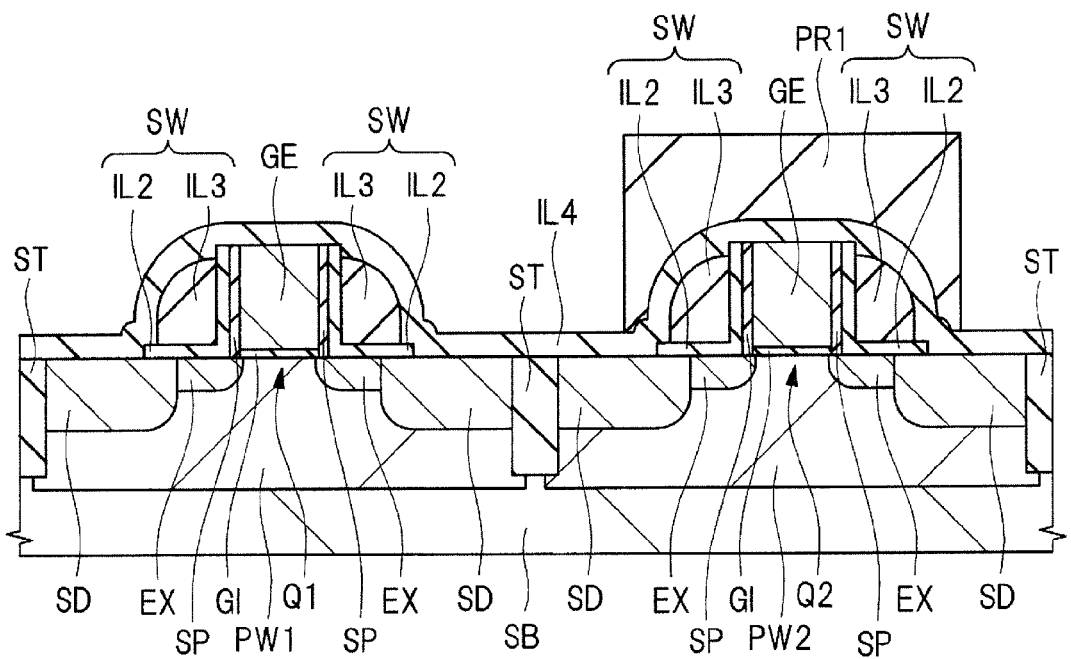
FIG. 13 is a cross-sectional view of a main part of another manufacturing step of the semiconductor device, following the step shown in FIG. 12.

First, as shown in FIG. 13, an insulating film IL4 is formed (deposited) over the main surface (entire main surface) of the semiconductor substrate SB to cover the gate electrode GE, the sidewall spacers SW, and the source and drain regions SD (in step S15 of FIG. 2). The insulating film IL4 can be formed of, for example, a silicon oxide film by the CVD method or the like. The thickness (formation thickness) of the insulating film IL4 can be, for example, in a range of about 15 to 25 nm. In another embodiment, the insulating film IL4 can be a silicon nitride film.

Then, a photoresist pattern (resist pattern) PR1 is formed over the insulating film IL4 by the photolithography. The photoresist pattern PR1 is formed in a region where the silicide block film BK to be described later is formed.

Figure 14:
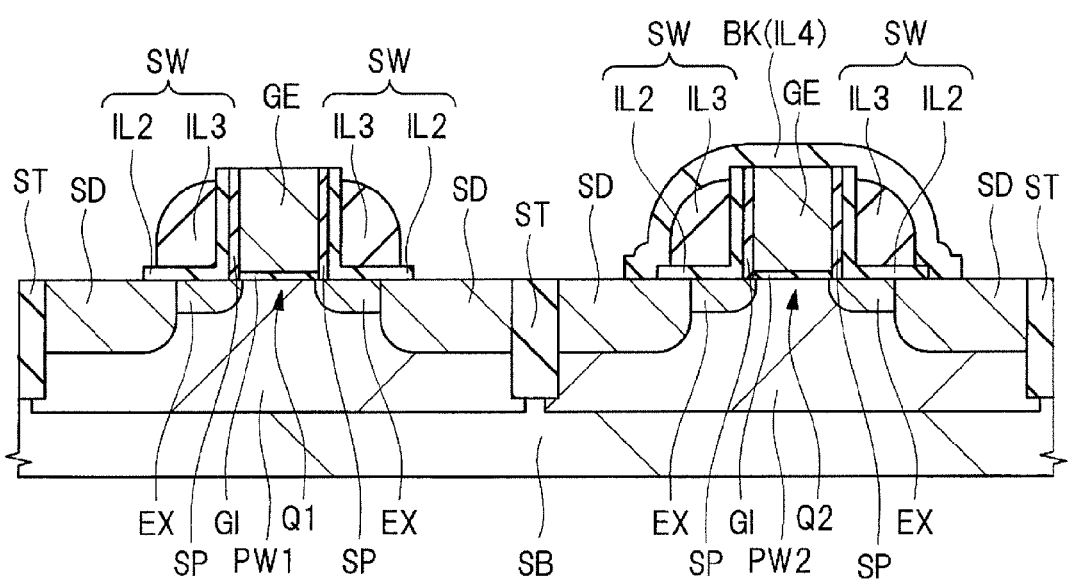
FIG. 14 is a cross-sectional view of a main part of another manufacturing step of the semiconductor device, following the step shown in FIG. 13.

Then, the insulating film IL4 is patterned by etching using the photoresist pattern PR1 as an etching mask to thereby form the silicide block film BK as shown in FIG. 14 (in step S16 of FIG. 2). The etching process for use in step S16 can be dry etching, wet etching, or a combination of dry etching and wet etching. When the insulating film IL4 is the silicon oxide film in use of the wet etching, an etching solution for use can be, for example, hydrofluoric acid. Thereafter, the photoresist pattern PR1 is removed. FIG. 14 shows the stage in which the photoresist pattern PR1 is removed. The silicide block film BK is formed of the insulating film IL4 patterned.

Referring to FIG. 14, in the region with the MISFETQ1 formed therein, the insulating film IL4 is removed in step S16, so that the silicide block film BK is not formed in the region having the MISFETQ1 formed therein. That is, in step S16, the insulating film IL4 is removed from over the gate electrode GE, sidewall spacers SW, and source and drain regions SD for the MISFETQ1, whereby the silicide block film BK is not formed over the gate electrode GE, sidewall spacers SW, and source and drain regions SD for the MISFETQ1. This is because the metal silicide layer SL is formed in the gate electrode GE and source and drain regions SD for the MISFETQ1 as will be described later.

Referring to FIG. 14, in the region with the MISFETQ2 formed therein, the insulating film IL4 remains in step S16, so that the silicide block film BK is formed in the region having the MISFETQ2 formed therein. That is, the insulating film IL4 is left over the gate electrode GE, sidewall spacers SW, and source and drain regions SD for the MISFETQ2 to form the silicide block film BK. This is because the metal silicide layer SL is not formed in the gate electrode GE and the source and drain regions SD for the MISFETQ2 as will be described later.

The metal silicide layer SL is preferably formed to reduce a contact resistance in regions for forming contact holes CT (regions exposed from the contact holes CT to be described later) of the source and drain regions SD for the MISFEETQ2. Thus, in the source and drain regions SD for the MISFETQ2, the silicide block film BK is formed not in some regions (including regions for formation of the contact holes CT to be described later), but in regions other than the above-mentioned regions. As a result, in the source and drain regions SD for the MISFETQ2, the insulating film IL4 remains over at least a part of the source and drain regions SD in step S16 to thereby form the silicide block film BK. The metal silicide layer SL to be described later is not formed in parts of the source and drain regions SD covered by the silicide block film BK.

That is, the silicide block film BK is formed to cover the regions where the metal silicide layer SL is not intended to be formed by a salicide process, among the semiconductor regions formed at the superficial part of the semiconductor substrate SB (for example, source and drain regions SD), and the semiconductor regions formed at the semiconductor substrate SB (for example, the gate electrode and polysilicon resistance element). The silicide block film BK is a film to prevent silicide formation. The silicide block film BK is formed of an insulating material.

In this way, after the silicide block film BK is formed, the metal silicide layer SL is formed by the salicide technique (in step S17 of FIG. 2). The formation process of the metal silicide layer SL in step S17 will be specifically described below.

Figure 15:
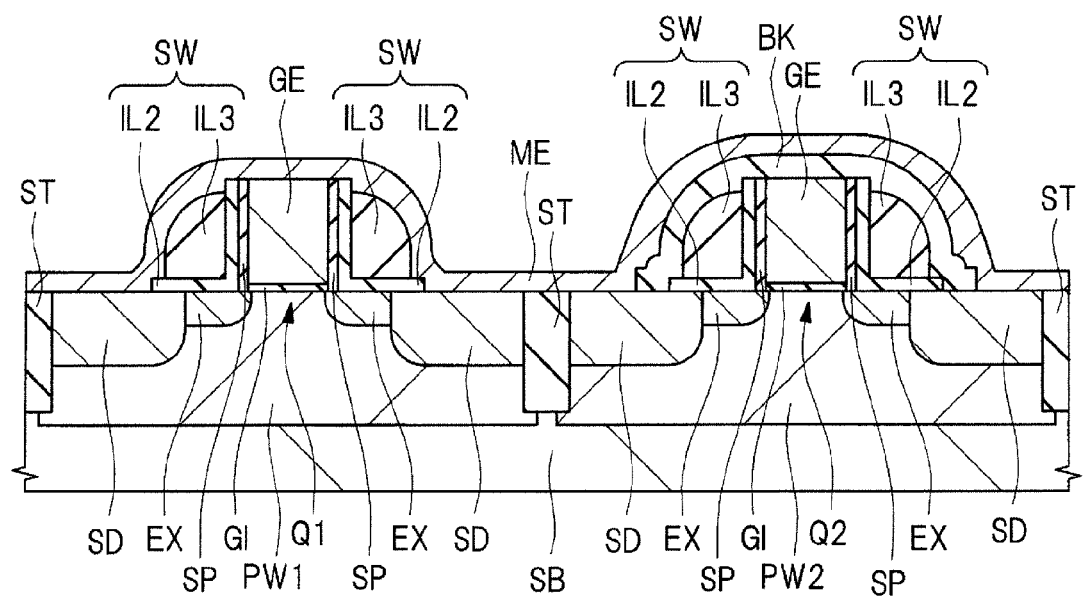
FIG. 15 is a cross-sectional view of a main part of another manufacturing step of the semiconductor device, following the step shown in FIG. 14.

First, as shown in FIG. 15, a metal film (metal layer) ME is formed (deposited) over the main surface (entire main surface) of the semiconductor substrate SB to cover the gate electrode GE, the sidewall spacers SW, the source and drain regions SD, and the silicide block film BK. The metal film ME can be formed, for example, of a cobalt (Co) film, a nickel (Ni) film, or a nickel-platinum alloy film, by sputtering or the like. Since at this time, the silicide block film BK is not formed over the gate electrode GE and source and drain regions SD for the MISFETQ1, the metal film ME is in contact with the gate electrode GE and source and drain regions SD for the MISFETQ1. In contrast, since the silicide block film BK is formed over the gate electrode GE and source and drain regions SD for the MISFETQ2, the gate electrode GE and source and drain regions SD for the MISFETQ2 are not in contact with the metal film ME except for the regions not covered with the silicide block film BK (that is, the regions where contact holes CT are to be formed later). Though depending on how thickness the metal silicide layer SL is formed, the thickness (formation thickness) of the metal film ME can be exemplified as about 20 nm by way of example.

Figure 16:
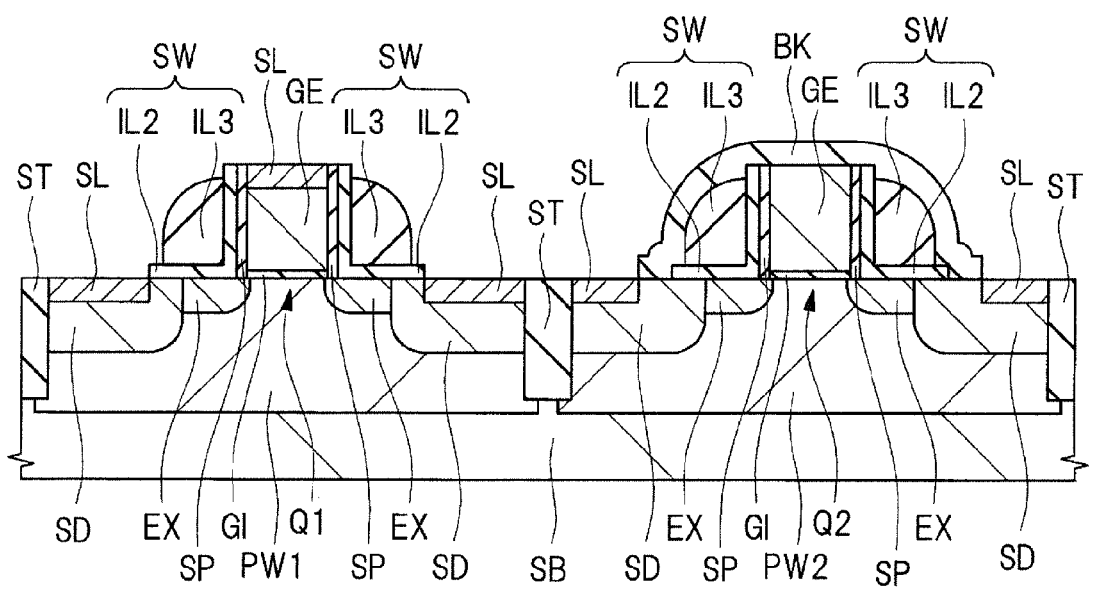
FIG. 16 is a cross-sectional view of a main part of another manufacturing step of the semiconductor device, following the step shown in FIG. 15.

Then, the heat treatment is performed to react the metal film ME with the gate electrode GE (Si included therein) and the source and drain regions SD (Si included therein) to thereby form the metal silicide layer SL which is a reaction layer between the metal and semiconductor, as shown in FIG. 16. Upper parts (upper layer parts) of the gate electrode GE and source and drain regions SD are reacted with the metal film ME to thereby form the metal silicide layer SL. The metal silicide layer SL is formed over each surface (upper layer part) of the gate electrode GE and source and drain regions SD. The heat treatment at this time can be performed, for example, by a lamp annealing method. Then, unreacted (excessive) parts of the metal film ME are removed. FIG. 16 shows this stage (in which the unreacted parts of the metal film ME are removed). In another embodiment, after formation of the metal film ME, the first-time heat treatment is performed to react the metal film ME with the gate electrode GE and source and drain regions SD, and then the unreacted (excessive) parts of the metal film ME are removed. Thereafter, the second-time heat treatment can also be performed to form the metal silicide layer SL. The formation of the metal silicide layer SL can decrease a diffusion resistance, a contact resistance, or the like.

The metal silicide layer SL formed over the source and drain regions SD is a reaction layer between the metal (metal included in the metal film ME) and the source and drain regions SD. The metal silicide layer SL is a compound layer (metal compound layer) containing a combination of the metal (metal contained in the metal film ME) and the elements contained in the source and drain regions SD. The metal silicide layer SL formed over the gate electrode GE is a reaction layer between the metal (metal included in the metal film ME) and the gate electrode GE. The metal silicide layer SL is a compound layer (metal compound layer) containing a combination of the metal (metal contained in the metal film ME) and the elements contained in the gate electrode GE.

When the semiconductor substrate SB is a silicon substrate, and the gate electrode GE is a polysilicon gate electrode, the metal silicide layer SL is comprised of a silicide of a metal element (that is, metal silicide) included in the metal film ME. In this case, when the metal film ME is a cobalt film, the metal silicide layer SL is a cobalt silicide layer. When the metal film ME is a nickel film, the metal silicide layer SL is a nickel silicide layer. When the metal film ME is a nickel-platinum alloy film, the metal silicide layer SL is a nickel-platinum silicide layer.

The silicide block film BK is not formed over the gate electrode GE and source and drain regions SD for the MISFETQ1. Thus, when the metal film ME is formed, as shown in FIG. 15, the metal film ME is in contact with the gate electrode GE and source and drain regions SD for the MISFETQ1. Thus, the heat treatment allows the metal film ME to react with the gate electrode GE and source and drain regions SD for the MISFETQ1, so that the metal silicide layer SL is formed over each upper part (upper layer part) of the gate electrode GE and source and drain regions SD for the MISFETQ1.

The silicide block film BK is formed over the gate electrode GE and source and drain regions SD for the MISFETQ2. Thus, when the metal film ME is formed, as shown in FIG. 15, the gate electrode GE and source and drain regions SD for the MISFETQ2 are not in contact with the metal film ME except for the regions not covered with the silicide block film BK (that is, the regions where the contact holes CT are to be formed later). Even after the heat treatment, parts of the gate electrode GE and source and drain regions SD for the MISFETQ2 except for those not covered with the silicide block film BK do not react with the metal film ME. The metal silicide layer SL is not formed in the parts of the gate electrode GE and source and drain regions SD for the MISFETQ2 except for those not covered with the silicide block film BK.

That is, since the silicide block film BK is not formed over the gate electrode GE and source and drain regions SD for the MISFETQ1, the metal silicide layer SL is formed substantially over the entire upper part (upper layer part) of the gate electrode GE and source and drain regions SD for the MISFETQ1. The silicide block film BK is formed over the gate electrode GE and source and drain regions SD for the MISFETQ2 except for the parts thereof. Thus, the metal silicide layer SL is formed over the upper part (upper layer part) not covered with the silicide block film BK within the gate electrode GE and source and drain regions SD for the MISFETQ2, while the metal silicide layer SL is not formed in the parts of the gate electrode GE and source and drain regions SG for the MISFETQ2 covered with the silicide block film BK. That is, the reaction layer between the metal film ME and the source and drain region SD (metal silicide layer SL) is not formed in the parts of the source and drain regions SD for the MISFETQ2 covered with the silicide block film BK. The reaction layer between the metal film ME and the gate electrode GE (metal silicide layer SL) is not formed in the parts of the gate electrode GE for the MISFETQ2 covered with the silicide block film BK.

In this embodiment, the metal silicide layer SL is formed in both the source and drain regions SD and the gate electrode GE in the MISFET not covered with the silicide block film BK. Alternatively, in another embodiment, the metal silicide layer SL is formed over the source and drain region SD, but not formed over the gate electrode GE. For examples, the another embodiment includes the case where the gate electrode GE is formed of a lamination of a conductive film and an insulating film over the conductive film, and the case where the gate electrode is formed of not a semiconductor film but a metal or metal compound film. In such a case, in step S17, the metal silicide layer SL is formed over the source and drain region SD, and is not formed over even the gate electrode GE not covered with the silicide block film BK.

Figure 17:
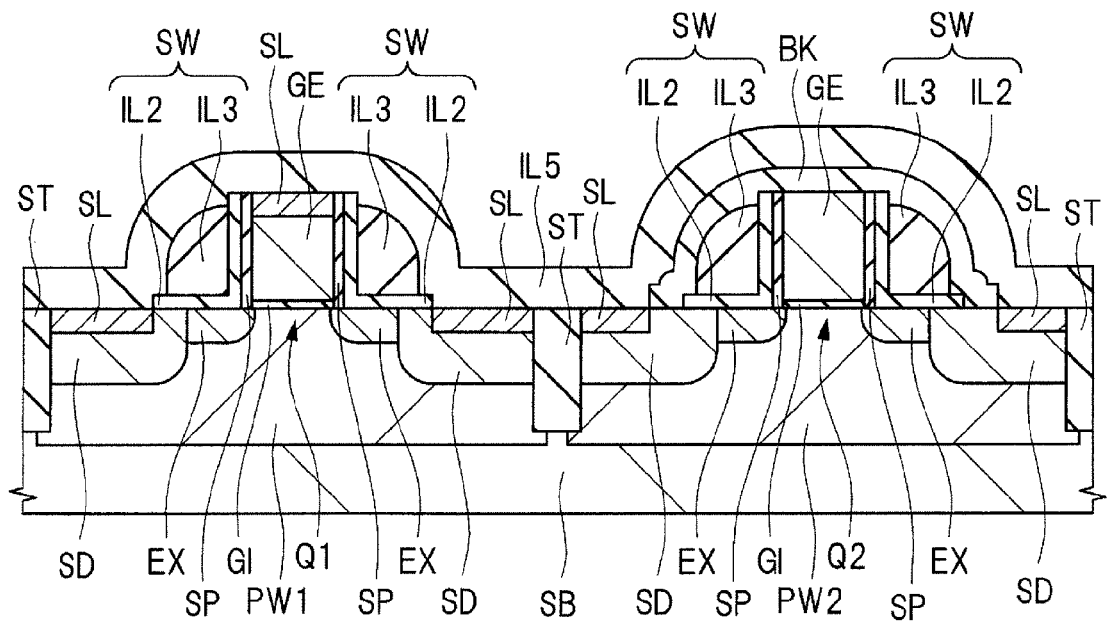
FIG. 17 is a cross-sectional view of a main part of another manufacturing step of the semiconductor device, following the step shown in FIG. 16.
Figure 18:
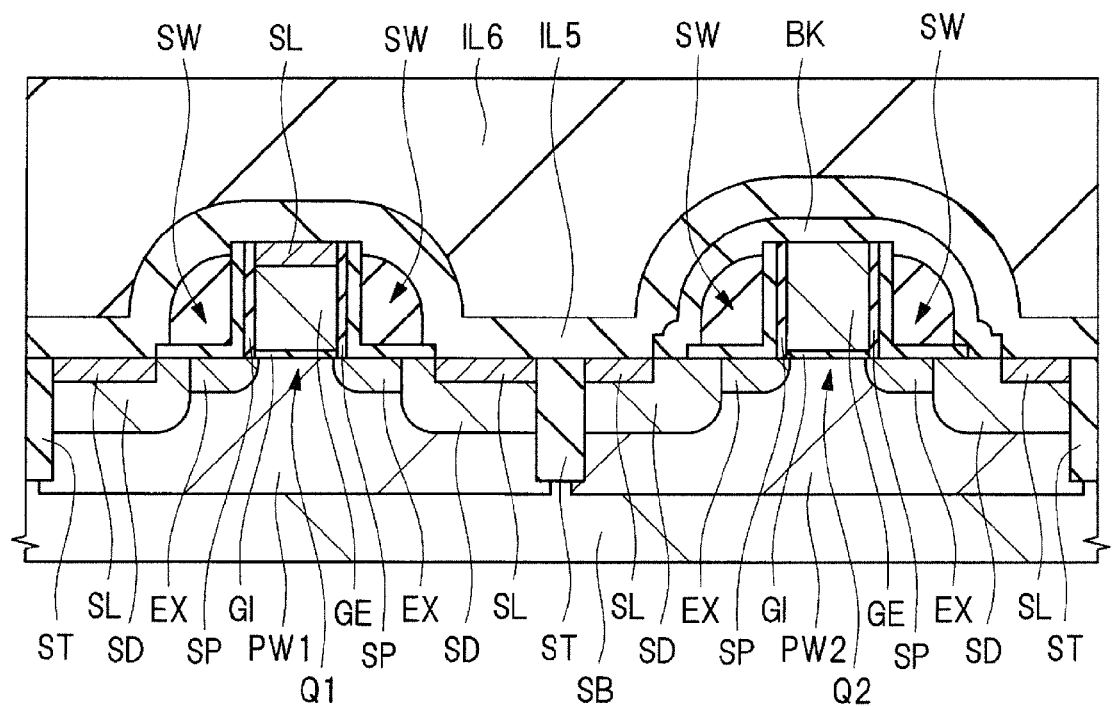
FIG. 18 is a cross-sectional view of a main part of another manufacturing step of the semiconductor device, following the step shown in FIG. 17.

As mentioned above, after forming the metal silicide layer SL, as shown in FIG. 17, an insulating film IL5 is formed over the main surface (entire main surface) of the semiconductor substrate SB to cover the gate electrode GE, the sidewall spacer SW, the metal silicide layer SL, and the silicide block film BK (in step S18 of FIG. 2). Then, as shown in FIG. 18, an insulating film (interlayer insulating film) IL6 is formed over the main surface (entire main surface) of the semiconductor substrate SB, that is, over the insulating film IL5 (in step S19 of FIG. 2).

In step S18 (formation step of the insulating film IL5) and step S19 (formation step of the insulating film IL6), the lamination of the insulating film IL5 and the insulating film IL6 over the insulating film IL5 is formed over the semiconductor substrate SB to cover the gate electrode GE, the sidewall spacers SW, the metal silicide layer SL, and the silicide block film BK.

The insulating film IL6 is an insulating film mainly serving as an interlayer insulating film. The insulating film IL5 is an insulating film serving as an etching stopper film in etching the insulating film IL6 for forming the contact holes CT to be performed later. The insulating film IL5 and the insulating film IL6 are made of different insulating materials. Preferably, the insulating film IL5 can be a silicon nitride film, and the insulating film IL6 can be a silicon oxide film. The formation thickness (deposition thickness) of the insulating film IL6 is preferably larger than that of the insulating film IL5. The thickness (formation thickness) of the insulating film IL5 can be, for example, in a range of about 20 to 40 nm. The insulating film IL5 can be formed, for example, by the CVD method, and the insulating film IL6 can be formed, for example, by the CVD method.

The insulating film IL6 is preferably a silicon oxide film. The silicon oxide film is an insulating film mainly containing silicon oxide, and can contain one or more elements selected from the group consisting of carbon (C), fluorine (F), nitrogen (N), boron (B), and phosphorus (P).

After forming the insulating film IL6, if necessary, the upper surface of the insulating film IL6 is polished by a chemical mechanical polishing (CMP), which can enhance the flatness of the upper surface of the insulating film IL6. That is, the upper surface of the insulating film IL6 can be flattened or planarized.

Figure 19:
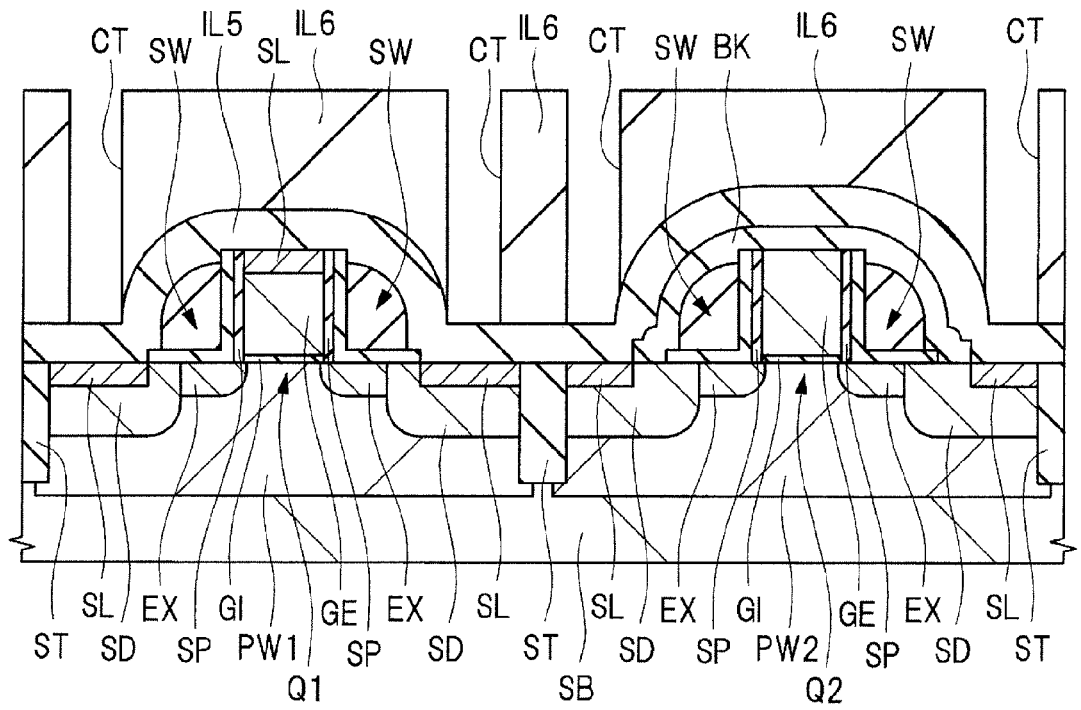
FIG. 19 is a cross-sectional view of a main part of another manufacturing step of the semiconductor device, following the step shown in FIG. 18.
Figure 20:
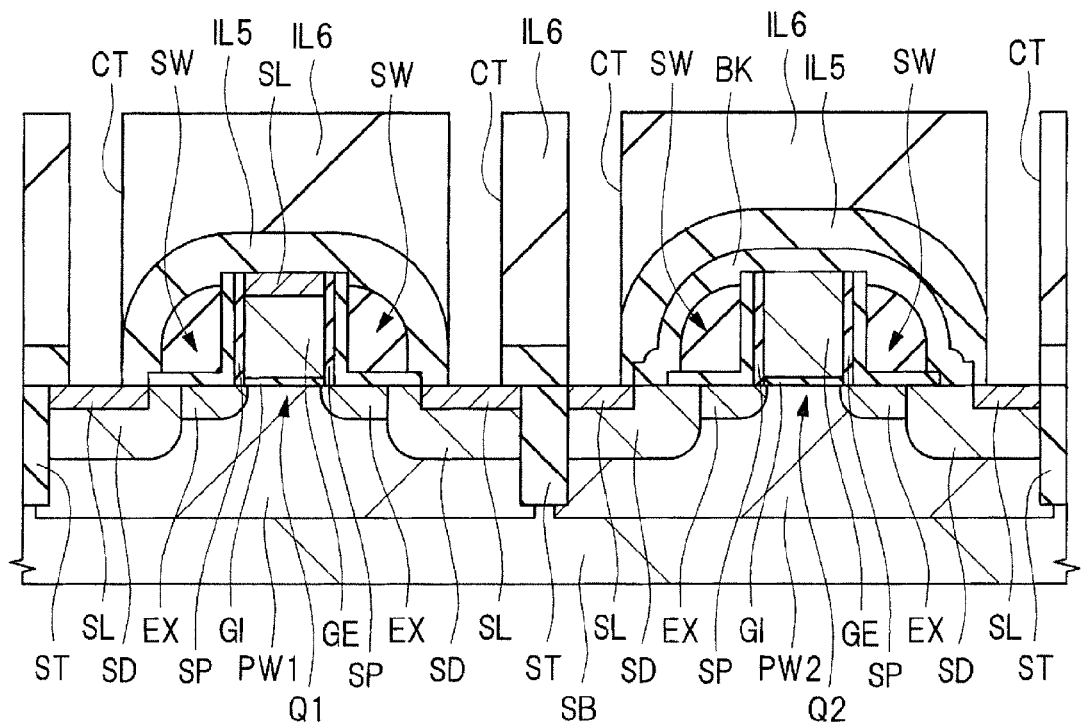
FIG. 20 is a cross-sectional view of a main part of another manufacturing step of the semiconductor device, following the step shown in FIG. 19.

Next, as shown in FIGS. 19 and 20, the laminated film of the insulating films IL6 and IL5 is dry-etched using a photoresist pattern (not shown) formed over the insulating film IL6 as an etching mask to thereby form contact holes (through holes, holes) CT in the laminated film of the insulating films IL6 and IL5 (in step S20 shown in FIG. 2). Each contact hole CT is formed to penetrate the laminated film of the insulating films IL6 and IL5. The formation process of the contact hole CT in step S20 can be performed in the following way.

In order to form the contact holes CT, first, as shown in FIG. 19, the insulating film IL6 is dry-etched on conditions in which the insulating film IL6 (silicon oxide film) is likely to be etched as compared to the insulating film IL5 (silicon nitride film), and the insulating film IL5 serves as an etching stopper film (etching stop film), so that the contact holes CT are formed in the insulating film IL6. In this stage, each contact hole CT does not penetrate the insulating film IL5, whereby the insulating film IL5 is exposed at the bottom of the contact hole CT. Then, as shown in FIG. 20, the insulating film IL5 located at the bottom of the contact hole CT is removed by dry etching on conditions in which the insulating film IL5 (silicon nitride film) is likely to be etched as compared to the insulating film IL6 (silicon oxide film), so that the contact holes CT are formed as the through hole (hole penetrating the laminated film of the insulating films IL6 and IL5). The insulating film IL5 serves as an etching stopper film in formation of the contact holes CT (in etching the insulating film IL6), the excessive digging of the contact hole CT or the damage on an underlayer can be suppressed or prevented.

The contact hole CT is formed, for example, in a part above the source/drain region SD or gate electrode GE (specifically, over a metal silicide layer SL formed in the upper layer part of the source/drain region SD, or over a metal silicide layer SL formed in the upper layer part of the gate electrode GE). The metal silicide layer SL over the source and drain region SD is exposed at the bottom of the contact hole CT formed above the source/drain region SD. The metal silicide layer SL over the gate electrode GE is exposed at the bottom of the contact hole CT formed above the gate electrode GE.

Figure 21:
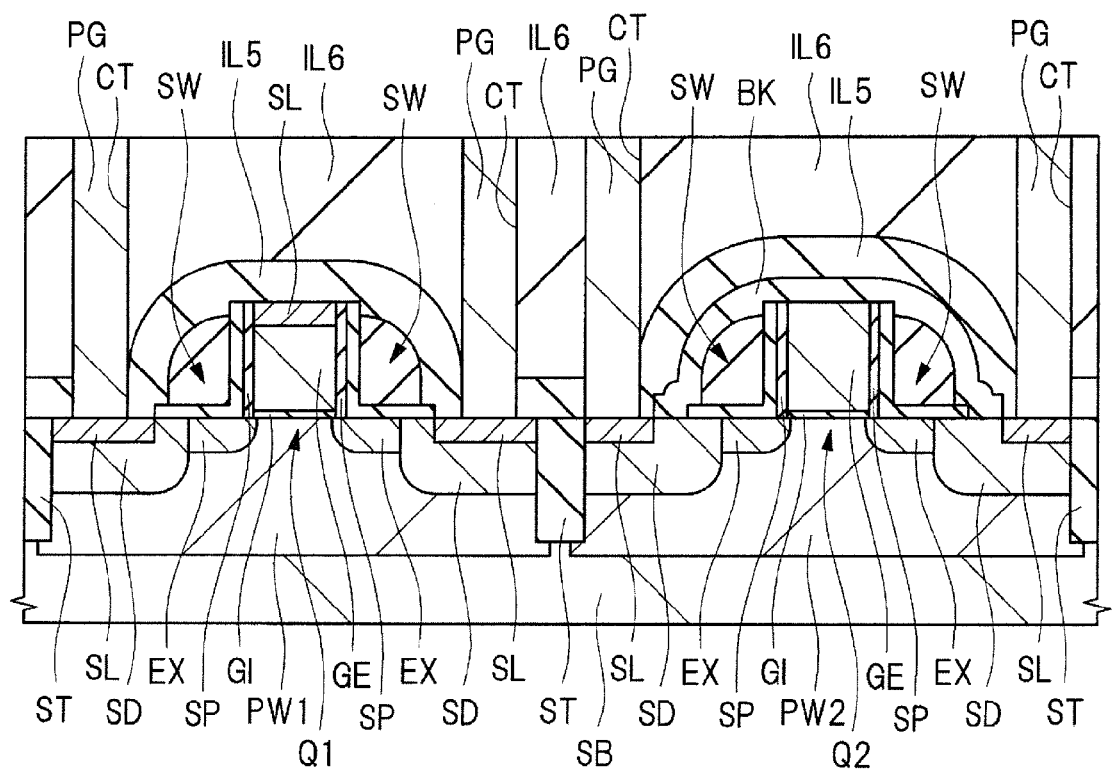
FIG. 21 is a cross-sectional view of a main part of another manufacturing step of the semiconductor device, following the step shown in FIG. 20.

Then, as shown in FIG. 21, a conductive plug PG is formed of tungsten (W) or the like as a conductor for connection in each contact hole CT (in step S21 shown in FIG. 2). The formation of the plug PG fills in the contact hole CT with the plug PG. The plug PG can be formed, for example, in the following way.

In order to form the plug PG, first, a barrier conductive film (for example, a titanium film, a titanium nitride film, or a laminated film thereof) is formed over the insulating film IL6 covering the inside (bottom and sidewall) of the contact hole CT by sputtering or plasma CVD method. Then, a main conductive film made of a tungsten film is formed to fill in the contact hole CT formed over the barrier conductive film by the CVD method. Then, unnecessary parts of the main conductive film and barrier conductive film outside the contact holes CT (over the insulating film IL6) are removed by the CMP method or etching back method. In this way, the plug PG is formed of the barrier conductive film and the main conductive film remaining and embedded in the contact hole CT formed in the insulating films IL6 and IL5 with the upper surface of the insulating film IL6 exposed at the plug PG. For simplifying the figure, FIG. 21 shows the integration of the barrier conductive film and the main conductive film which form the plug PG.

The plug PG formed above the source/drain region SD (that is, the plug PG embedded in the contact hole CT formed above the source/drain region SD) has its bottom electrically coupled to the metal silicide layer SL over the surface of the source/drain region SD. Thus, a desired potential (source potential or drain potential) can be supplied to the metal silicide layer SL (to the source/drain region SD under the metal silicide layer SL) over the surface of the source/drain region SD through the plug PG from a wiring M1 to be described later.

Although not shown in the figure, when the contact hole CT and the plug PG embedded therein are also formed above the gate electrode GE, the plug PG has its bottom electrically coupled to the gate electrode GE or the metal silicide layer SL at its surface.

Figure 22:
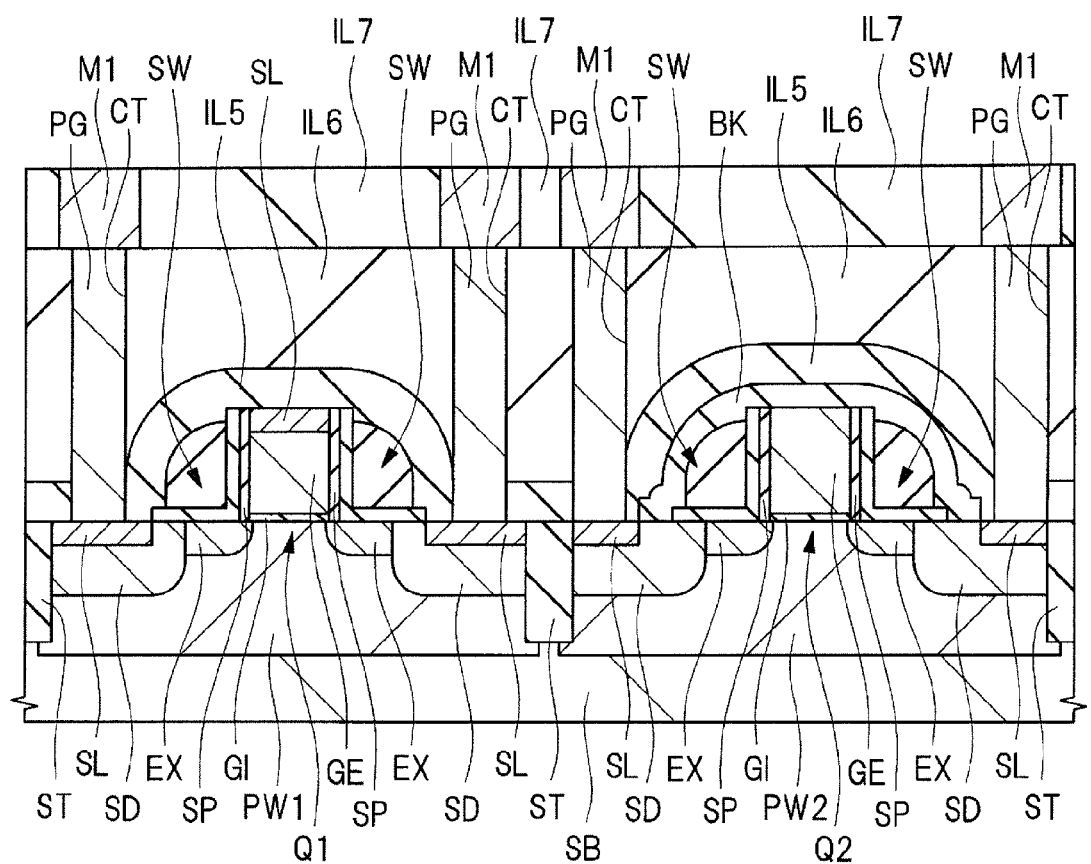
FIG. 22 is a cross-sectional view of a main part of another manufacturing step of the semiconductor device, following the step shown in FIG. 21.

Then, as shown in FIG. 22, an insulating film IL7 for formation of a wiring is formed over the insulating film IL6 with the plugs PG embedded therein. The insulating film IL7 can be a single film (single insulating film) or a laminated film (laminated insulating film).

Then, a first wiring layer is formed by a single damascene method. First, wiring trenches (trenches for embedding the wirings M1) are formed in predetermined regions of the insulating film IL7 by dry etching using a photoresist pattern (not shown) as a mask, and then a barrier conductive film (barrier metal film) is formed over the main surface of the semiconductor substrate SB (that is, over the insulating film IL7 including the bottom and sidewalls of the wiring trenches). The barrier conductive film can be formed using, for example, a titanium nitride film, a tantalum film, or a tantalum nitride film. Subsequently, a copper seed layer is formed over the barrier conductive film by the CVD or sputtering, and then a copper plating film (main conductive film) is formed over the seed layer by electrolytic plating or the like. The copper plating film fills in each wiring trench. Then, parts of the copper plating film, the seed layer, and the barrier conductive film located in regions other than the wiring trenches are removed by the CMP method, so that the first wiring layer M1 is formed of conductive material mainly containing copper, in the wiring trench. For simplifying the figure, FIG. 22 shows the integration of the copper plating film, the seed layer, and the barrier conductive film all of which form the wiring M1. The wiring M1 is coupled to the plug PG, and electrically coupled to the source and drain regions SD or gate electrode GE via the plug PG.

Thereafter, second or later wiring layers are formed by the dual damascene method. However, the illustration and description thereof will be omitted below. The wiring M1 and second or later wirings are not limited to the damascene wiring, and can be formed by patterning a conductive film for wiring. The wirings can be, for example, a tungsten wiring or aluminum wiring.

Although in this embodiment the n-channel MISFET is formed as the MISFET, a p-channel MISFET can be formed by reversing its conduction type. Alternatively, both an n-channel MISFET and a p-channel MISFET can be also formed in the same semiconductor substrate SB. The same goes for the second embodiment to be described later.

Examined Examples

As devices are miniaturized, for example, a gate electrode or sidewall spacer of a MISFET reduces its size. Influence of the source/drain region on the extension region becomes relatively stronger with decreasing thickness of the sidewall spacer (corresponding to the thickness T6 to be described later). In the impurity profile of the extension region and the source/drain region, the diffusion of impurities from the source/drain region to the extension region becomes remarkable. As the gate length of the gate electrode becomes smaller, the ion-implantation conditions for forming the extension region are set to achieve measures against both the short channel property and the substrate leakage current. Thus, in order to ensure an effective gate length and not to produce a steep junction gradient, the impurity profile of the extension region and source/drain region might be an impurity profile in which an end of the extension region on the channel formation region side is retracted toward the source/drain region side.

At this time, when there are variations in thickness of the sidewall spacer, the electric characteristics of the MISFET, such as the source-drain current, disadvantageously tends to vary. From the viewpoint of electric characteristics of the MISFET, for example, for the purpose of reducing variations in source-drain current under variations (fluctuations) in thickness of the sidewall spacer, the thickness of the sidewall spacer is desirably increased (which corresponds to an increase in size of the extension region in the gate length direction). The increase in thickness of the sidewall spacer, however, might lead to problems (poor continuity of the plug or the like) as shown in FIGS. 23 to 28 to be described later, which is disadvantageous from the viewpoint of workability of the contact hole.

Now, the invention will be specifically described with reference to the following examined examples.

FIGS. 23 to 28 are cross-sectional views of main parts of manufacturing steps of the semiconductor device in a first examined example by the inventors. FIGS. 23 to 28 show two MISFETQ3 and Q4 (gate electrodes GE thereof) adjacent to each other in the gate length direction, and sharing the source/drain region SD2. As shown in FIGS. 23 to 28, the MISFETQ3 and Q4 are formed in the p-type well PW1, and the gate electrode GE of the MISFETQ3 is adjacent to the gate electrode GE of the MISFETQ4 in the gate length direction. The source/drain region SD2 disposed between the gate electrode GE of the MISFETQ3 and the gate electrode GE of the MISFETQ4 is shared between the MISFETQ3 and the MISFETQ4.

In the first examined example, in the above step S1, the semiconductor substrate SB is provided. In the above step S2, the element isolation regions ST are formed. In the above step S3, the p-type well PW1 is formed. In the above step S4, the gate insulating film GI is formed. In the above step S5, the gate electrodes GE are formed. In the above steps S6 and S7, the sidewall insulating films SP are formed. In the above step S8, the extension regions EX are formed. The processes until the above step S8 are the same as those in the above-mentioned embodiment. In the first examined example, the sidewall spacers SW2 are formed on both sidewalls of the gate electrode GE by forming an insulating film for formation of the sidewall spacer SW2 over the main surface of the semiconductor substrate SB to cover the gate electrode GE, and then etching back the insulating film by anisotropic etching. Thereafter, ion-implantation is performed in the semiconductor substrate SB using the gate electrode GE and the sidewall spacers SW2 as a mask (ion implantation blocking mask), whereby a source/drain region SD2 is formed while corresponding to the source/drain region SD. In the first examined example, a metal silicide layer SL2 corresponding to the metal silicide layer SL is formed by the salicide technique at each upper part (upper layer part) of the gate electrode GE and the source/drain region SD2 without performing the above step S13 (by isotropic etching of the sidewall spacers). In this way, the structure shown in FIG. 23 can be obtained.

Figure 24:
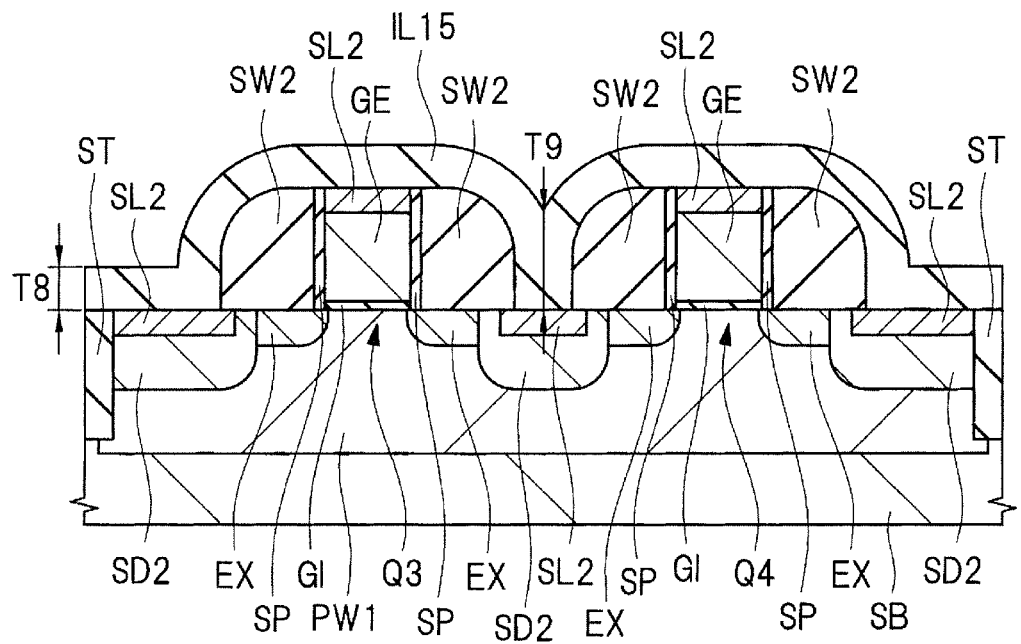
FIG. 24 is a cross-sectional view of a main part of another manufacturing step of the semiconductor device, following the step shown in FIG. 23.
Figure 25:
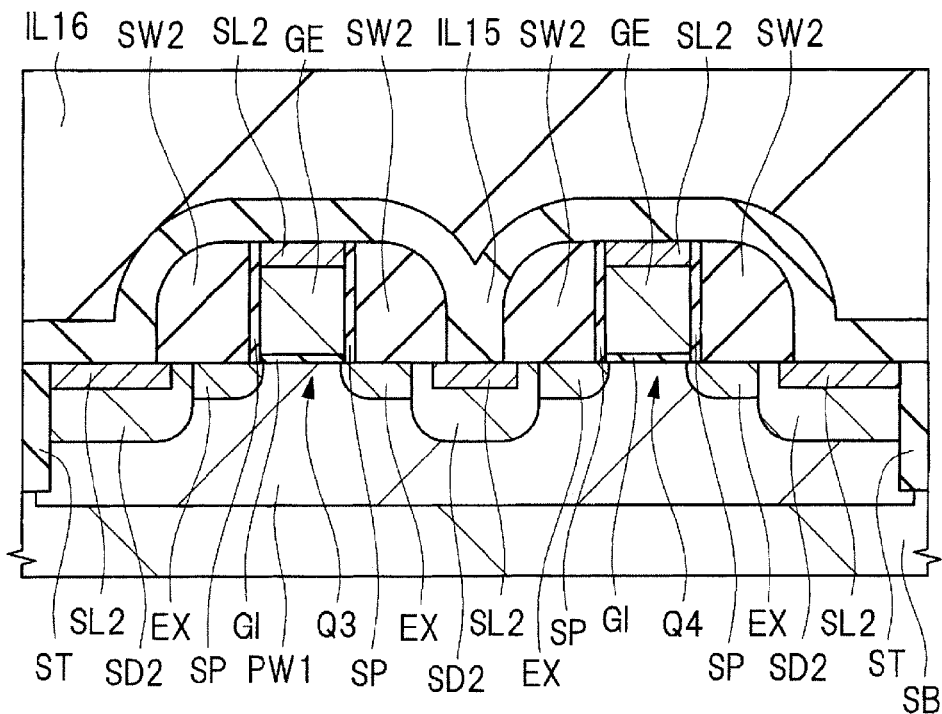
FIG. 25 is a cross-sectional view of a main part of another manufacturing step of the semiconductor device, following the step shown in FIG. 24.

In the first examined example, as shown in FIG. 24, the insulating film IL15 (silicon nitride film) corresponding to the insulating film IL5 is formed over the main surface (main surface) of the semiconductor substrate SB to cover the gate electrode GE, the sidewall spacer SW2, and the metal silicide layer SL2. As shown in FIG. 25, an insulating film IL16 (silicon oxide film) corresponding to the above insulating film IL6 is formed over the above insulating film IL15.

Figure 26:
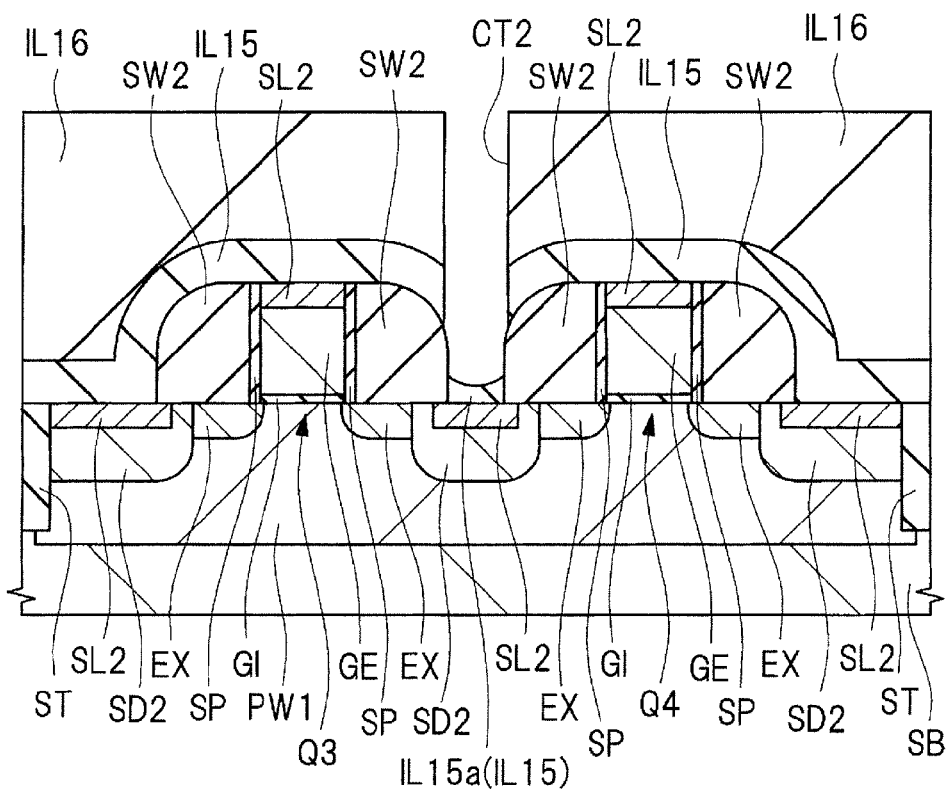
FIG. 26 is a cross-sectional view of a main part of another manufacturing step of the semiconductor device, following the step shown in FIG. 25.

Next, in the first examined example, as shown in FIG. 26, the laminated film of the insulating films IL16 and IL15 is dry-etched using a photoresist pattern (not shown) formed over the insulating film IL16 as an etching mask to thereby form contact holes CT2 in the laminated film of the insulating films IL16 and IL15.

In order to form the contact hole CT2, first, the insulating film IL16 (silicon oxide film) is dry-etched on conditions in which the insulating film IL16 (silicon oxide film) is likely to be etched as compared to the insulating film IL15 (silicon nitride film), and the insulating film (silicon nitride film) IL15 serves as an etching stopper film. Thus, the contact holes CT2 are formed in the insulating film IL16 (silicon oxide film). Then, the insulating film IL15 located at the bottom of the contact hole CT2 is dry-etched on conditions in which the insulating film IL15 (silicon nitride film) is likely to be etched as compared to the insulating film IL6 (silicon oxide film) to thereby form the contact hole CT2.

Figure 27:
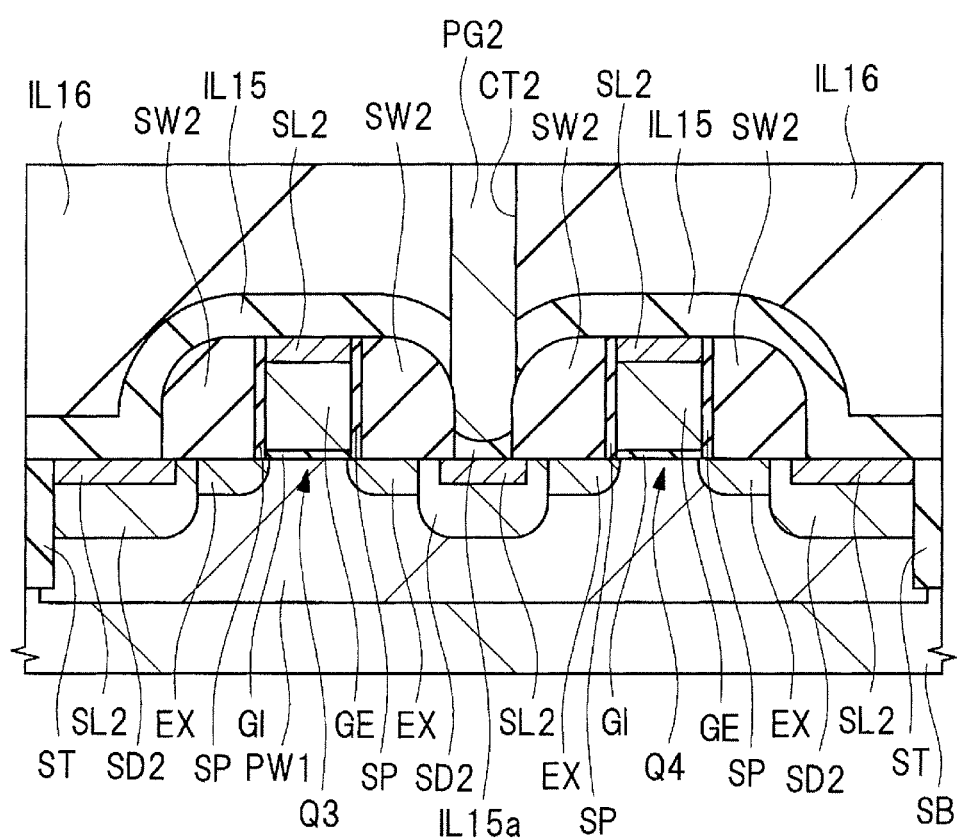
FIG. 27 is a cross-sectional view of a main part of another manufacturing step of the semiconductor device, following the step shown in FIG. 26.
Figure 28:
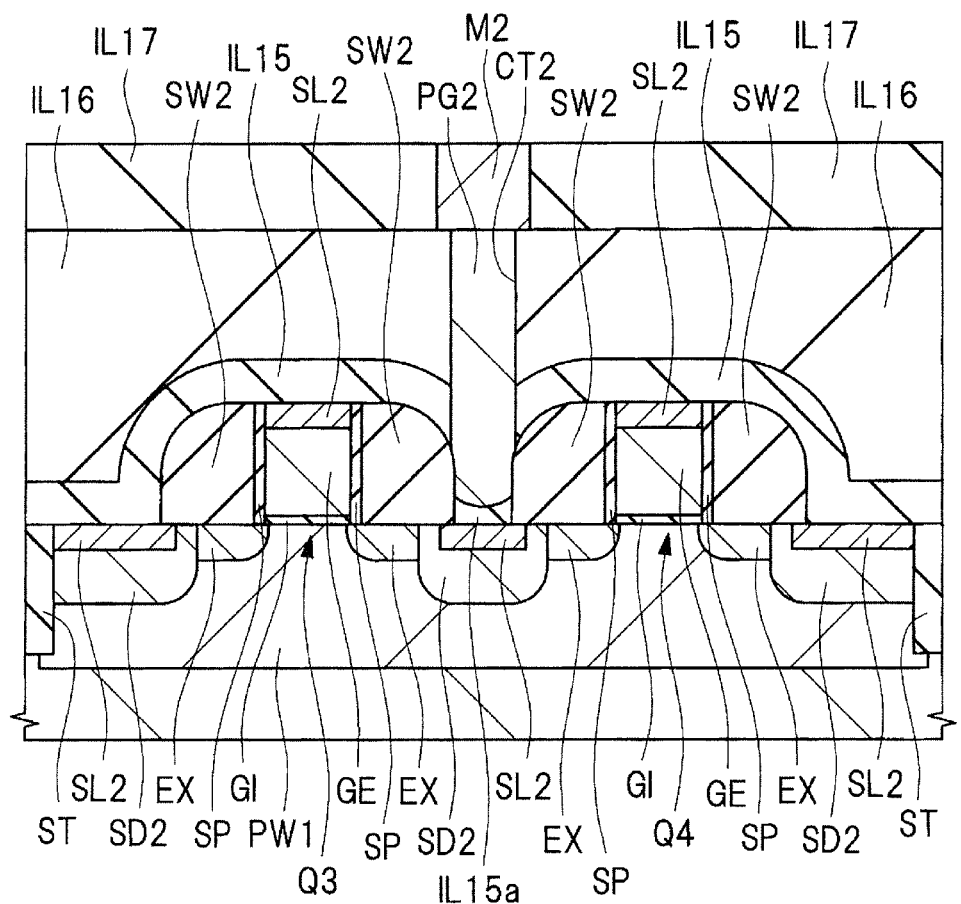
FIG. 28 is a cross-sectional view of a main part of another manufacturing step of the semiconductor device, following the step shown in FIG. 27.

Then, as shown in FIG. 27, a conductive plug PG2 corresponding to the above plug PG is embedded in each contact hole CT2. Thereafter, in the first examined example, as shown in FIG. 28, an insulating film IL17 corresponding to the above insulating film IL7 is formed over the insulating film IL16 with the plug PG2 embedded therein. A wiring M2 corresponding to the above wiring M1 is formed by the damascene method.

In the first examined example shown in FIGS. 23 to 28, the following problems will be found by the inventors.

That is, the distance W1 (distance W1 shown in FIG. 23) between the adjacent gate electrodes GE arranged in the gate length direction with the source and drain regions (SD2) therebetween (shared) tends to become smaller with reducing the size (miniaturization) of the semiconductor element. The sidewall spacers SW2 are formed over the sidewalls of the gate electrode GE. As the distance W1 between the gate electrodes GE is decreased, the distance W2 between the adjacent sidewall spacers SW2 formed over the sidewalls of the gate electrode GE is also decreased (the distance W2 between the adjacent spacers being shown in FIG. 23).

The following relationship is satisfied: $W1=W2+T6\times2+T7\times2$ in which T6 (the thickness T6 being shown in FIG. 23) is the thickness of the sidewall spacer SW2 (thickness along the gate length direction), and T7 (not shown) is the thickness of the sidewall insulating film SP (thickness along the gate length direction).

In forming the insulating film IL15, the insulating film IL15 is also deposited in a narrow gap (region) between the sidewall spacers W2.

It is assumed that the insulating film IL15 is deposited in the thickness (deposition thickness) T8 in a deposition step of the insulating film IL15. In this case, taking into consideration the insulating film IL15 embedded in the narrow gap (region) between the sidewall spacers SW2, the thickness T9 of the insulating film IL15 in the direction perpendicular to the main surface of the semiconductor substrate SB becomes larger as the distance W2 between the adjacent sidewall spacers SW2 is decreased.

That is, when the distance W2 between the adjacent sidewall spacers SW2 is twice or more times as large as the deposition thickness T8 of the insulating film IL15 (that is, $W2\geq T8\times2$), the thickness T9 of a part of the insulating film IL15 filling the region between the sidewall spacers SW2 is substantially the same as the deposition film T8 of the insulating film IL15 (T9=T8). The thickness T9 is a thickness in the direction perpendicular to the main surface of the semiconductor substrate SB. That is, when the distance W2 between the adjacent sidewall spacers SW2 is smaller than twice the deposition thickness T8 of the insulating film IL15 (that is, $W2<T8\times2$), the thickness T9 of a part of the insulating film IL15 filling the region between the sidewall spacers SW2 is larger than the deposition film T8 of the insulating film IL15 (T9>T8). As the distance W2 between the adjacent sidewall spacers SW2 becomes smaller, the thickness T9 of the part of the insulating film IL15 filling the region between the sidewall spacers SW2 is increased.

The decrease in distance W2 between the adjacent sidewall spacers SW2 increases the thickness T9 of the part of the insulating film IL15 filling the region between the sidewall spacers SW2, which might cause the problems below. Specifically, in the etching process for forming the contact hole CT2 over the source/drain region SD2 between the sidewall spacers SW2 adjacent to each other by the adjacent distance W2, the large thickness T9 of the insulating film IL15 might easily leave etching residues of the insulating film IL15 at the bottom of the contact hole CT2. As shown in FIG. 26, the etching residue of the insulating film IL15 at the bottom of the contact hole CT2 is indicated by reference numeral IL15a. When the etching residue IL15a of the insulating film IL15 exists at the bottom of the contact hole CT2 in forming the plug PG2 inside the contact hole CT2, the etching residue IL15a of the insulating film IL15 intervenes in between the plug PG2 and the metal silicide layer SL2 over the source/drain region SD2, which might cause the poor continuity of the plug PG2. The poor continuity of the plug PG might reduce the production yield of the semiconductor devices.

In order to prevent the poor continuity of the plug PG due to the existence of the etching residue IL15a of the insulating film IL15 at the bottom of the contact hole CT2, the overetching is proposed to be performed in the etching of the insulating film IL15 in the formation step of the contact hole CT2. In this case, however, the excessive digging of the contact hole CT2 or damage on the underlayer might be caused in the contact hole CT2 formed in the region where the insulating film IL15 is formed in the same thickness as the deposition thickness T8 (that is, in the region except for the region where the sidewall spacers SW2 are positioned close to each other).

Alternatively, in order to increase the distance W2 between the adjacent sidewall spacers SW2, the sidewall spacers SW2 are proposed to be formed so as to decrease the thickness T6 of each sidewall spacer SW2 in forming the sidewall spacers SW2. The thickness T6 of the sidewall spacer SW2 can be controlled by the thickness of the insulating film for formation of the sidewall spacer SW2. The insulating film for formation of the sidewall spacer SW2 is formed relatively thinly, and the thin insulating film is etched back by the anisotropic etching technique to form the sidewall spacer SW2. As a result, the thickness T6 of the sidewall spacer SW2 can be decreased, which can increase the distance W2 between the adjacent sidewall spacers SW2. In this case, however, the source/drain region SD2 is formed using the thin sidewall spacer SW2 as a mask (ion implantation blocking mask).

However, the thickness T6 of the sidewall spacer SW2 in formation the source/drain region SD2 controls the size of the extension region EX (the size in the gate length direction, that is, in the channel length direction) in the LDD structure. Thus, the decrease in thickness T6 of the sidewall spacer SW2 in formation of the source/drain region SD2 also decreases the size of the extension region EX (that is, the size in the channel length direction) intervening in between the channel formation region and the source/drain region SD2. In contrast, taking into consideration the characteristics of the MISFET, the thickness T6 of the sidewall spacer SW2 is required to be made larger in formation of the source and drain regions SD2. One example about the above state will be described below with reference to the graph of FIG. 29.

Figure 29:
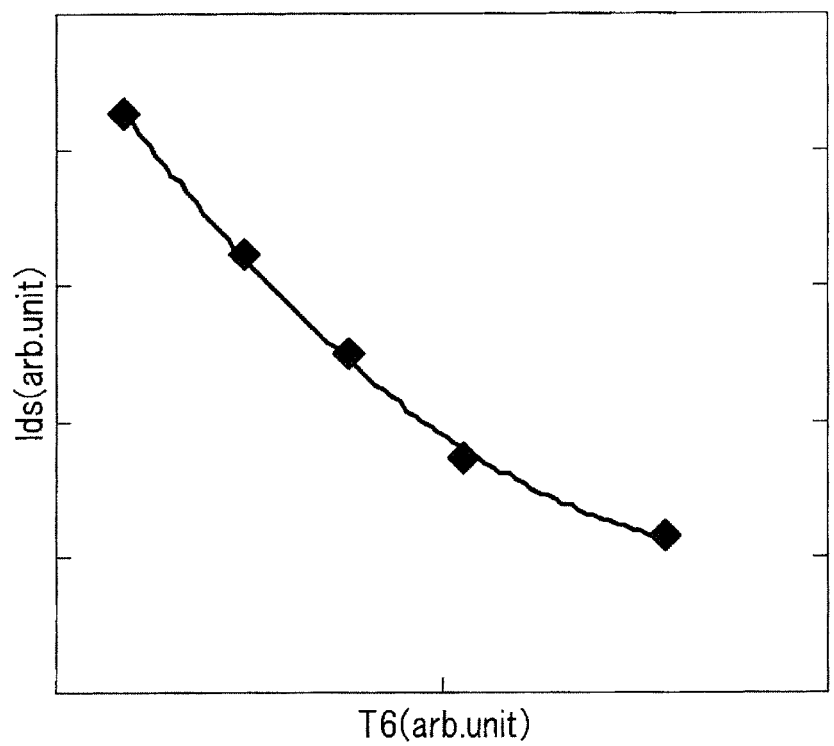
FIG. 29 is a graph showing a correlation between the thickness of a sidewall spacer and a source-drain current.

FIG. 29 shows a graph of a correlation between the thickness T6 of the sidewall spacer SW2 and a source-drain current Ids. As can be seen from FIG. 29, as the thickness T6 of the sidewall spacer SW2 is increased, the source-drain current Ids tends to be decreased. However, the graph of FIG. 29 is not completely linear. As the thickness T6 of the sidewall spacer SW2 is increased, the gradient of the graph of FIG. 29 is decreased.

This means that when the thickness T6 of the sidewall spacer SW2 deviates from the designed value due to variations in manufacturing conditions, a variation in source-drain current Ids from the designed value becomes smaller as the thickness T6 of the sidewall spacer SW2 is increased. In other words, when the thickness T6 of the sidewall spacer SW2 deviates from the designed value due to variations in manufacturing conditions, a variation in characteristics of the MISFET (for example, source-drain current Ids) becomes smaller as the thickness T6 of the sidewall spacer SW2 is increased. Thus, in forming the source and drain regions SD2, the thickness T6 of the sidewall spacer SW2 is preferably ensured to some degree, which can suppress variations in characteristics of the MISFET (for example, source-drain current Ids) even when the thickness T6 of the sidewall spacer SW2 deviates from the designed value due to variations in manufacturing conditions.

In order to improve the characteristics of the MISFET, the thickness T6 of the sidewall spacer SW2 is desired to be set large in forming the source and drain regions SD2. However, this leads to reduction in distance W2 between the adjacent sidewall spacers SW2, and also might cause the problems in forming the contact holes CT2 as mentioned above.

Main Features of this Embodiment

In this embodiment, in step S9, the insulating film IL2 is formed over the semiconductor substrate SB to cover the gate electrode GE. In step S10, the insulating film IL3 is formed over the insulating film IL2. Then, in step S11, the insulating film IL3 and the insulating film IL2 are etched back. In this way, the sidewall spacers SW are formed of the insulating film IL2 and the insulating film IL3 over the sidewalls of the gate electrode GE. Then, in step S12, the ion implantation is performed in the semiconductor substrate SB using the gate electrode GE and the sidewall spacers SW as a mask, which forms the source and drain regions SD for the MISFET in the semiconductor substrate. Thereafter, in step S13, the sidewall spacers SW are subjected to the isotropic etching on the conditions in which the insulating film IL2 is less likely to be etched than the insulating film IL3, which decreases the thickness of each sidewall spacer SW. Then, after the formation of the reaction layer between the metal and the source/drain region SD (metal silicide layer SL) over the source/drain region SD in step S17, the insulating films IL5 and IL6 are formed in that order in steps S18 and S19, and then the contact holes CT are formed in the insulating films IL6 and IL5 in step S20.

This embodiment has one of the main features that the thickness of the sidewall spacer SW is made smaller (thinner) by performing the isotropic etching on the sidewall spacers SW after formation of the source and drain regions SD. Thus, the thickness (T5) of the sidewall spacer SW in forming the insulating film IL5 in step S18 can be smaller than the thickness (T4) of the sidewall spacer SW in forming the source and drain regions SD in step S12. In forming the source and drain regions SD (that is, in the ion implantation of step S12), the thickness (T4) of the sidewall spacer SW can be ensured to some degree, but in forming the insulating film IL5 (in step S18), the thickness (T5) of the sidewall spacer SW can be made smaller (thinner). In this way, the reducing (thinning) of the thickness (T5) of the sidewall spacer SW in formation of the insulating film IL5 (in step S18) can suppress or prevent the inconveniences in forming the contact hole CT. Accordingly, the production yield of the semiconductor devices can be improved. In other words, in order to reduce (thin) the thickness (T5) of the sidewall spacer SW in forming the insulating film IL5 (in step S18), the thickness (T4) of the sidewall spacer SW does not have to be reduced (thinned) in forming the source and drain regions SD (that is, in the ion implantation of step S12), which can improve the characteristics (electrical characteristics) of the MISFET. For this reason, the production yield of the semiconductor devices can be improved.

In the following, the embodiment of the invention will be specifically described.

FIGS. 30 to 35 are cross-sectional views for explaining main parts of other manufacturing steps of the semiconductor device in this embodiment. The manufacturing steps of this embodiment shown in FIGS. 30 to 35 are basically the same as those of the above embodiment referring to FIGS. 1 to 22 described above.

Also in the case shown in FIG. 30, the processes until the step shown in FIG. 16 are performed in the way described above to obtain the structure shown in FIG. 30 corresponding to that shown in FIG. 16.

Figure 30:
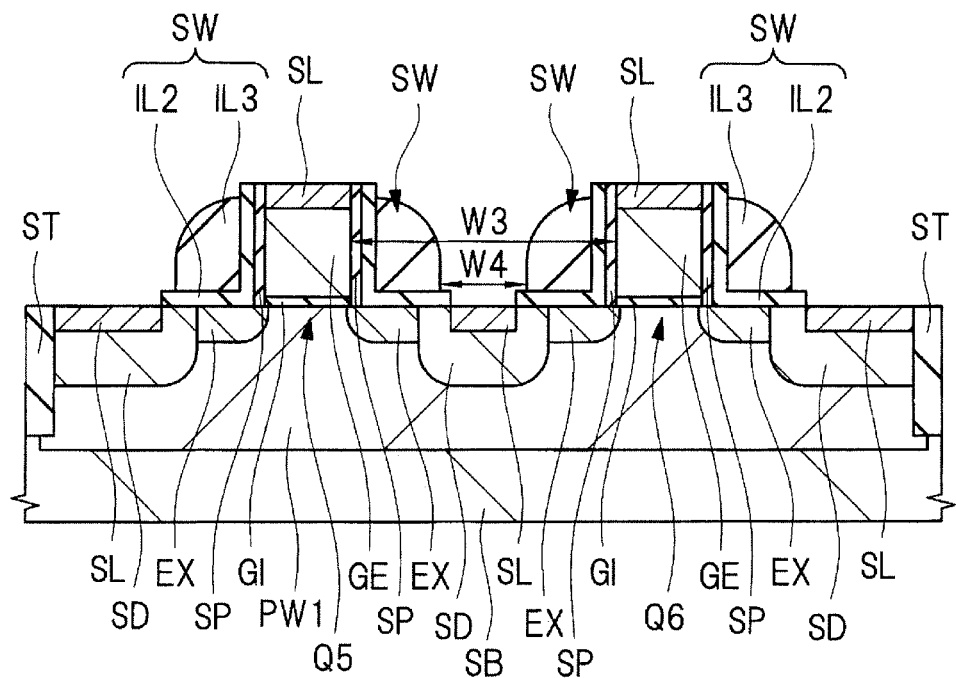
FIG. 30 is a cross-sectional view of a main part of a manufacturing step of a semiconductor device in another embodiment.

FIG. 30 shows two MISFET Q5 and Q6 (gate electrodes GE thereof) adjacent to each other in the gate length direction, and sharing the source/drain region SD. As shown in FIG. 30, the MISFET Q5 and Q6 are formed in the p-type well PW1, and the gate electrode GE of the MISFET Q5 is adjacent to the gate electrode GE of the MISFET Q6 in the gate length direction. The source/drain region SD disposed between the gate electrode GE of the MISFET Q5 and the gate electrode GE of the MISFET Q6 is shared between the MISFET Q5 and the MISFET Q6. Except for the above point, the respective structures of the MISFET Q5 and Q6 are basically the same as that of the above MISFET Q1. That is, the left half of the structure (MISFET Q1) shown in FIG. 16 is repeated in the gate length direction with the source/drain region SD shared between the half structures, which substantially corresponds to the structure of FIG. 30.

The processes for obtaining the structure shown in FIG. 30 are basically the same as those for obtaining the structure shown in FIG. 16, and thus a repeated description thereof will be omitted below.

Figure 31:
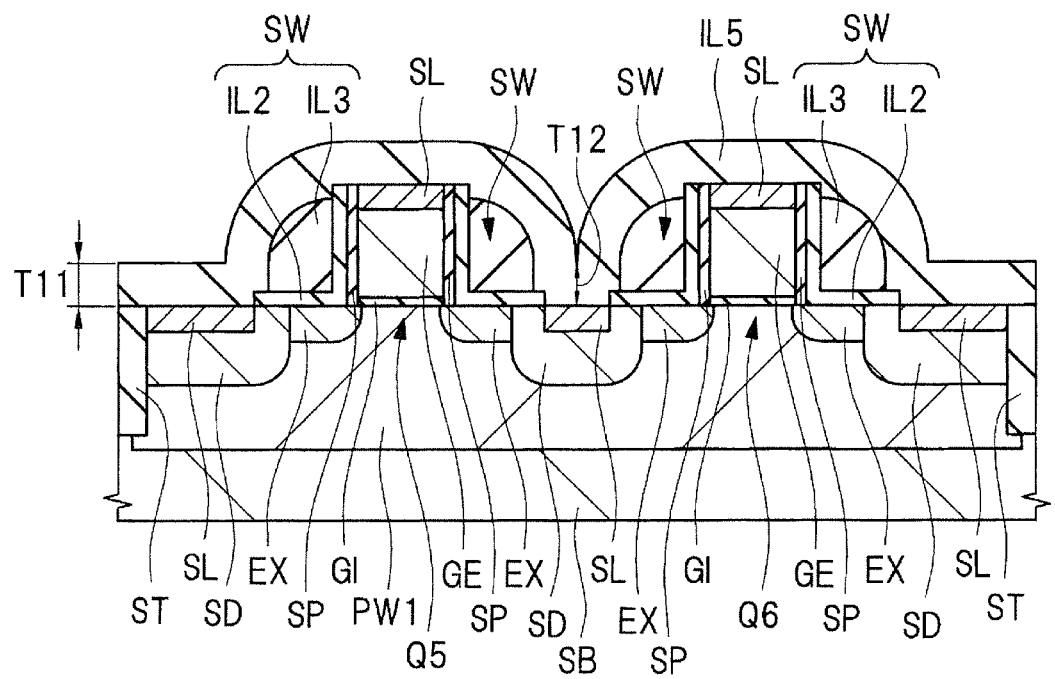
FIG. 31 is a cross-sectional view of a main part of another manufacturing step of the semiconductor device, following the step shown in FIG. 30.
Figure 32:
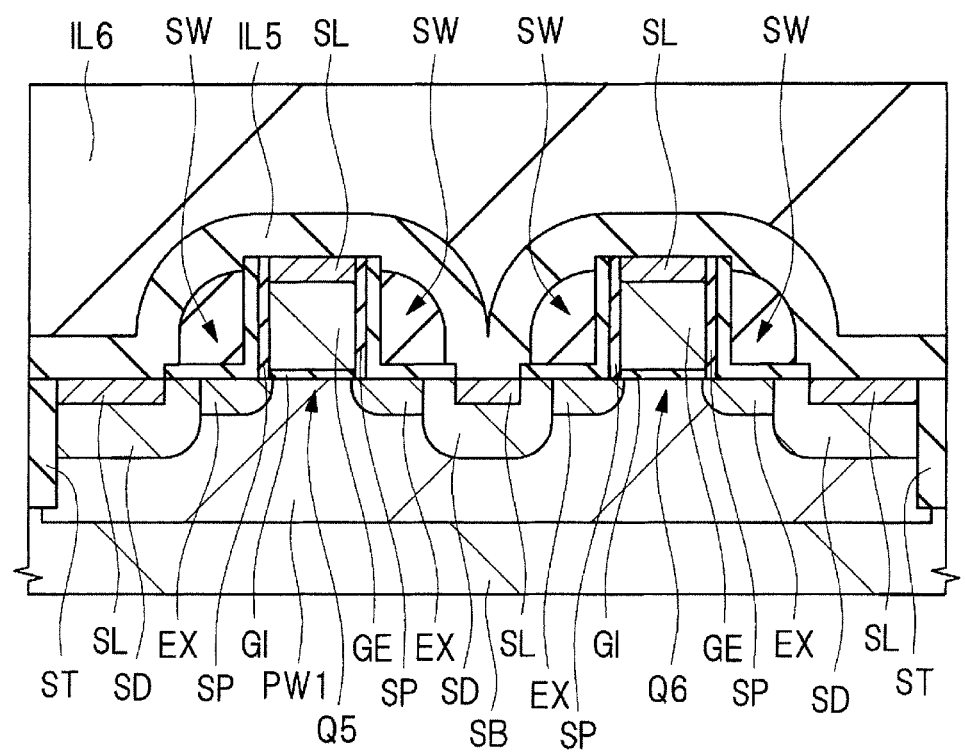
FIG. 32 is a cross-sectional view of a main part of another manufacturing step of the semiconductor device, following the step shown in FIG. 31.
Figure 33:
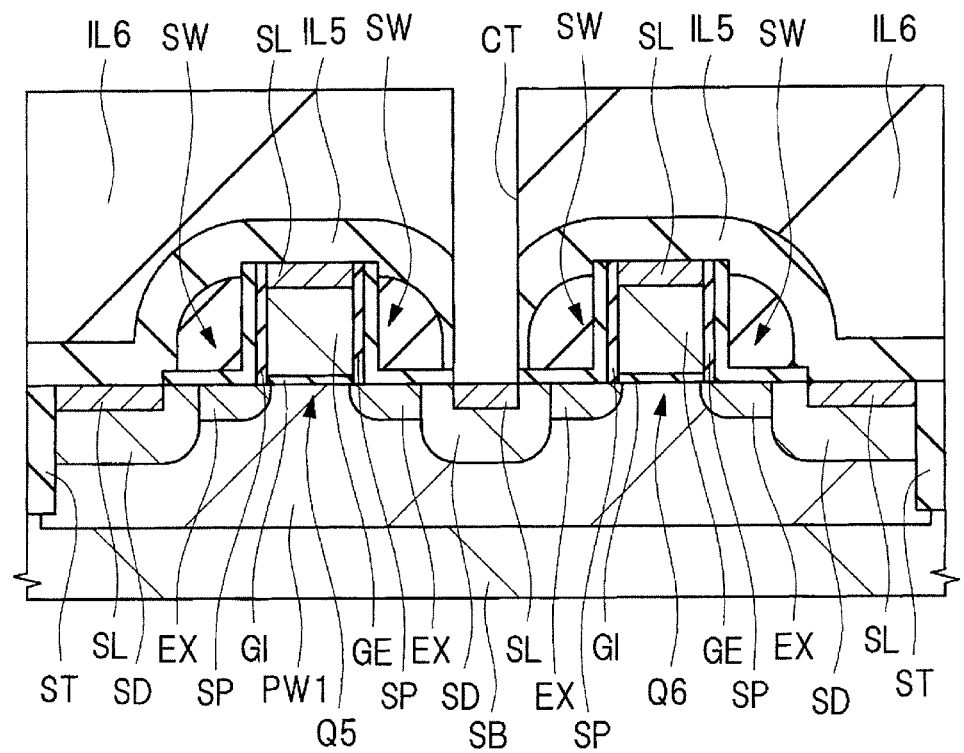
FIG. 33 is a cross-sectional view of a main part of another manufacturing step of the semiconductor device, following the step shown in FIG. 32.
Figure 34:
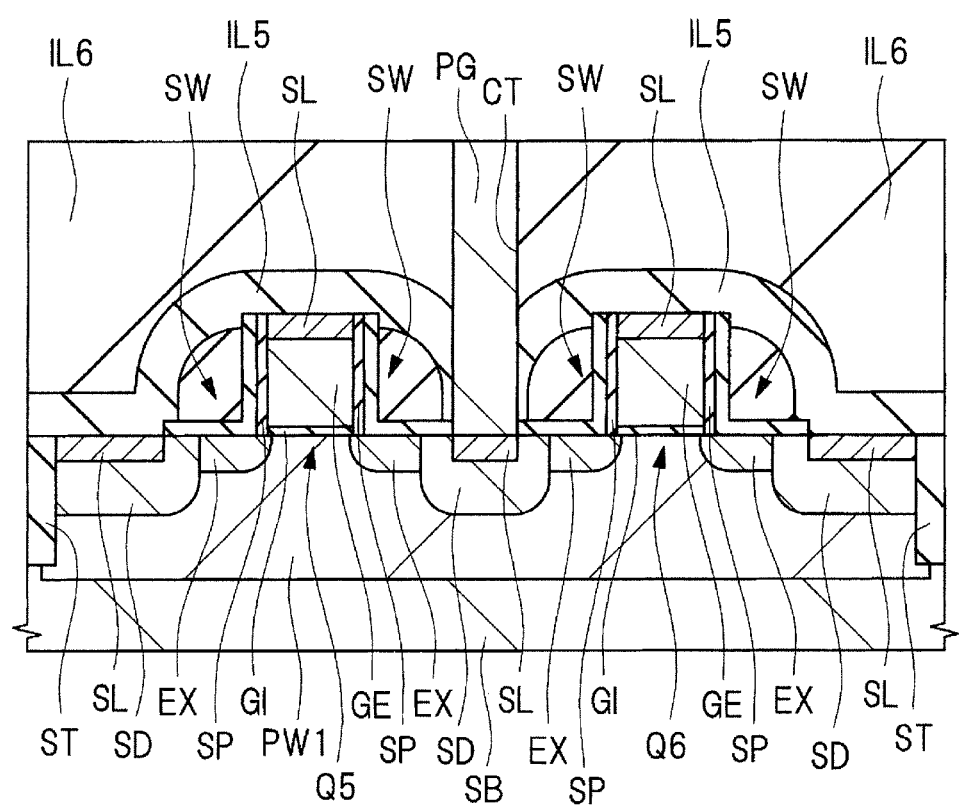
FIG. 34 is a cross-sectional view of a main part of another manufacturing step of the semiconductor device, following the step shown in FIG. 33.
Figure 35:
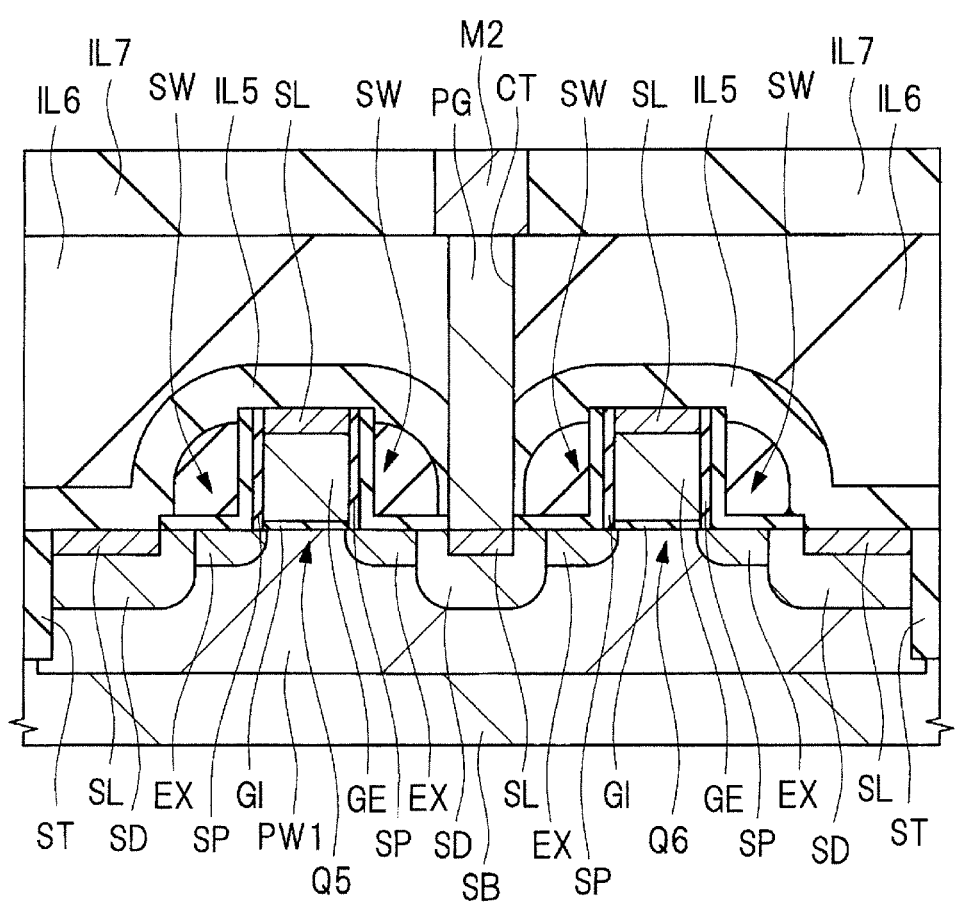
FIG. 35 is a cross-sectional view of a main part of another manufacturing step of the semiconductor device, following the step shown in FIG. 34.

As shown in FIG. 31 corresponding to the step stage shown in FIG. 17, the process in step S18 is performed to form the insulating film IL5 over the main surface (entire main surface) of the semiconductor substrate SB to cover the gate electrode GE, the sidewall spacers SW, and the metal silicide layer SL. Then, as shown in FIG. 32 corresponding to the step stage shown in FIG. 18, the process in step S19 is performed to form the insulating film IL6 over the insulating film IL5. Then, as shown in FIG. 33 corresponding to the step stage shown in FIG. 20, the process in step S20 is performed to form a contact hole CT in the laminated film of the insulating films IL6 and IL5. The formation way of the contact hole CT is the same as that shown in FIGS. 19 and 20. Then, as shown in FIG. 34 corresponding to the step stage shown in FIG. 21, the process in step S21 is performed to fill the contact hole CT with a conductive plug PG. Thereafter, as shown in FIG. 35 corresponding to the step stage shown in FIG. 22, an insulating film IL7 is formed over the insulating film IL6 with the plug PG embedded therein. A wiring M1 is formed by the damascene method. In the way described above, the semiconductor device of this embodiment is manufactured.

Figure 23:
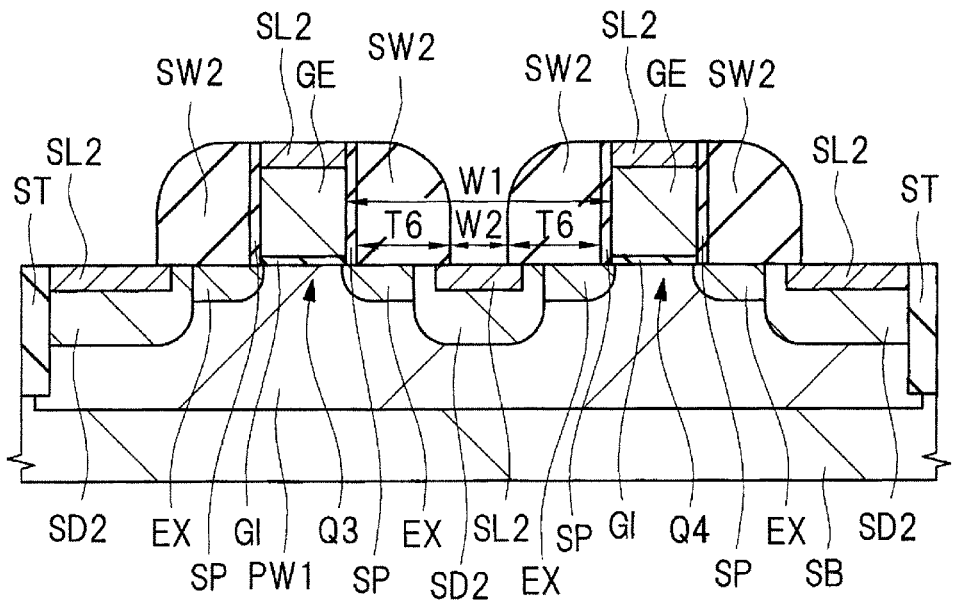
FIG. 23 is a cross-sectional view of a main part of another manufacturing step of a semiconductor device in a first examined example.

The distance W3 between the adjacent gate electrodes GE in the gate length direction with the source/drain region (SD) sandwiched (shared) therebetween as shown in FIG. 30 is assumed to be the same as the distance W1 between the gate electrodes GE shown in FIG. 23 (that is, W3=W1). The thickness of the sidewall insulating film SP (thickness along the gate length direction) is supposed to be the same between the cases shown in FIG. 30 and FIG. 23. The thickness T4 of the sidewall spacer SW formed in step S11 as shown in FIG. 30 is assumed to be the same as the thickness T6 of the sidewall spacer SW2 as shown in FIG. 23. In this case, the thickness T4 of the sidewall spacer SW in forming the source and drain regions SD as shown in FIG. 30 is the same as the thickness T6 of the sidewall spacer SW2 in forming the source and drain regions SD2 as shown in FIG. 23.

In this embodiment, after formation of the source and drain regions SD, the thickness of the sidewall spacer SW is made smaller (thinner) by performing the isotropic etching on the sidewall spacers SW. Thus, the distance W4 between the adjacent sidewall spacers SW in the stage where the insulating film IL5 is formed as shown in FIG. 30 is larger than the distance W2 between the adjacent sidewall spacers SW2 in the stage where the insulating film IL5 is formed as shown in FIG. 23. The distance W4 between the adjacent sidewall spacers SW corresponds to a distance between the sidewall spacers SW formed over the opposed sidewalls of the gate electrodes GE adjacent to each other in the gate length direction.

That is, in this embodiment, the thickness of the sidewall spacer SW is made smaller (thinner) by performing the isotropic etching on the sidewall spacers SW after formation of the source and drain regions SD, which can increase the distance W4 between the adjacent sidewall spacers SW.

In the deposition step of the insulating film IL15 shown in FIG. 31, the insulating film IL5 is deposited in a thickness (deposition thickness) T11. The deposition thickness T11 of the insulating film IL5 is assumed to be the same as the deposition thickness T8 of the insulating film IL15 shown in FIG. 24. At this time, taking into consideration the insulating film IL5 embedded in the narrow gap (region) between the sidewall spacers SW2 as shown in FIG. 31, a thickness T12 of the insulating film IL5 in the direction perpendicular to the main surface of the semiconductor substrate SB becomes smaller than a thickness T9 of the insulating film IL15 filling in a region between the sidewall spacers SW2 as shown in FIG. 24. This is because the distance W4 between the adjacent sidewall spacers SW shown in FIGS. 30 and 31 is larger than the distance W2 between the adjacent sidewall spacers SW shown in FIGS. 23 and 24.

That is, as the distances W4 and W2 between the adjacent sidewall spacers become smaller, the thicknesses T12 and T9 of the insulating films IL5 and IL15 filling in the region between the sidewall spacers is increased. In this embodiment, the distance W4 between the adjacent sidewall spacers SW can be made larger by the reduction in thickness of the sidewall spacer SW in step S13. Thus, the thickness T12 of the insulating film IL5 filling in the region between the sidewall spacers can approach the deposition thickness T11 of the insulating film IL5. In other words, this embodiment can decrease a difference between the thickness T12 of the insulating film IL5 filling in the region between the sidewall spacers SW and the deposition thickness T11 of the insulating film IL5.

Accordingly, as shown in FIG. 33, this embodiment can suppress or prevent the etching residue of the insulating film IL5 from being generated at the bottom of the contact hole CT in the step of etching for forming the contact hole CT over the source/drain region SD between the sidewall spacers SW adjacent by the distance W4. Thus, this embodiment can prevent the poor continuity of the plug PG to improve the production yield of the semiconductor devices. Further, this embodiment does not need overetching in the etching process of the insulating film IL5, and thus can suppress or prevent the excessive digging of the contact hole CT or the damage on the underlayer.

In this embodiment, in order to reduce (thin) the thickness (T5) of the sidewall spacer SW in forming the insulating film IL5 (in step S18), the thickness (T4) of the sidewall spacer SW does not have to be reduced (thinned) in forming the source and drain regions SD (that is, in the ion implantation of step S12). For this reason, the thickness (T4) of the sidewall spacer SW in the ion implantation for formation of the source/drain region SD can be increased. Even when the dopants in the source/drain region SD are diffused into the extension regions EX by the activation annealing, the impurity profile in which the extension region EX protrudes into the channel formation region from the source/drain region SD can be surely formed. As a result, the characteristics (electrical characteristics) of the MISFET can be improved. For example, when the thickness (T4) of the sidewall spacers SW formed in the forming process of the spacer SW is varied (fluctuated) due to variations in manufacturing conditions, the electrical characteristics (for example, source-drain current) of the MISFET can be suppressed from varying. Therefore, this embodiment can improve the performance of the semiconductor device.

The MISFET including the metal silicide SL (that is, the MISFET not covered with the silicide block film BK) tends to have the problems described with reference to FIGS. 23 to 28 due to the small distance (W1, W3) between the gate electrodes. Specifically, the region having a memory cell of a memory (such as a SRAM or a flash memory) is likely to have the problems. In this embodiment, the thickness of the sidewall spacer SW can be decreased in step S13 in both the MISFET not covered with the silicide block film BK even in the following step and the MISFET covered with the silicide block film BK thereafter. As a result, even the MISET not covered with the silicide block film BK, which tends to have the problems described with reference to FIGS. 23 to 28, can prevent the problems described with reference to FIGS. 23 to 28.

In the MISFET in which the silicide block film BK is formed to prevent the formation of the metal silicide layer SL, the distance (W1, W3) between the gate electrodes is not so small. With the arrangement of this embodiment, in the MISFET in which the silicide block film BK is formed, the silicide block film BK acts to decrease the distance (W4) between the adjacent sidewall spacers (SW), but does not raise the problems described with reference to FIGS. 23 to 28.

Particularly, the region with the memory cell of the memory (such as a SRAM or a flash memory (nonvolatile memory)) tends to have the problems explained referring to FIGS. 23 to 28 because of the small distance (W1, W3) between the gate electrodes. Thus, this embodiment and a second embodiment to be described later can be more effectively applied to the case where the semiconductor device including the memory (such as the SRAM or the flash memory (nonvolatile memory)) is produced.

The other of the main features of this embodiment is that when the sidewall spacer is formed of the insulating films IL2 and IL3 and the sidewall spacer SW is subjected to the isotropic etching in step S13 to decrease the thickness of the sidewall spacer SW, the etching is performed on the conditions where the insulating film IL2 is less likely to be etched than the insulating film IL3.

Unlike this embodiment, when the isotropic etching is performed on the sidewall spacer SW on conditions in which the insulating film IL3 and the insulating film IL2 are etched at the same etching rate, or on the conditions in which the insulating film IL2 is more likely to be etched than the insulating film IL3, the side-etching of the insulating film IL2 forming the sidewall spacer SW is promoted in the isotropic etching step. When the side-etching of the insulating film IL2 forming the sidewall spacer SW is promoted, the end of the metal silicide layer SL (end on the side opposed to the channel formation region) formed in the following step of forming the metal silicide layer SL over the source/drain region SD approaches the channel formation region to cause an increase in leakage current. That is, when the insulating film IL2 forming the sidewall spacer SW is etched to expose the region of the substrate (Si substrate region), the metal silicide layer SL might also be formed in the exposed substrate region (Si substrate region) in the following step of forming the metal silicide layer SL by the salicide technique. This causes the end of the metal silicide layer SL to approach the channel formation region, resulting in an increase in leakage current. The increase in leakage current leads to the reduction in performance of the semiconductor device. The increase in leakage current also leads to a decrease in yield of the semiconductor devices due to the leakage current.

In contrast, in this embodiment, when the sidewall spacers SW are subjected to the isotropic etching in step S13 to decrease the thickness of the sidewall spacer SW, the etching is performed on conditions where the insulating film IL2 is less likely to be etched than the insulating film IL3. In the isotropic etching process of step S13, the insulating film IL3 forming the sidewall spacer SW is side-etched, which can decrease the thickness of the sidewall spacer SW, while suppressing the etching of the insulating film IL 2 forming the sidewall spacer SW. As shown in FIG. 12, after the isotropic etching in step S13, the edge EG of the insulating film IL2 of each sidewall spacer SW extending over the semiconductor substrate SB (p-type wells PW1 and PW2) protrudes from the side surface of the insulating film IL3 of the sidewall spacer SW. This embodiment can suppress the etching of the insulating film IL2 forming the sidewall spacer SW in the anisotropic etching process of step S13. In forming the metal silicide layer SL over the source/drain region SD thereafter, the end of the metal silicide layer SL (end thereof opposed to the channel formation region) can be suppressed or prevented from approaching the channel formation region to thereby suppress the leakage current. That is, in the anisotropic etching of step S13, the insulating film IL2 forming the sidewall spacer SW can be suppressed or prevented from being etched and exposed at the substrate region (Si substrate region). In the following step of forming the metal silicide layer SL by the salicide technique, the end of the metal silicide layer SL can be suppressed or prevented from approaching the channel formation region. In this way, the leakage current can be suppressed. Therefore, this embodiment can improve the performance of the semiconductor device. Also, this embodiment can improve the production yield of the semiconductor devices.

The sidewall spacer SW is comprised of the insulating films IL2 and IL3. As shown in FIGS. 23 to 28 and FIGS. 30 to 35, the upper side one of the insulating films IL2 and IL3 forming the sidewall spacer SW, namely, the insulating film IL3 mainly contributes to the embedding of the insulating film IL5 or IL15 between the sidewall spacers. In contrast, the lower side one of the insulating films IL2 and IL3 forming the sidewall spacer SW, namely, the insulating film IL2 mainly contributes to the positioning of the end of the metal silicide layer SL. For this reason, the insulating film IL3 of the insulating films IL2 and IL3 forming the sidewall spacer SW is isotropically etched selectively in step S13. Thus, the distance W4 between the adjacent sidewall spacers SW can be increased to thereby decrease the difference between the thickness T12 of the insulating film IL5 filling the region between the sidewall spacers SW and the deposition thickness T11 of the insulating film IL5. Thus, this embodiment can prevent the poor continuity of the plug PG to improve the production yield of the semiconductor devices. In contrast, the lower side insulating film IL2 of the insulating films IL2 and IL3 forming the sidewall spacer SW is suppressed from being etched in step S13. In forming the metal silicide layer SL, the end of the metal silicide layer SL can be suppressed or prevented from approaching the channel formation region. Thus, this embodiment can suppress the leakage current and improve the performance of the semiconductor device. Further, this embodiment can improve the production yield of the semiconductor devices.

The thickness (formation thickness) T2 of the insulating film IL3 is preferably more (thicker) than the thickness (formation thickness) T1 of the insulating film IL2 (that is, T2>T1). This arrangement can control the positioning of the end of the metal silicide layer SL by the insulating film IL2 of the sidewall spacer SW, while effectively decreasing the difference between the thickness T12 of the insulating film IL5 filling the region between the sidewall spacers SW and the deposition thickness T11 of the insulating film IL5.

In this embodiment, the isotropic etching process of the sidewall spacer SW in step S13 is performed before the activation annealing which is the heat treatment for activation in step S14. The activation annealing in step S14 is a heat treatment performed at the highest temperature among the manufacturing processes of the semiconductor device. The heat treatment (activation annealing) at such a high temperature makes it difficult to etch the sidewall spacer SW (insulating film IL3 thereof). In this embodiment, however, the isotropic etching of the sidewall spacer in step S13 is performed before the activation annealing in step S14. Thus, in step S13, the sidewall spacer SW (insulating film IL3 thereof) is more likely to be etched. This embodiment has an advantage that the etching process in step S13 can be easily performed.

In the etching process of step S13, the etching is preferably finished before all the insulating film IL3 forming the sidewall spacer SW is removed. Thus, even after the etching process in step S13, the sidewall spacer SW is also preferably comprised of the insulating film IL2 and the insulating film IL3. At least a part of the insulating film IL3 forming each sidewall spacer SW also remains after the etching process in step S13. Even when the contact hole CT is misaligned (or deviates from the designed position of the contact hole CT) in forming the contact hole CT, the presence of the insulating film IL3 can easily prevent the extension region EX from being exposed from the contact hole CT. Since at least a part of the insulating film IL3 forming each sidewall spacer SW also remains after the etching process in step S13, the insulating film IL5 to be formed later can be difficult to peel off.

In the isotropic etching process of the sidewall spacer SW in step S13, in this embodiment, the insulating film IL3 forming the sidewall spacer SW is side-etched, which retracts the side surface of the insulating film IL3 forming the sidewall spacer SW toward the gate electrode GE. The term "side surface of the insulating film IL3 forming the sidewall spacer SW" means a side surface of the insulating film IL3 on the side opposite to the side adjacent to the gate electrode GE via the sidewall insulating film SP and the insulating film IL2. However, in the stage where the contact hole CT is to be formed, the lower end of the side surface of the insulating film IL3 forming the sidewall spacer SW is preferably positioned not above the extension region EX, but above the source and drain region SD. That is, in the stage of forming the contact hole CT, the lower end of the side surface of the insulating film IL3 forming the sidewall spacer SW is preferably positioned outside the boundary between the source/drain region SD and the extension region EX (specifically, the position of the boundary after the activation annealing in step S14). The term "inside" as used herein means the side closer to the gate electrode GE as viewed in the gate length direction, and the term "outside" as used herein means the side away from the gate electrode GE in the gate length direction.

In the stage of forming the contact hole CT, when the lower end of the side surface of the insulating film IL3 forming the sidewall spacer SW is positioned not above the extension region EX, but above the source/drain region SD, the extension region EX is covered with the gate electrode GE, the sidewall insulating film SP, and the insulating film IL3 forming the sidewall spacer SW. Thus, even when the contact hole CT is misaligned (or deviates from the designed position of the contact hole CT) in forming the contact hole CT over the source/drain region SD, as the extension region EX is covered with the insulating film IL3 forming the sidewall spacer SW, the extension region EX can be accurately prevented from being exposed from the contact hole CT.

From this aspect, in the etching process of step S13, the amount of etching (amount of side-etching) of the insulating film IL3 forming the sidewall spacer SW can be preferably, for example, in a range of about 3 to 10 nm. A difference between the thickness T4 of the sidewall spacer SW (thickness T4 before the etching process in step S13) and the thickness T5 of the spacer SW (thickness T5 after the etching process in step S13) corresponds to the amount of etching (amount of side-etching) of the insulating film IL3 forming the sidewall spacer SW in the etching process of step S13.

By performing the etching in step S13, the edge EG of the insulating film IL2 of each sidewall spacer SW extending over the semiconductor substrate SB (p-type wells PW1 and PW2) protrudes from the side surface of the insulating film IL3 of the sidewall spacer SW. When the amount of etching (amount of side-etching) of the insulating film IL3 in step S13 is set to a range of 3 to 10 nm as mentioned above, the amount of protrusion of the edge EG of the insulating film IL2 from the lower end of the side surface of the insulating film IL3 in the sidewall spacer SW (distance of the insulating film IL2 protruding in the gate length direction) is in a range of about 3 to 10 nm.

MODIFIED EXAMPLES

A modified example (first modified example) of the first embodiment will be described below with reference to FIGS. 36 to 41. FIGS. 36 to 41 are cross-sectional views of main parts of other manufacturing steps of the semiconductor device in a first modified example of the first embodiment. The modified example of the first embodiment is hereinafter referred to as a "first modified example".

In the first modified example, a part of the insulating film IL2 forming the sidewall spacer SW can be etched in forming the silicide block film BK by patterning the insulating film IL4 by etching in step S16. Now, the first modified example will be specifically described below.

First, until the structure shown in FIG. 13 is obtained, the first modified example performs the same steps as those of the first embodiment, and thus a repeated description thereof will be omitted below. As mentioned above with reference to FIGS. 1 to 13, the processes until step S15 (formation step of the insulating film IL4) are performed, and the photoresist pattern (resist pattern) PR1 is formed over the insulating film IL4 using the photolithography to thereby obtain the structure of FIG. 13.

Figure 36:
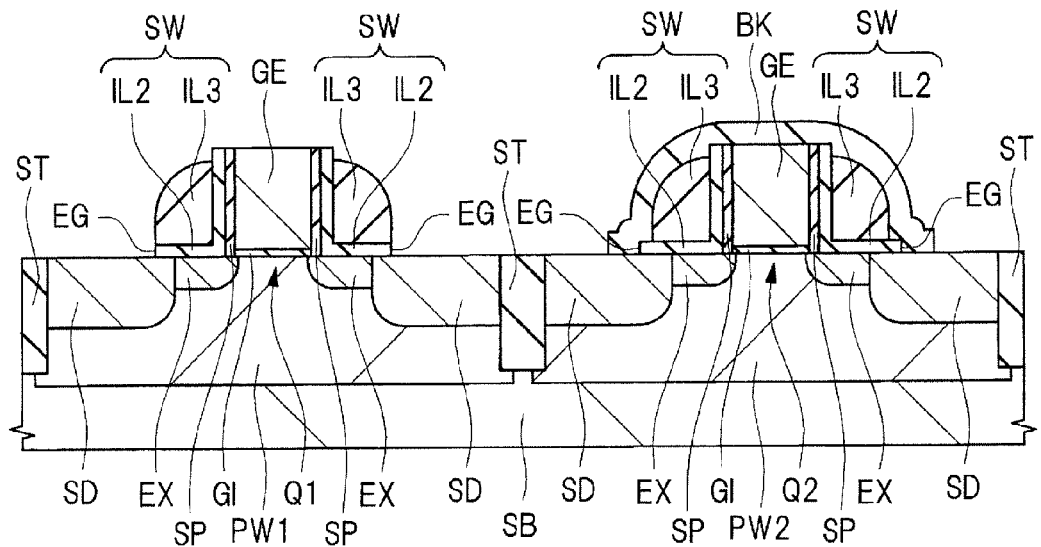
FIG. 36 is a cross-sectional view of a main part of another manufacturing step of a semiconductor device in a first modified example.

Then, in step S16, the insulating film IL4 is patterned by etching using the photoresist pattern PR1 as an etching mask to thereby form the silicide block film BK as shown in FIG. 36. The etching process for use in step S16 can be dry etching, wet etching, or a combination of dry etching and wet etching.

Thereafter, the photoresist pattern PR1 is removed. FIG. 36 shows the stage in which the photoresist pattern PR1 is removed. The silicide block film BK is formed of the insulating film IL4 patterned.

After the process in step S16, the gate electrode GE, sidewall spacers SW, and source and drain regions SD for the MISFETQ1 are exposed (that is, not covered with the silicide block film BK), whereas the gate electrode GE, the sidewall spacers SW, and parts of the source and drain regions SD for the MISFETQ2 are covered with the silicide block film BK. This is common to FIGS. 14 and 36.

That is, in step S16, the insulating film IL4 covering the MISFETQ1 is removed to expose the sidewall spacers SW for the MISFETQ1. Referring to FIG. 14, when etching the insulating film IL4 in step S16, the etching of the insulating film IL2 forming the sidewall spacer SW is suppressed. For example, the overetching of the insulating film IL4 in step S16 is reduced as much as possible, and in the etching process, the insulating film IL2 forming the sidewall spacer SW can be suppressed from being etched. Alternatively, the selection of respective insulating materials of the insulating films IL2, IL3, and IL4 can suppress the etching of the insulating film IL2 forming the sidewall spacer SW in the etching process of the insulating film IL4 of step S16. In the case shown in FIG. 14, even in the sidewall spacer SW exposed without being covered by the silicide block film BK, the edge (EG) of the insulating film IL2 forming the sidewall spacer SW and extending over the semiconductor substrate SB (p-type well PW1) protrudes from the side surface of the insulating film IL3 forming the sidewall spacer SW. This state is maintained even after the step S16. The term "side surface of the insulating film IL3 forming the sidewall spacer SW" means a side surface of the insulating film IL3 on the side opposite to the side adjacent to the gate electrode GE via the sidewall insulating film SP and the insulating film IL2.

In the first modified example (see FIG. 36), when etching the insulating film IL4 in step S16, the insulating film IL2 forming the sidewall spacer SW (corresponding to the sidewall spacer SW for the MISFETQ1) exposed by removing the insulating film IL4 is also subjected to the etching. For example, when the insulating film IL2 and the insulating film IL4 are formed of the same type of insulating material (for example, silicon oxide), in the etching process of the insulating film IL4 in step S16, the overetching is performed to some degree to promote the etching of the insulating film IL2 forming the sidewall spacer SW. That is, the etching process of the insulating film IL4 in step S16 also etches a part of the insulating film IL2 forming the sidewall spacer SW not covered with the silicide block film BK and protruding from the side surface of the insulating film IL3 forming the spacer SW.

In the case shown in FIG. 36, even in the sidewall spacer SW exposed without being covered by the silicide block film BK, the edge (EG) of the insulating film IL2 forming the sidewall spacer SW and extending over the semiconductor substrate SB (p-type well PW1) protrudes from the side surface of the insulating film IL3 forming the sidewall spacer SW. This state is deleted even after the step S16. That is, in the case shown in FIG. 36, even in the sidewall spacer SW exposed without being covered by the silicide block film. BK, the edge (EG) of the insulating film IL2 forming the sidewall spacer SW and extending over the semiconductor substrate SB (p-type well PW1) is substantially flush (aligned) with the side surface of the insulating film IL3 forming the sidewall spacer SW.

That is, in the first modified example, in the sidewall spacer SW exposed and not covered with the silicide block film BK, a part of the insulating film IL2 protruding from the insulating film IL3 forming the sidewall spacer SW (protruding in the direction away from the gate electrode GE) is removed by the etching in step S16. The process in step S16 in the first modified example is substantially the same as that in step S16 in the above first embodiment except for the above point, and a repeated description of the same points will be omitted.

The following steps of the first modified example are the same as those in the manufacturing process of the above first embodiment.

Figure 37:
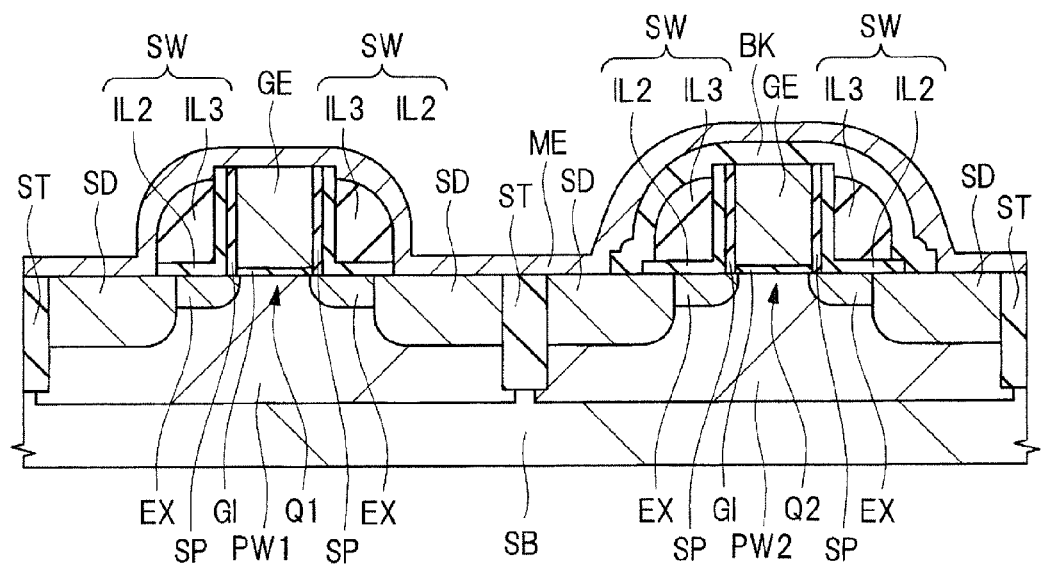
FIG. 37 is a cross-sectional view of a main part of another manufacturing step of the semiconductor device, following the step shown in FIG. 36.
Figure 38:
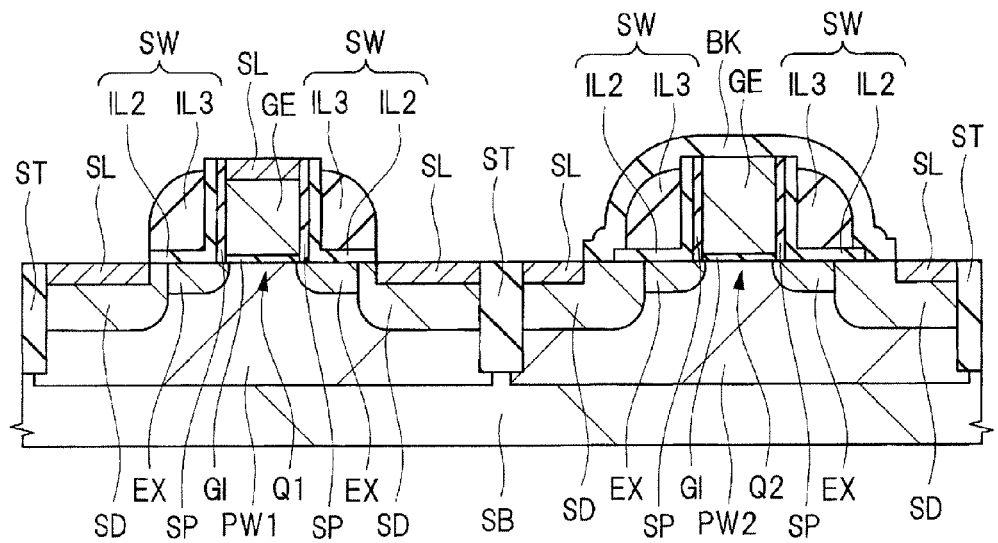
FIG. 38 is a cross-sectional view of a main part of another manufacturing step of the semiconductor device, following the step shown in FIG. 37.

That is, the metal silicide layer SL is formed in step S17. Specifically, as shown in FIG. 37, the metal film ME is formed over the main surface (entire main surface) of the semiconductor substrate SB to cover the gate electrode GE, the sidewall spacers SW, the source and drain regions SD, and the silicide block film BK. Then, the heat treatment is performed to react the metal film ME with the gate electrode GE (Si included therein) and the source and drain regions SD (Si included therein) to thereby form the metal silicide layer SL as shown in FIG. 38. Thereafter, the unreacted (excessive) metal film is removed, which is illustrated in FIG. 38.

Since the silicide block film BK is not formed over the gate electrode GE and source and drain regions SD for the MISFETQ1, the metal silicide layer SL is formed substantially over the entire upper part (upper layer part) of the gate electrode GE and source and drain regions SD for the MISFETQ1. In contrast, the silicide block film BK is formed over the gate electrode GE and source and drain regions SD for the MISFETQ2 except for the parts thereof. Thus, the metal silicide layer SL is formed over the upper part (upper layer part) not covered with the silicide block film BK within the gate electrode GE and source and drain regions SD for the MISFETQ2, while the metal silicide layer SL is not formed in the parts of the gate electrode GE and source and drain regions SD for the MISFETQ2 covered with the silicide block film BK.

Figure 39:
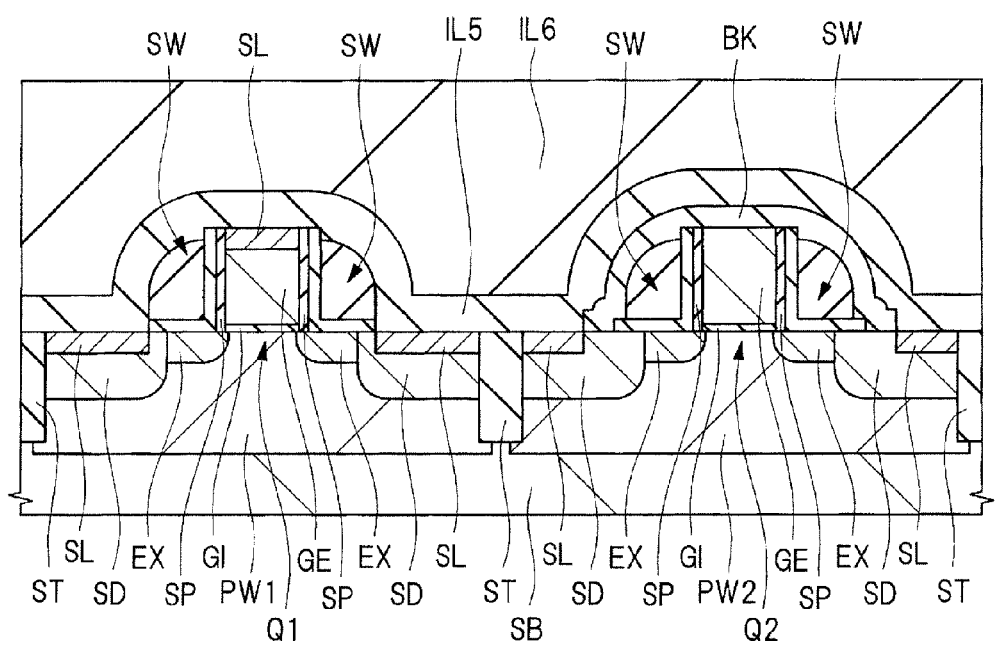
FIG. 39 is a cross-sectional view of a main part of another manufacturing step of the semiconductor device, following the step shown in FIG. 38.

Then, as shown in FIG. 39, in step S18, the insulating film IL5 is formed over the main surface (entire main surface) of the semiconductor substrate SB to cover the gate electrode GE, the sidewall spacers SW, the metal silicide layer SL, and the silicide block film BK. In step S19, the insulating film IL6 is formed over the insulating film IL5. After forming the insulating film IL6, if necessary, the upper surface of the insulating film IL6 is polished by a chemical mechanical polishing (CMP), which can enhance the flatness of the upper surface of the insulating film IL6.

Figure 40:
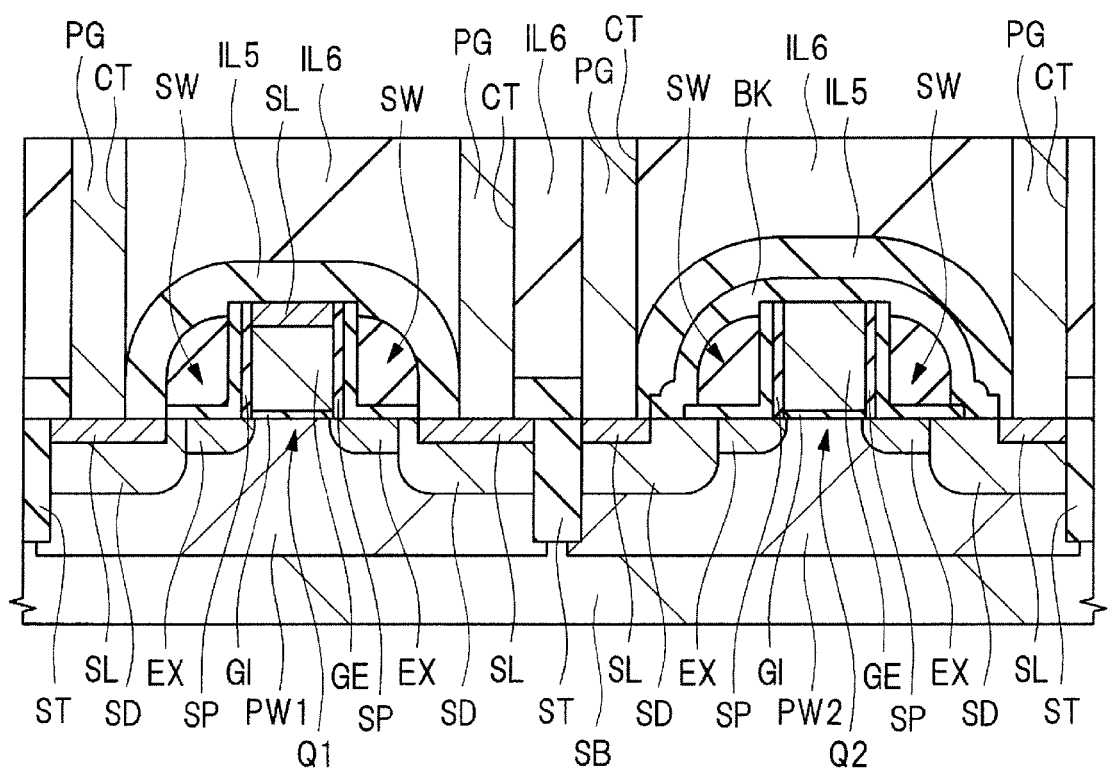
FIG. 40 is a cross-sectional view of a main part of another manufacturing step of the semiconductor device, following the step shown in FIG. 39.
Figure 41:
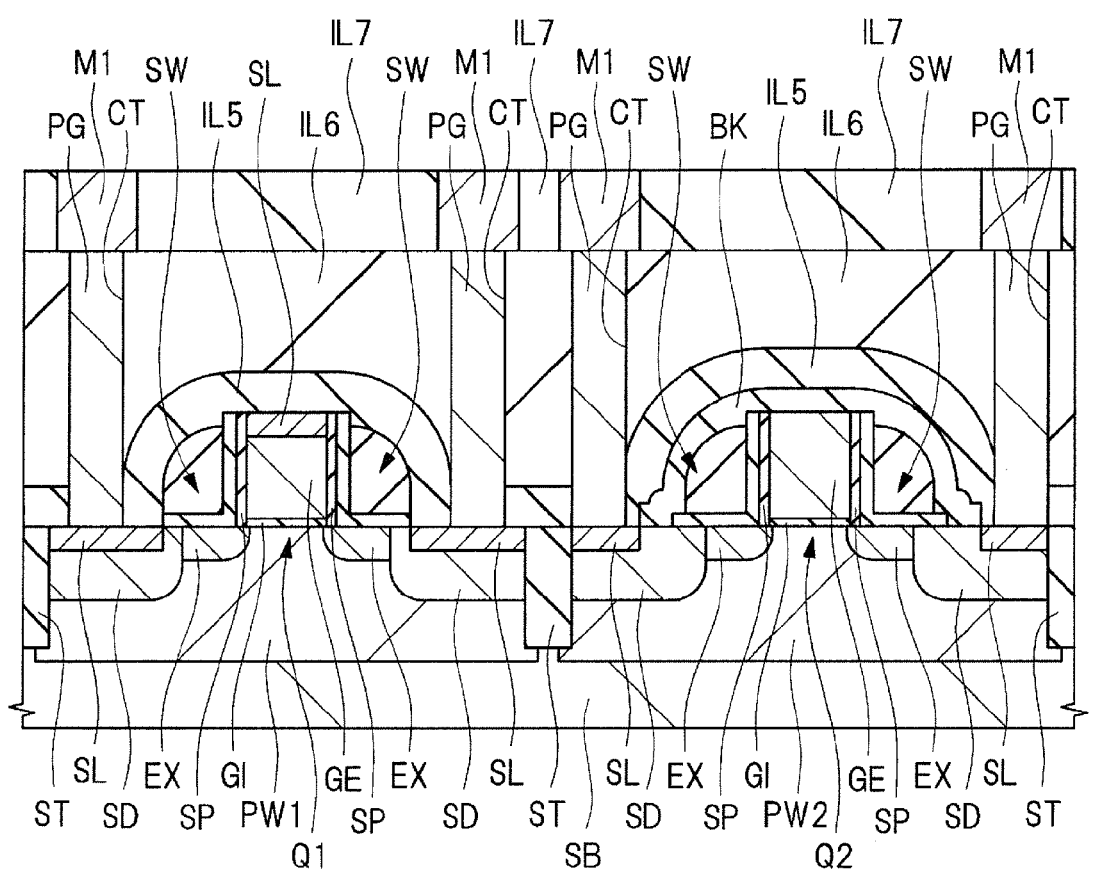
FIG. 41 is a cross-sectional view of a main part of another manufacturing step of the semiconductor device, following the step shown in FIG. 40.

Then, as shown in FIG. 40, in step S20, the contact holes CT are formed in the laminated film of the insulating films IL6 and IL5. The formation way of the contact hole CT is the same as that described with reference to FIGS. 19 and 20. Then, in step S21, the conductive plugs PG are formed (embedded) in the respective contact holes CT. Thereafter, as shown in FIG. 41, the insulating film IL7 is formed over the insulating film IL6 with the plug PG embedded therein. The wiring M1 is formed by the damascene method. In the way described above, the semiconductor device of this embodiment is manufactured.

In the first embodiment (referring to FIGS. 3 to 22), in etching the insulating film IL4 in step S16, the etching of the insulating film IL2 forming the sidewall spacer SW is suppressed. In the MISFETQ1 not covered with the silicide block film BK, the edge (EG) of the insulating film IL2 of the sidewall spacer SW extending over the semiconductor substrate SB (p-type well PW1) protrudes from the side surface of the insulating film IL3 forming the sidewall spacer SW. In this state, the process in step S 17 is performed to form the metal silicide layer SL.

In contrast, in the first modified example (see FIGS. 38 to 42), in the etching process in step S16, a part of the insulating film IL2 forming the sidewall spacer SW is etched. In the MISFETQ1 not covered with the silicide block film BK, the edge (EG) of the insulating film IL2 forming the sidewall spacer SW and extending over the semiconductor substrate SB (p-type well PW1) is processed to be substantially flush (aligned) with the side surface of the insulating film IL3 forming the sidewall spacer SW. In this state, the process in step S17 is performed to form the metal silicide layer SL.

In the first modified example (see FIGS. 38 to 42), a distance (interval) between the channel formation region and the end of the metal silicide layer SL formed over the source/drain region SD (end on the side opposed to the channel formation region) becomes small (short) as compared to the first embodiment (see FIGS. 3 to 22). From the viewpoint of reducing the leakage current, the first embodiment (see FIGS. 3 to 22) is more advantageous than the first modified example (see FIGS. 38 to 42).

Like the first embodiment, however, in the first modified example, the etching process in step S13 suppresses the etching of the insulating film IL2 forming the sidewall spacer SW. Thus, like the first embodiment, also in the first modified example, the edge EG of the insulating film IL2 of each sidewall spacer SW extending over the semiconductor substrate SB (p-type well PW1) protrudes from the side surface of the insulating film IL3 of the sidewall spacer SW, directly before the etching process in step S16.

It is assumed that directly before the etching in step S16, the edge (EG) of the insulating film IL2 of the sidewall spacer SW extending over the semiconductor substrate SB (p-type well PW1) is positioned to be flush (aligned) with the side surface of the insulating film IL3 of the sidewall spacer SW. This state is hereinafter referred to as a "second examined example". In the second examined example, unlike the first embodiment and the first modified example, the etching is performed on the condition in which the etching rate of the insulating film IL2 forming the sidewall spacer SW is the same as that of the insulating film IL3 forming the spacer SW in the etching process of step S13.

As to the sidewall spacer SW directly before the etching process of step S16, in the first modified example, the edge (EG) of the insulating film IL2 protrudes from the side surface of the insulating film IL3, whereas in the second examined example, the edge (EG) of the insulating film IL2 is flush with the side surface of the insulating film IL3. Taking into consideration the sidewall spacer SW not covered with the silicide block film BK directly after the etching process of step S16, while reflecting the above state, in the first modified example, the edge (EG) of the insulating film IL2 is substantially flush (aligned) with the side surface of the insulating film IL3, whereas in the second examined example, the edge (EG) of the insulating film IL2 is retracted toward the gate electrode GE with respect to the side surface of the insulating film IL3. That is, considering the sidewall spacer SW not covered with the silicide block film BK directly after the etching process of step S16 by comparison between the second examined example and the first modified example, the position of the edge (EG) of the insulating film IL2 can be farther from the gate electrode GE in the first modified example than in the second examined example. When the metal silicide layer SL is formed by performing the process in step S17 in this state, the distance (interval) between the channel formation region and the end of the metal silicide layer SL formed over the source/drain region SD (end on the side opposed to the channel formation region) is made larger (longer) in the first modified example than in the second examined example. From the viewpoint of reducing the leakage current, the first modified example is more advantageous than the second examined example.

That is, regardless of the degree of etching of the insulating film IL2 in the etching process of step S16, the selective etching of the insulating film IL3 is performed, while suppressing the etching of the insulating film IL2 in isotropically etching the sidewall spacers SW in step S13, which is very useful for increasing the distance between the channel formation region and the end of the metal silicide layer SL formed over the source/drain region SD. In either the first embodiment (see FIGS. 3 to 22) or the first modified example (see FIGS. 38 to 42), the isotropic etching in step S13 is performed on the conditions in which the insulating film IL2 is less likely to be etched than the insulating film IL3, which can increase the distance (interval) between the channel formation region and the end of the metal silicide layer SL formed over the source/drain region SD to reduce the leakage current.

In the first embodiment (see FIGS. 3 to 22), the etching of the insulating film IL2 is suppressed in the etching process of step S16, which can increase the distance (interval) between the channel formation region and the end of the metal silicide layer SL formed over the source/drain region SD to reduce the leakage current. Thus, the first embodiment can improve the performance of the semiconductor device.

In the first modified example, the overetching can be progressed to some degree in step S16, so that the insulating film IL4 can be accurately prevented from remaining in the region where the silicide block film BK is not to be formed. Thus, the first modified example can accurately prevent the defective formation of the metal silicide layer SL. Accordingly, the first modified example can improve the reliability of the semiconductor device, and further the production yield of the semiconductor devices.

In the first modified example, the metal silicide layer SL is formed substantially over the entire region not covered with the silicide block film BK and not covered with the insulating film IL3 forming the sidewall spacer SW in the upper surfaces of the source and drain regions SD. This is because in forming the metal silicide layer SL in step S17, the edge (EG) of the insulating film IL2 does not protrude from the side surface of the insulating film IL3 in each sidewall spacer SW not covered with the silicide block film BK. As a result, when forming the contact holes CT, the source/drain region SD having no metal silicide layer SL formed thereat can be accurately prevented from exposing at the bottom of the contact hole CT.

In other points, the first modified example can obtain the substantial same effects as those of the first embodiment.

In the semiconductor device manufactured in the first modified example, the structure of the sidewall spacer SW (sidewall spacer SW for the MISFETQ2) covered with the silicide block film BK differs from the structure of the sidewall spacer SW (sidewall spacer SW for the MISFETQ1) not covered with the silicide block film BK in the following points. That is, in the sidewall spacer SW covered with the silicide block film BK (sidewall spacer SW for the MISFETQ2), the edge (EG) of the insulating film IL2 extending over the semiconductor substrate SB (p-type well PW2) is protruded from the side surface of the insulating film IL3. In contrast, in the sidewall spacer SW not covered with the silicide block film BK (sidewall spacer SW for the MISFETQ1), the edge (EG) of the insulating film IL2 extending over the semiconductor substrate SB (p-type well PW1) is substantially flush (aligned) with the side surface of the insulating film IL3.

In another modified example, the process in step S15 (formation step of the insulating film IL4) and the process in step S16 (formation step of the silicide block film BK) can be often omitted. In this case, the insulating film IL2 forming the sidewall spacer SW is not etched in step S16. This modified example can obtain the same effects as those of the first embodiment.

Second Embodiment

A manufacturing procedure of a semiconductor device in a second embodiment of the invention will be described below with reference to the accompanying drawings.

Figure 42:
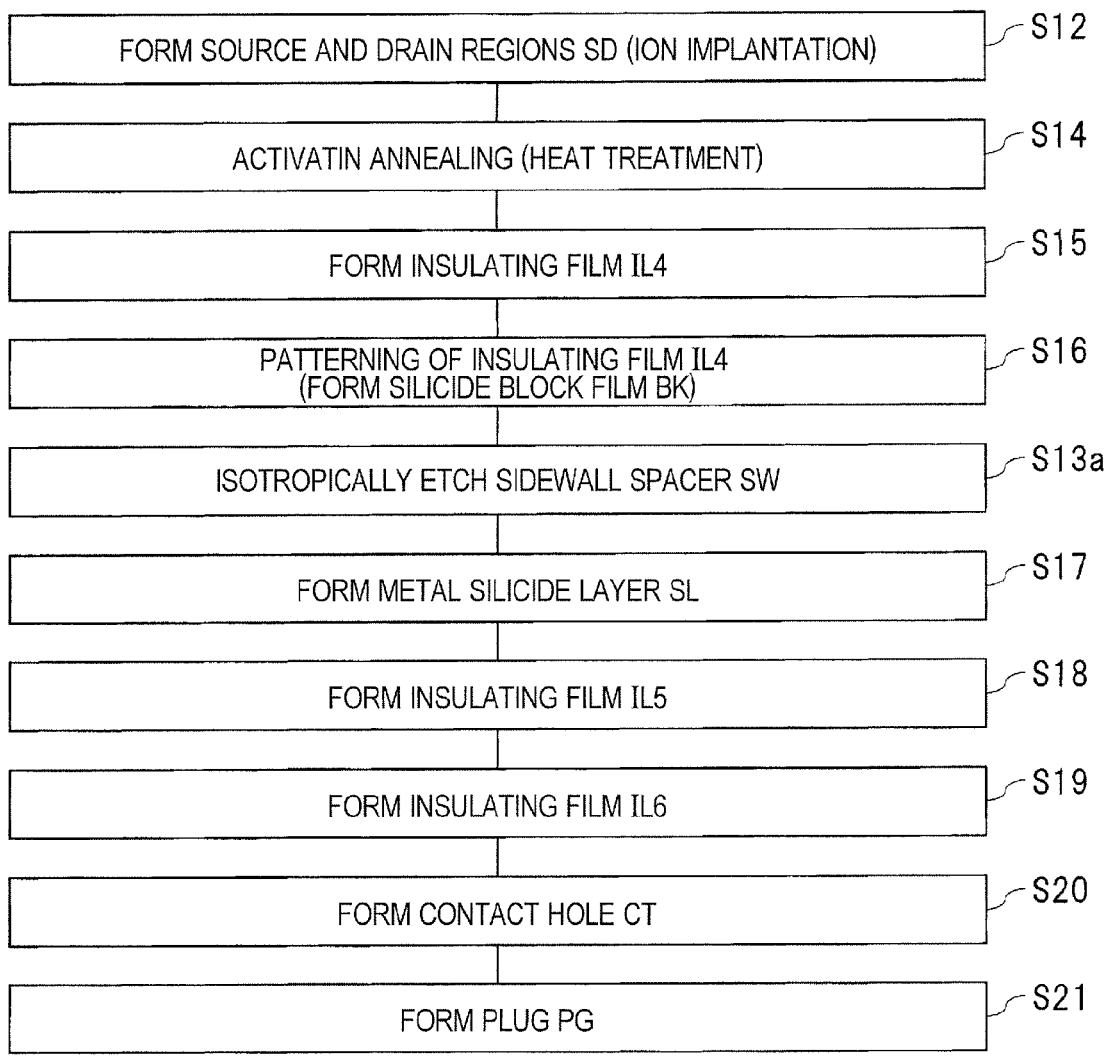
FIG. 42 is another flowchart showing manufacturing steps of a semiconductor device in another embodiment.

FIG. 42 shows another flowchart of manufacturing steps of the semiconductor device in the second embodiment. FIG. 42 corresponds to FIG. 2 of the first embodiment. In this embodiment, after the steps S1 to S11 shown in FIG. 1, steps S12, S14, S15, S16, S13a, S17, S18, S19, S20, and S21 shown in FIG. 42 are performed in that order. FIGS. 43 to 51 are cross-sectional views of main parts of other manufacturing steps of the semiconductor device in the second embodiment.

The second embodiment differs from the first embodiment in that the above step S13 is performed not between steps S12 and S14, but between steps S16 and S17. Now, the second embodiment will be specifically described below.

The manufacturing process of the second embodiment is the same as that of the first embodiment until the formation of the source and drain regions SD by the ion implantation in step S12, and a description thereof will be omitted below.

Figure 43:
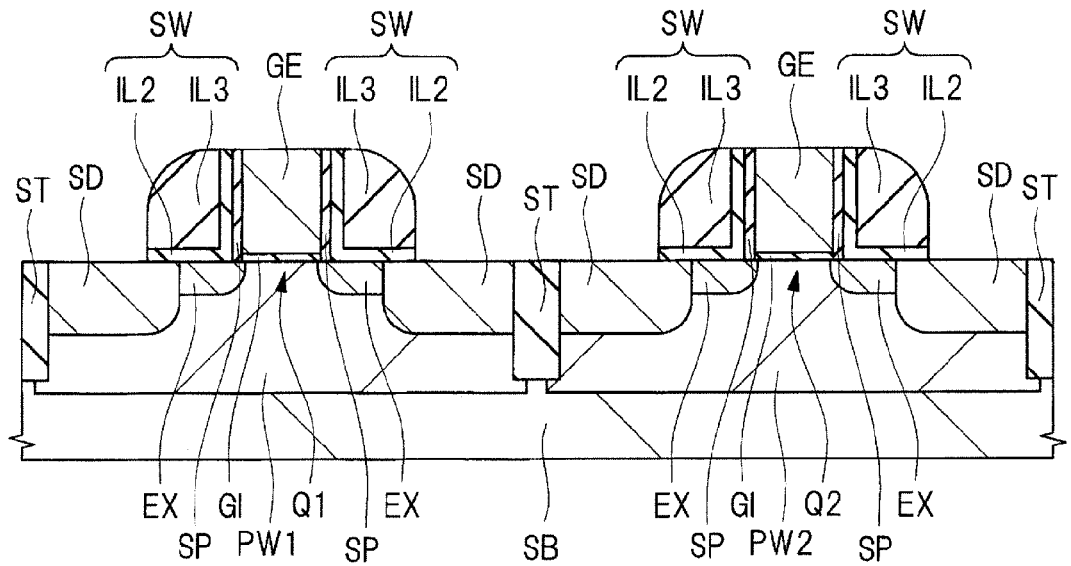
FIG. 43 is a cross-sectional view of a main part of a manufacturing step of the semiconductor device in another embodiment.

The second embodiment performs the processes until step S12 (formation step of the source and drain regions SD by the ion implantation) in the same way as the first embodiment to obtain the structure shown in FIG. 43, which is the same as that shown in FIG. 11. Thereafter, unlike the first embodiment, the second embodiment performs activation annealing in step S14 without performing the process of step S13 (isotropic etching of the sidewall spacer SW) (in step S14 shown in FIG. 42). The activation annealing (heat treatment) of step S14 in this embodiment is basically the same as that in the first embodiment, and a repeated description thereof will be omitted below.

Figure 44:
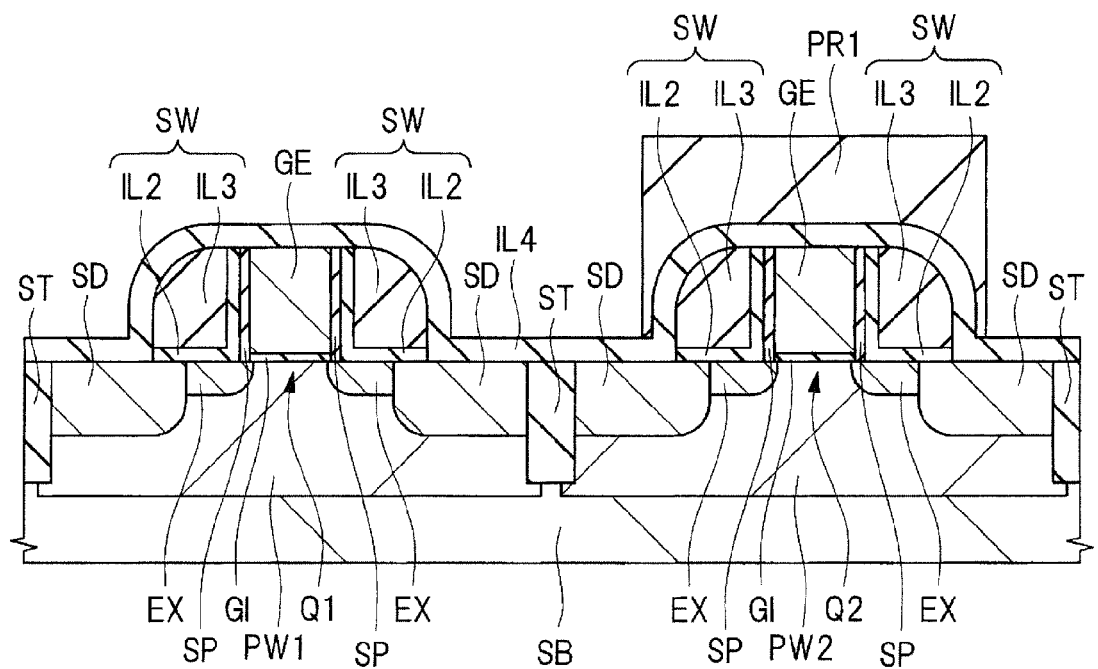
FIG. 44 is a cross-sectional view of a main part of another manufacturing step of the semiconductor device, following the step shown in FIG. 43.

Then, as shown in FIG. 44, like the first embodiment, in step S15, the insulating film IL4 is formed over the main surface (entire main surface) of the semiconductor substrate SB to cover the gate electrode GE, the sidewall spacers SW, and the source and drain regions SD (in step S15 shown in FIG. 42). Then, like the first embodiment, the photoresist pattern PR1 is formed over the insulating film IL4 using the photolithography.

Figure 45:
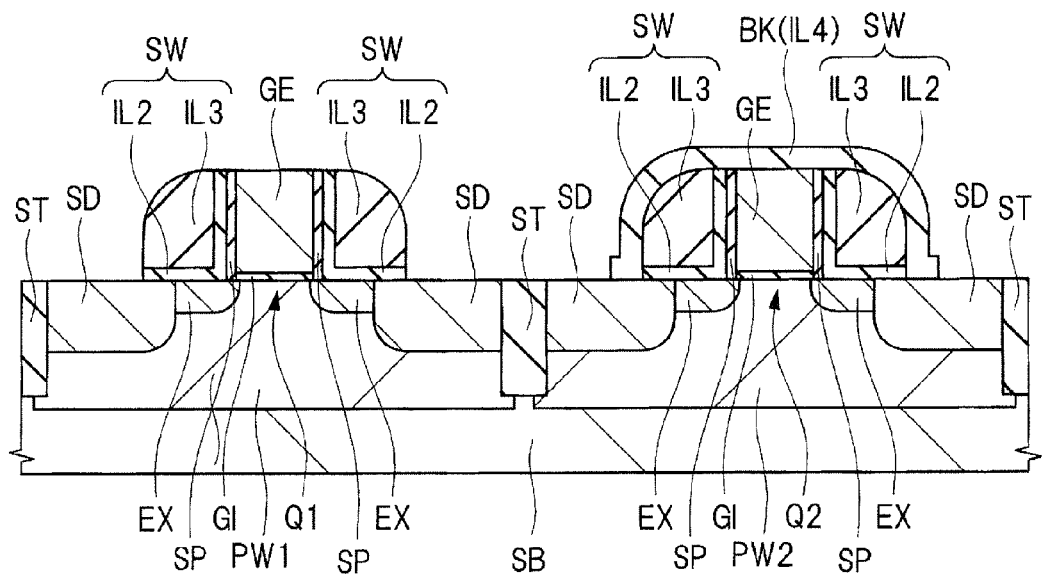
FIG. 45 is a cross-sectional view of a main part of another manufacturing step of the semiconductor device, following the step shown in FIG. 44.

Then, as shown in FIG. 45, like the first embodiment, the insulating film IL4 is patterned by etching using the photoresist pattern PR1 as an etching mask in step S16 to thereby form the silicide block film BK (in step S16 of FIG. 42). Thereafter, the photoresist pattern PR1 is removed. FIG. 45 shows the stage in which the photoresist pattern PR1 is removed. The region where the silicide block film BK is formed in the second embodiment is the same as that in the first embodiment, and thus a repeated description thereof will be omitted below.

Figure 46:
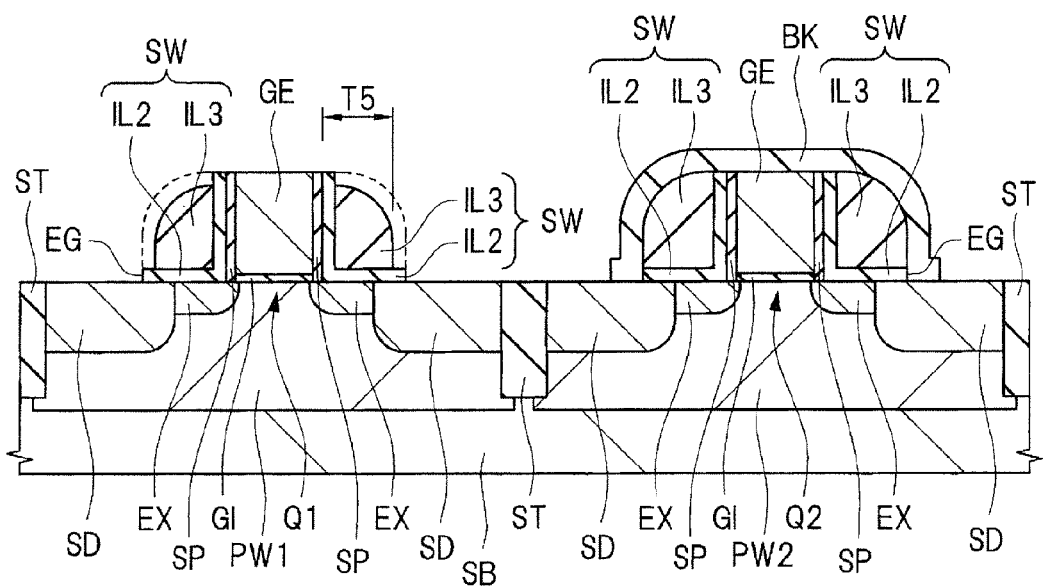
FIG. 46 is a cross-sectional view of a main part of another manufacturing step of the semiconductor device, following the step shown in FIG. 45.

Then, as shown in FIG. 46, in step S13a corresponding to step S13, the sidewall spacers SW are subjected to isotropic etching (in step S13a of FIG. 42). FIG. 46 shows the position of the surface of the insulating film IL3 forming the sidewall spacer SW by a dotted line in the stage before the etching in step S13a (that is, in the stage shown in FIG. 45).

The conditions for isotropic etching in step S13a of this embodiment are the same as those for isotropic etching in step S13 of the first embodiment, and thus a repeated description thereof will be omitted below. The etching at this time will be briefly described below. That is, the isotropic etching in step S13a is performed on conditions (etching conditions) in which the insulating film IL2 is less likely to be etched than the insulating film IL3. In step S13a, the isotropic etching is preferably performed on the conditions (etching conditions) in which the semiconductor substrate SB is less likely to be etched than the insulating film IL3. The isotropic etching in step S13a is preferably wet etching.

Like step S13 of the first embodiment, in the etching process of step S13a of the second embodiment, the insulating film IL3 forming the sidewall spacer SW is selectively etched, and the insulating film IL2 forming the sidewall spacer SW is suppressed from being etched. The process in step S13a is the isotropic etching, so that the insulating film IL3 forming the sidewall spacer SW is etched (side-etched) in the lateral direction. The etching process in step S13a decreases (thins) the thickness of the sidewall spacer SW. That is, after the etching process in step S13a, the thickness of the sidewall spacer SW is decreased (thinned).

That is, before the etching process in step S13a, the thickness of the sidewall spacer SW is substantially the thickness T4, but the etching process in step S13a decreases the thickness of the sidewall spacer SW to the thickness T5 which is smaller than the thickness T4 (T5<T4).

After the etching in step S13a, the edge EG of the insulating film IL2 of each sidewall spacer SW extending over the semiconductor substrate SB (p-type well PW1) protrudes from the side surface of the insulating film IL3 of the sidewall spacer SW. The term "side surface of the insulating film IL3 forming the sidewall spacer SW" means a side surface of the insulating film IL3 on the side opposite to the side adjacent to the gate electrode GE via the sidewall insulating film SP and the insulating film IL2.

The step S13a of the second embodiment differs from the step S13 of the first embodiment in that in step S13a of the second embodiment, the isotropic etching is performed with the silicide block film BK formed. Among the sidewall spacers SW for the MISFETQ1 and the sidewall spacers SW for the MISFETQ2, the sidewall spacers SW for the MISFETQ2 are covered with the silicide block film BK, and the sidewall spacers SW for the MISFETQ1 are not covered with the silicide block film BK.

In the sidewall spacers SW for the MISFETQ1, after the etching in step S13a, the edge EG of the insulating film IL2 of each sidewall spacer SW extending over the semiconductor substrate SB (p-type well PW1) protrudes from the side surface of the insulating film IL3 of the sidewall spacer SW. In contrast, the sidewall spacers SW for the MISFETQ2 are covered with the silicide block film BK, and not etched in step S13a, so that the edge EG of the insulating film IL2 of each sidewall spacer SW extending over the semiconductor substrate SB (p-type well PW2) is substantially flush (aligned) with the side surface of the insulating film IL3 of the sidewall spacer SW. The process in step S13a is basically the same as the process in step S13 except for the above point.

The following steps in the manufacturing process of the second embodiment are the same as those in the manufacturing process of the above first embodiment.

Figure 47:
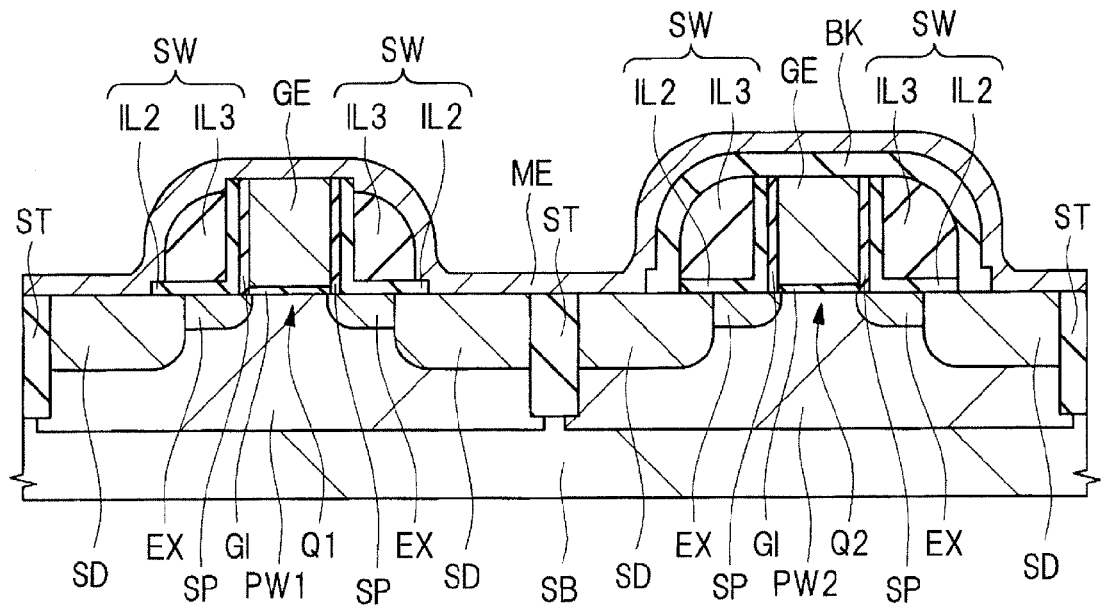
FIG. 47 is a cross-sectional view of a main part of another manufacturing step of the semiconductor device, following the step shown in FIG. 46.
Figure 48:
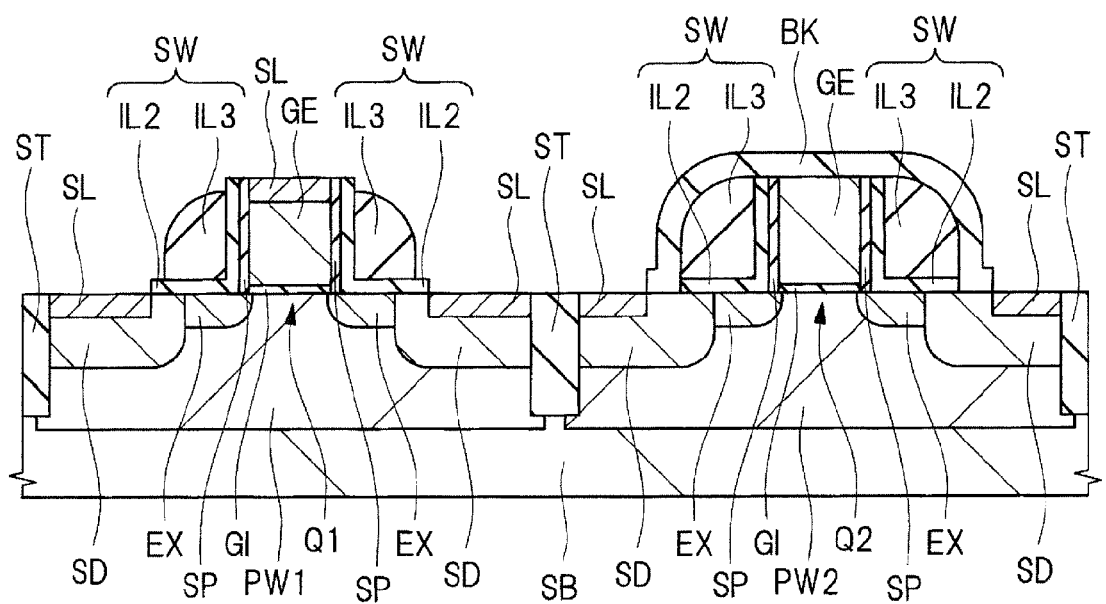
FIG. 48 is a cross-sectional view of a main part of another manufacturing step of the semiconductor device, following the step shown in FIG. 47.

That is, the metal silicide layer SL is formed in step S17. Specifically, as shown in FIG. 47, the metal film ME is formed over the main surface (entire main surface) of the semiconductor substrate SB to cover the gate electrode GE, the sidewall spacers SW, the source and drain regions SD, and the silicide block film BK. Since at this time, the silicide block film BK is not formed over the gate electrode GE and source and drain regions SD for the MISFETQ1, the metal film ME is in contact with the gate electrode GE and source and drain regions SD for the MISFETQ1. In contrast, since the silicide block film BK is formed over the gate electrode GE and source and drain regions SD for the MISFETQ2, the gate electrode GE and source and drain regions SD for the MISFETQ2 are not in contact with the metal film ME except for the regions not covered with the silicide block film BK. Then, the heat treatment is performed to react the metal film ME with the gate electrode GE (Si included therein) and the source and drain regions SD (Si included therein) to thereby form the metal silicide layer SL as shown in FIG. 48. Thereafter, the unreacted (excessive) metal film ME is removed, whose stage is illustrated in FIG. 48.

Since the silicide block film BK is not formed over the gate electrode GE and source and drain regions SD for the MISFETQ1, the metal silicide layer SL is formed substantially over the entire upper part (upper layer part) of the gate electrode GE and source and drain regions SD for the MISFETQ1. The silicide block film BK is formed over the gate electrode GE and source and drain regions SD for the MISFETQ2 except for the parts thereof. Thus, the metal silicide layer SL is formed over the upper part (upper layer part) not covered with the silicide block film BK within the gate electrode GE and source and drain regions SD for the MISFETQ2, while the metal silicide layer SL is not formed in the parts of the gate electrode GE and source and drain regions SG for the MISFETQ2 covered with the silicide block film BK. That is, the reaction layer between the metal film ME and the source and drain region SD (metal silicide layer SL) is not formed in the parts of the source and drain regions SD for the MISFETQ2 covered with the silicide block film BK. The reaction layer between the metal film ME and the gate electrode GE (metal silicide layer SL) is not formed in the parts of the gate electrode GE for the MISFETQ2 covered with the silicide block film BK.

Figure 49:
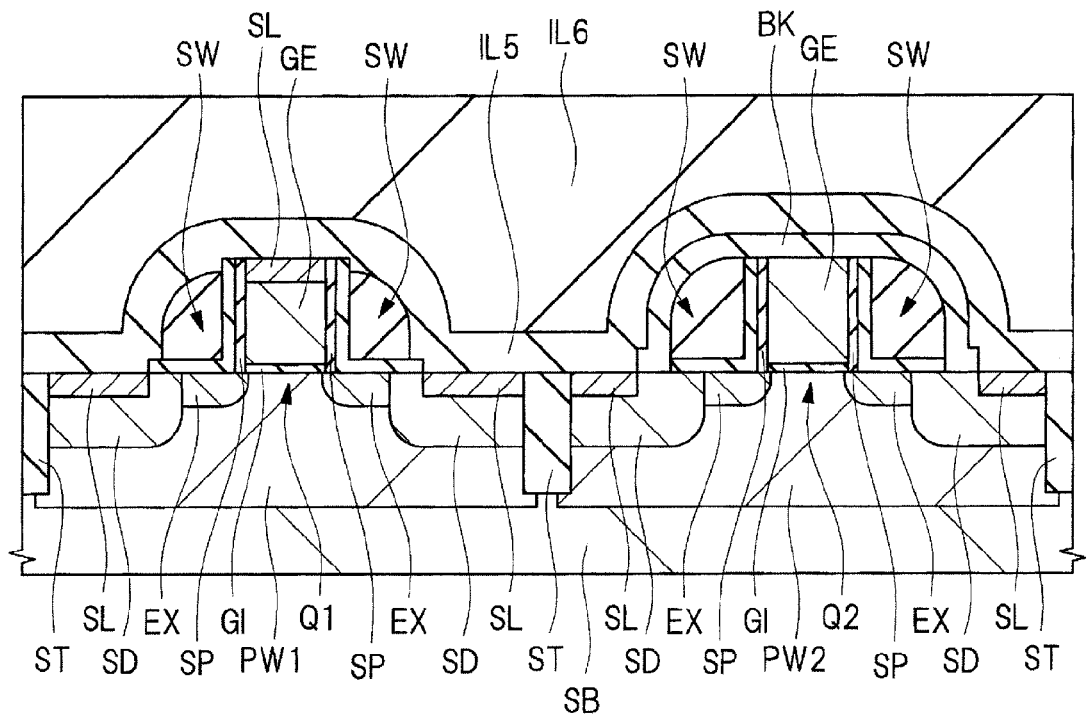
FIG. 49 is a cross-sectional view of a main part of another manufacturing step of the semiconductor device, following the step shown in FIG. 48.

Then, as shown in FIG. 49, in step S18, the insulating film IL5 is formed over the main surface (entire main surface) of the semiconductor substrate SB to cover the gate electrodes GE, the sidewall spacers SW, the metal silicide layers SL, and the silicide block film. BK. In step S19, the insulating film IL6 is formed over the insulating film IL5. After forming the insulating film IL6, if necessary, the upper surface of the insulating film IL6 is polished by a chemical mechanical polishing (CMP), which can enhance the flatness of the upper surface of the insulating film IL6.

Figure 50:
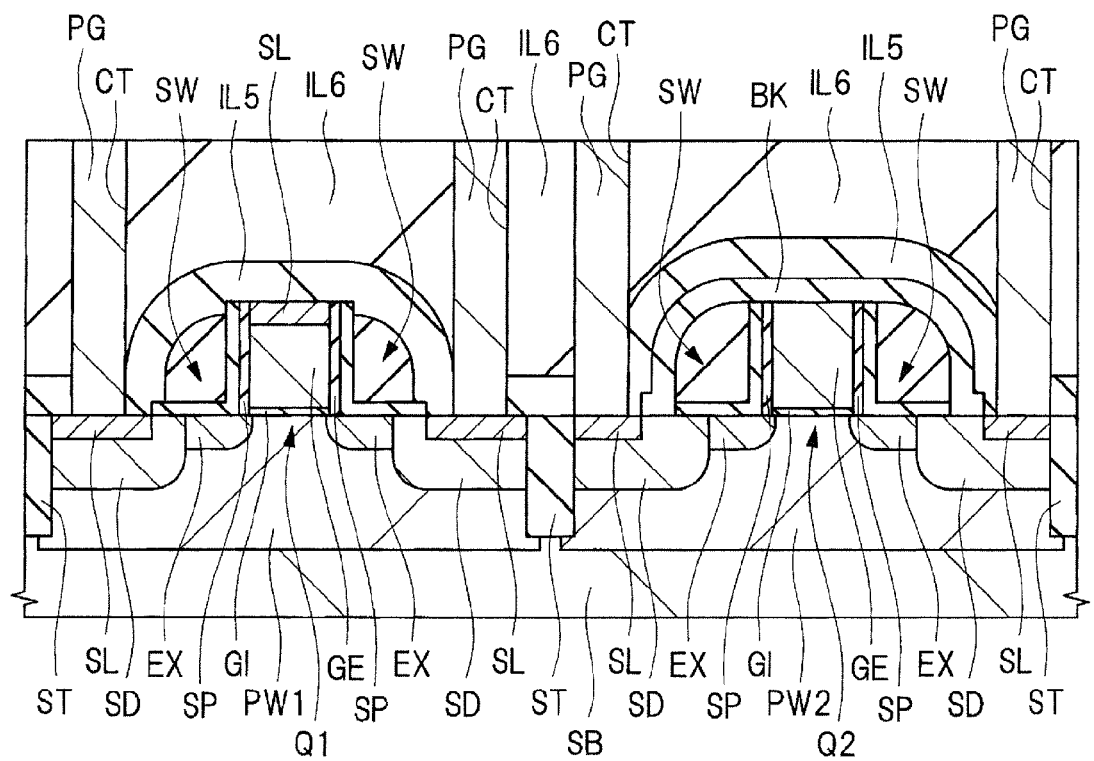
FIG. 50 is a cross-sectional view of a main part of another manufacturing step of the semiconductor device, following the step shown in FIG. 49.
Figure 51:
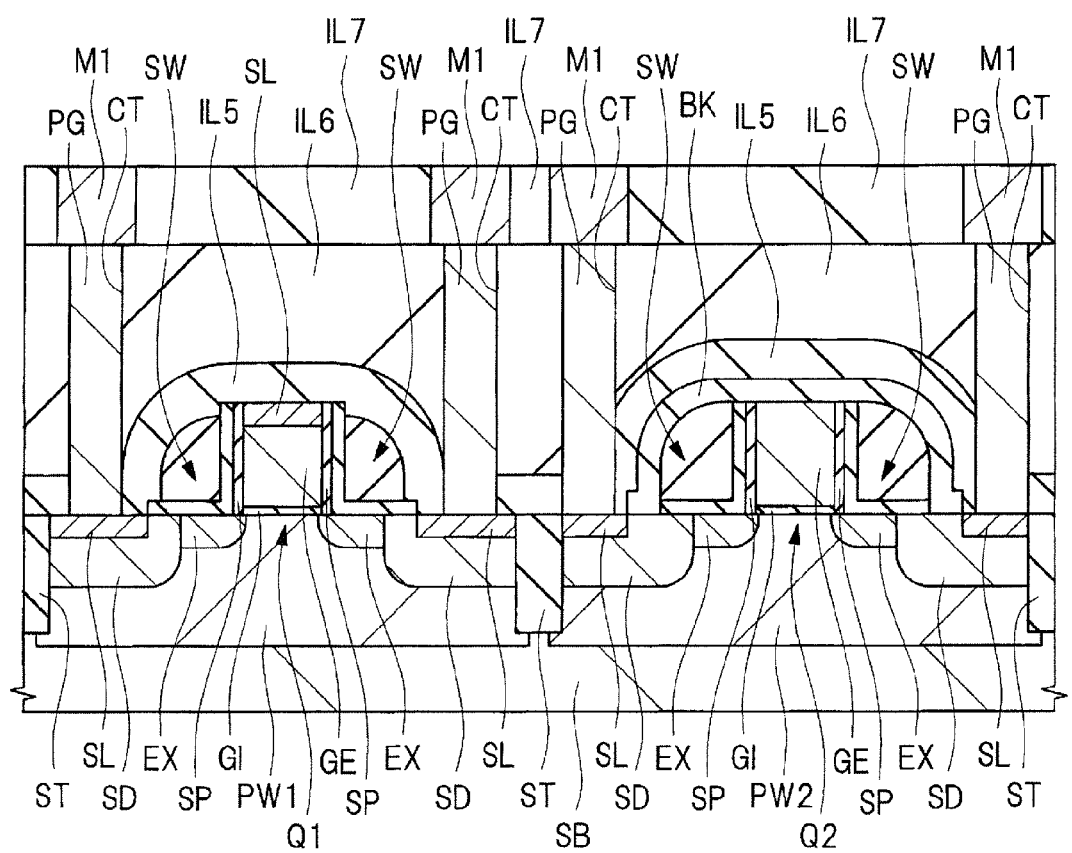
FIG. 51 is a cross-sectional view of a main part of another manufacturing step of the semiconductor device, following the step shown in FIG. 50.

Then, as shown in FIG. 50, in step S20, the contact holes CT are formed in the laminated film of the insulating films IL6 and IL5. The formation way of the contact hole CT is the same as that described with reference to FIGS. 19 and 20. Then, in step S21, the conductive plugs PG are formed (embedded) in the respective contact holes CT. Thereafter, as shown in FIG. 51, the insulating film IL7 is formed over the insulating film IL6 with the plug PG embedded therein. The wiring M1 is formed by the damascene method. In the way described above, the semiconductor device of this embodiment is manufactured.

The second embodiment can also obtain the substantially same effects as those of the first embodiment, but differs from the first embodiment in the following points.

That is, in the first embodiment, in step S13, the sidewall spacers SW are subjected to isotropic etching to decrease the thickness of the sidewall spacer SW. Then, in steps S15 and S16, the silicide block film BK is formed. Thereafter in step S17, the metal silicide layer SL is formed. In contrast, in the second embodiment, in steps S15 and S16, the silicide block film BK is formed. Then, in step S13a, the sidewall spacers SW are subjected to isotropic etching to decrease the thickness of the sidewall spacer SW. Thereafter, in step S17, the silicide block film BK is formed.

In the first and second embodiments, when isotropically etching the sidewall spacers SW to decrease the thickness of the sidewall spacers SW in step S13 or S13a, the etching is performed on conditions where the insulating film IL2 is less likely to be etched than the insulating film IL3. After the etching in step S13 or 13a, the edge EG of the insulating film IL2 of each sidewall spacer SW extending over the semiconductor substrate SB (p-type well PW1) protrudes from the side surface of the insulating film IL3 of the sidewall spacer SW. This state is more likely to be kept until the metal silicide layer SL is formed in step S17 in the second embodiment than in the first embodiment.

That is, in the second embodiment, after the step S13a, the operation can proceed to step S17 (formation step of the metal silicide layer SL) without performing the processes in step S15 and S16. Thus, in the second embodiment, a part of the insulating film IL2 extending from the side surface of the insulating film IL3 in the sidewall spacers SW not covered with the silicide block film BK is prevented from being etched by the etching process of step S16 (etching of the insulating film IL4).

Thus, from the viewpoint of preventing the end of the metal silicide layer SL (end on the side opposed to the channel formation region) from approaching the channel formation region, the second embodiment is more advantageous than the first embodiment in forming the metal silicide layer SL over the source/drain region SD. The second embodiment can accurately suppress or prevent the end of the metal silicide layer SL from approaching the channel formation region in forming the metal silicide layer SL to accurately suppress the leakage current. Thus, the second embodiment can improve the performance of the semiconductor device.

In contrast, in the first embodiment, the isotropic etching process of the sidewall spacer SW in step S13 can be performed before the activation annealing as a heat treatment for activation the process in step S14. The activation annealing in step S14 is the heat treatment performed at the highest temperature during the manufacturing processes of the semiconductor device. The sidewall spacers SW (insulating film IL3 included therein) is less likely to be etched by being subjected to the heat treatment (activation annealing) at such a high temperature. The first embodiment is more advantageous than the second embodiment from the viewpoint of the fact that the etching process in step S13 or S13a is easily performed. Thus, the first embodiment is more preferable from the viewpoint of appropriately managing the manufacturing processes of the semiconductor device.

The MISFET having a narrow distance (W1, W3) between the gate electrodes, and which tends to easily have the problems described in FIGS. 23 to 28 is a MISFET having the metal silicide SL formed thereat (that is, MISFET not covered with the silicide block film BK), for example, the region having a memory cell of a memory (such as a SRAM or a flash memory). In the second embodiment, the MISFET not covered with the silicide block film BK can decrease the thickness of the sidewall spacer SW in step S13a to thereby prevent the problems described with reference to FIGS. 23 to 28. In contrast, the MISFET for preventing the formation of the metal silicide layer SL by forming the silicide block film BK does not have such a narrow distance between the gate electrodes (W1, W3). In the second embodiment, the process in step S13a is performed with the sidewall spacers SW covered with the block film BK in the MISFET having the silicide block film BK formed therein, which does not decrease the thickness of the sidewall spacer SW in step S13a, but does not lead to the problems described above with reference to FIGS. 23 to 28.

In the semiconductor device manufactured in the second embodiment, the structure of the sidewall spacer SW (sidewall spacer SW for the MISFETQ2) covered with the silicide block film BK differs from the structure of the sidewall spacer SW (sidewall spacer SW for the MISFETQ1) not covered with the silicide block film BK in the following points. The sidewall spacer SW (sidewall spacer SW for the MISFETQ1) not covered with the silicide block film BK has a thickness smaller than that of the structure of the sidewall spacer SW (sidewall spacer SW for the MISFETQ2) covered with the silicide block film BK. This is based on the following reason. The thickness of the sidewall spacer SW (sidewall spacer SW for the MISFETQ2) covered with the silicide block film BK corresponds to the thickness T4. The thickness of the sidewall spacer SW (sidewall spacer SW for the MISFETQ1) not covered with the silicide block film BK corresponds to the thickness T5. The relationship between T4 and T5 satisfies the formula of T5<T4.

Next, a modified example (second modified example) of the second embodiment will be described below with reference to FIGS. 52 to 56. FIGS. 52 to 56 are cross-sectional views of main parts of other manufacturing steps of the semiconductor device in the modified example of the second embodiment. The modified example of the second embodiment is hereinafter referred to as the "second modified example".

Figure 52:
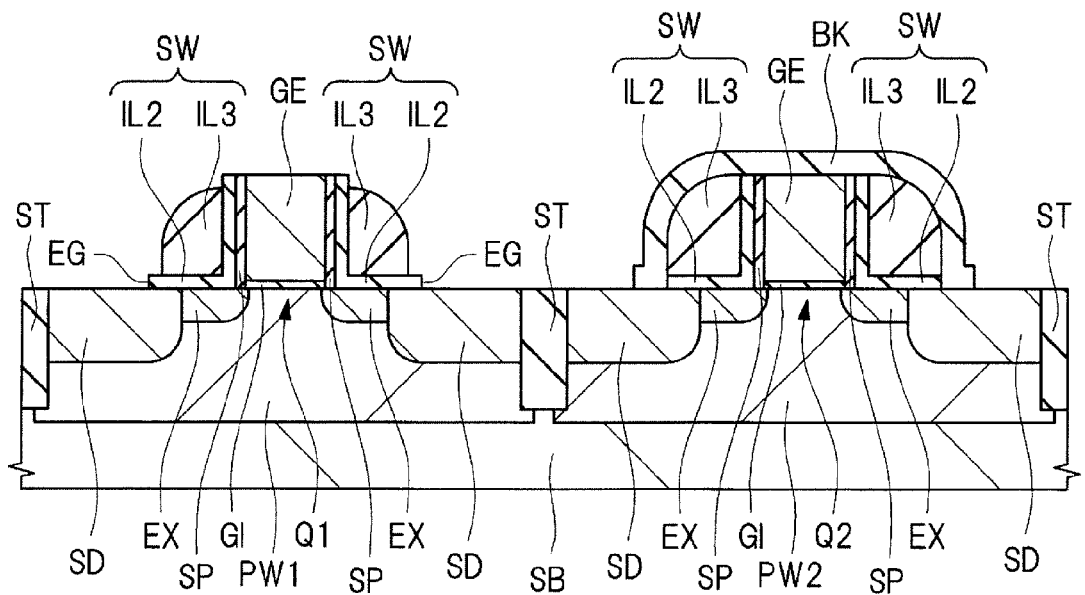
FIG. 52 is a cross-sectional view of a main part of another manufacturing step of a semiconductor device in a second modified example.

In the second modified example, the processes until the step S13a (isotropic etching of the sidewall spacer SW) are performed according to the manufacturing procedure of the above-mentioned second embodiment to obtain the structure shown in FIG. 52 which is the same as that of FIG. 46. The processes until this step of the second modified example are the same as those in the above-mentioned second embodiment, and a repeated description thereof will be omitted below.

That is, the metal silicide layer SL is formed in step S17. As mentioned in the first embodiment, the process in step S17 includes the steps of: forming the metal film ME; reacting the metal film ME with the respective upper parts (upper layer parts) of the source and drain regions SD and the gate electrode GE by heat treatment; and removing unreacted (excessive) parts of the metal film ME. After removing the unreacted (excessive) parts of the metal film ME, the second-time heat treatment is sometimes performed.

The metal film ME can be formed, for example, sputtering. After the process in step S13a, and before forming the metal film ME, the semiconductor substrate SB is preferably subjected to cleaning (wet cleaning). The above-mentioned cleaning is hereinafter referred to as a "pre-deposition cleaning process of the metal film ME". The pre-deposition cleaning process of the metal film ME is the process for wet cleaning of the semiconductor substrate SB. After performing the pre-deposition cleaning process of the metal film ME, preferably, the deposition process of the metal film ME is immediately performed.

The pre-deposition cleaning process of the metal film ME sometimes has an etching effect. For example, the use of the hydrofluoric acid aqueous solution can perform the pre-deposition cleaning process of the metal film ME. Even if a natural oxide film is formed over the source/drain region SD or the like, the use of the pre-deposition cleaning process of the metal film ME with the etching effect removes the natural oxide film, so that the metal film ME can be formed so as to be surely in contact with the source/drain region SD not covered with the silicide block film BK. Thus, the natural oxide film can be accurately prevented from interrupting the formation of the metal silicide layer SL.

Figure 53:
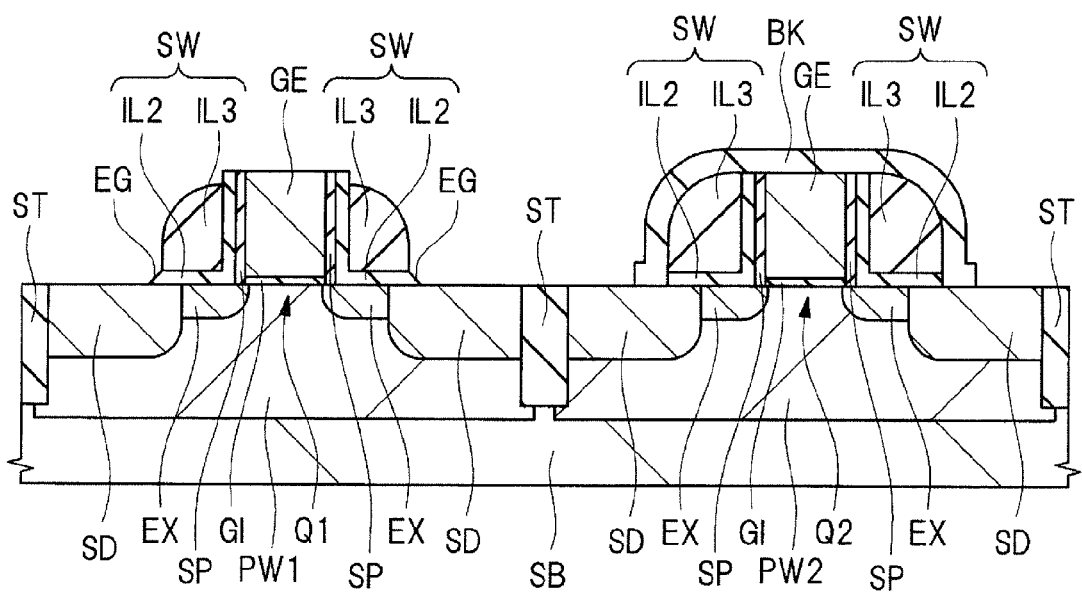
FIG. 53 is a cross-sectional view of a main part of another manufacturing step of the semiconductor device, following the step shown in FIG. 52.

However, in the sidewall spacer SW not covered with the silicide block film BK, apart of the insulating film IL2 protruding from the side surface of the insulating film IL3 is sometimes etched by the pre-deposition cleaning process of the metal film ME. FIG. 53 shows the state directly after the pre-deposition cleaning process of the metal film ME.

That is, when the isotropic etching is performed in step S13a, in the sidewall spacer SW not covered with the silicide block film BK, the edge (EG) of the insulating film IL2 extending over the semiconductor substrate SB (p-type well PW1) protrudes from the side surface of the insulating film IL3 forming the sidewall spacer SW (see FIG. 52). The part of the insulating film IL2 protruding from the side surface of the insulating film IL3 is etched by the pre-deposition cleaning process of the metal film ME (see FIG. 53). That is, the pre-deposition cleaning process of the metal film ME etches the part of the insulating film IL2 protruding from the insulating film IL3 in the sidewall spacer SW not covered with the silicide block film BK.

Figure 54:
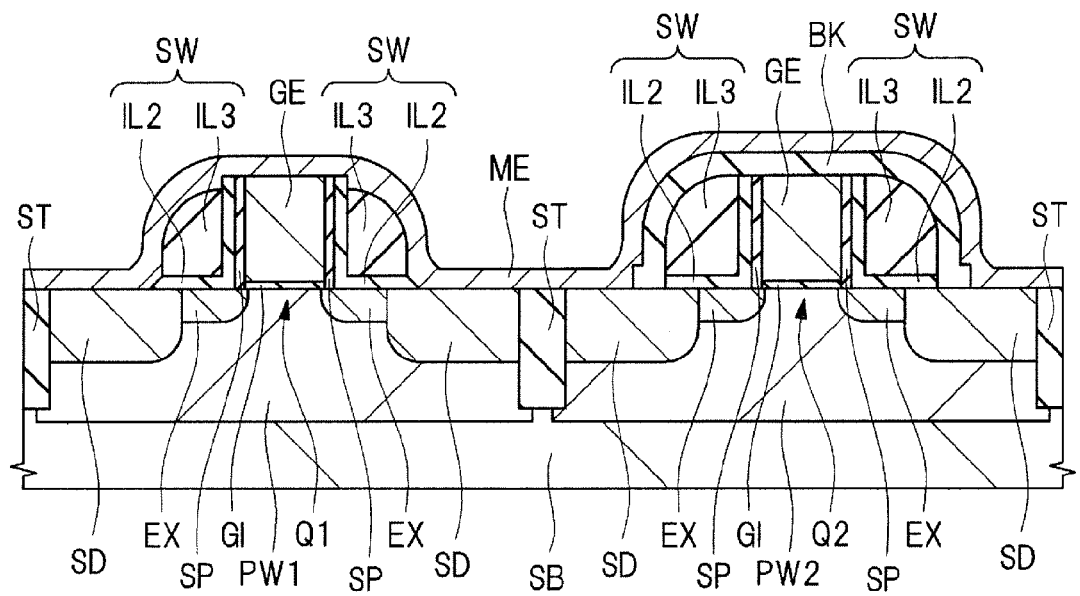
FIG. 54 is a cross-sectional view of a main part of another manufacturing step of the semiconductor device, following the step shown in FIG. 53.
Figure 55:
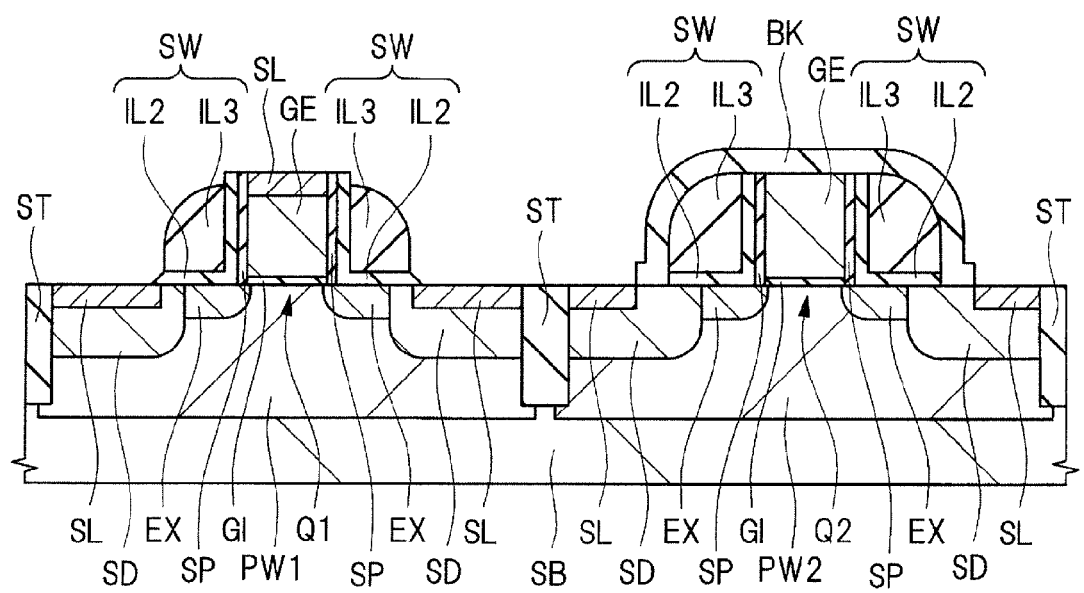
FIG. 55 is a cross-sectional view of a main part of another manufacturing step of the semiconductor device, following the step shown in FIG. 54.

The following steps of this example are the same as those in the manufacturing process of the above second embodiment. That is, after the pre-deposition cleaning process of the metal film ME, as shown in FIG. 54, the metal film ME is formed (deposited) over the main surface (entire main surface) of the semiconductor substrate SB using the sputtering to cover the gate electrode GE, the sidewall spacers SW, the source and drain regions SD, and the silicide block film BK. Then, the heat treatment is performed to react the metal film ME with the gate electrode GE (Si included therein) and the source and drain regions SD (Si included therein) to thereby form the metal silicide layer SL as the reaction layer between the metal and the semiconductor. Then, the unreacted (excessive) parts of the metal film ME are removed. FIG. 55 shows the stage in which the unreacted (excessive) parts of the metal film ME are removed. After removing the unreacted (excessive) parts of the metal film ME, the second-time heat treatment is sometimes performed.

Since the silicide block film BK is not formed over the gate electrode GE and source and drain regions SD for the MISFETQ1, the metal silicide layer SL is formed substantially over the upper part (upper layer part) of the gate electrode GE and source and drain regions SD for the MISFETQ1. In contrast, the silicide block film BK is formed over the gate electrode GE and source and drain regions SD for the MISFETQ2 except for some parts thereof. The metal silicide layer SL is formed over the upper portion (upper layer) of the parts of the gate electrode GE and source and drain regions SD for the MISFETQ2 not covered with the silicide block film BK, while the metal silicide layer SL is not formed over other parts thereof covered with the silicide block film BK.

Figure 56:
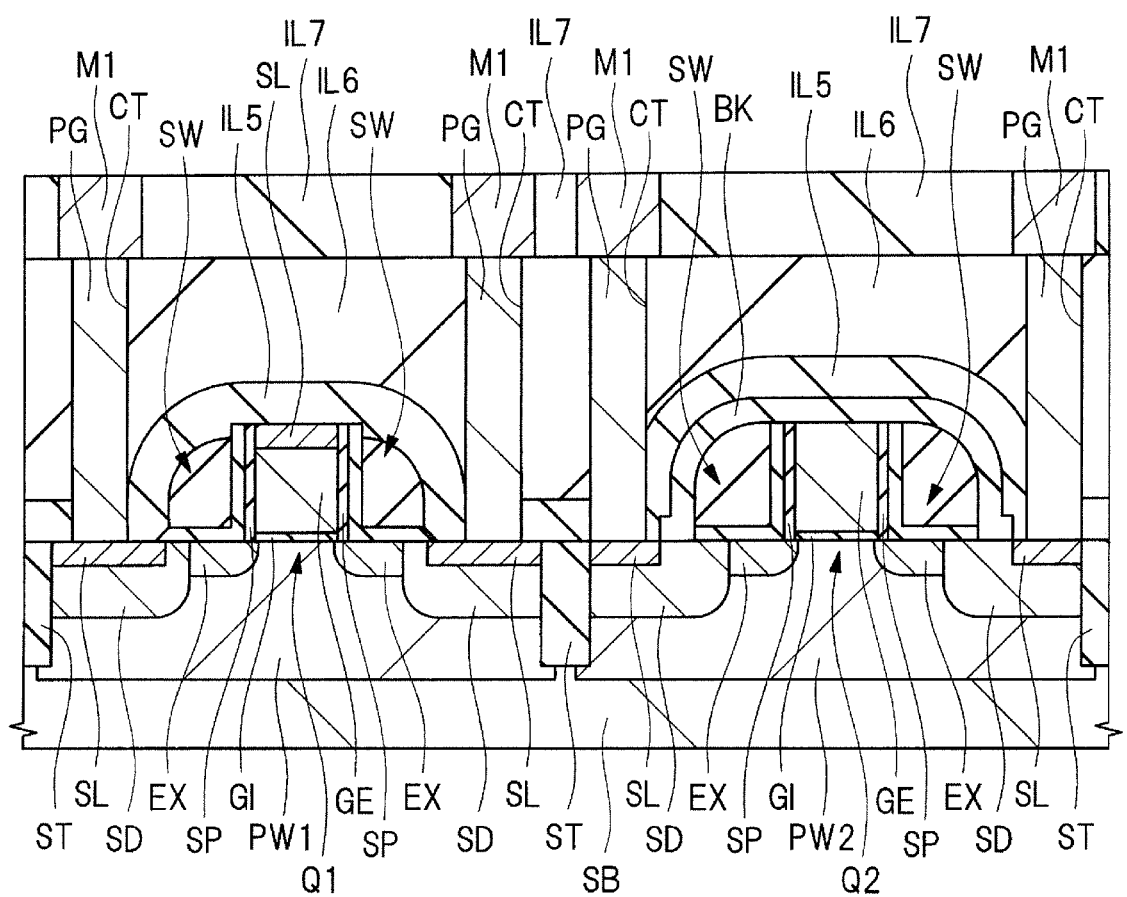
FIG. 56 is a cross-sectional view of a main part of another manufacturing step of the semiconductor device, following the step shown in FIG. 55.

Then, as shown in FIG. 56, in step S18, the insulating film IL5 is formed. In step S19, the insulating film IL6 is formed over the insulating film IL5. In step S20, the contact holes CT are formed in the laminated film of the insulating films IL6 and IL5. In step S21, conductive plugs PG are formed (embedded) in the contact holes CT. Then, the insulating film IL7 is formed over the insulating film IL6 with the plugs PG embedded therein, and then wirings M1 are formed by the damascene method. In the way described above, the semiconductor device of this embodiment is manufactured.

The second modified example can also have substantially the same effects as those of the above second embodiment. However, the second modified example differs from the above-mentioned second embodiment in the following points.

That is, in the second modified example, the part of the insulating film IL2 protruding from the side surface of the insulating film IL3 is etched by the pre-deposition cleaning process of the metal film ME in the sidewall spacer SW not covered with the silicide block film BK. In the second modified example, the end (end on the side opposed to the channel formation region) of the metal silicide layer SL might possibly approach the channel formation region by an etching amount in forming the metal silicide layer SL over the source/drain region SD, as compared to the second embodiment.

The cleaning process, however, is not a positive etching process, so that the etching effect of the cleaning process is much smaller than that of a general etching process. The etching degree of the part of the insulating film IL2 protruding from the side surface of the insulating film IL3 in the sidewall spacer SW in the pre-deposition cleaning process of the metal film ME in the second modified example tends to be small as compared to that in the etching process of step S16 in the first modified example of the first embodiment.

Thus, from the viewpoint of preventing the end of the metal silicide layer SL (end on the side opposed to the channel formation region) from approaching the channel formation region as much as possible, the second modified example is more advantageous than the first modified example of the first embodiment in forming the metal silicide layer SL over the source/drain region SD.

Accordingly, not only the above second embodiment, but also the second modified example can have the effect of suppressing or preventing the end of the metal silicide layer SL from approaching the channel formation region in forming the metal silicide layer SL to thereby suppress the leakage current. The effect made in the sidewall spacer SW not covered with the silicide block film BK becomes larger, particularly, when the part of the insulating film IL2 protruding from the side surface of the insulating film IL3 is suppressed from being etched by the pre-deposition cleaning process of the metal film ME.

However, in the second modified example, even when the part of the insulating film IL2 protruding from the side surface of the insulating film IL3 is etched in the sidewall spacer SW not covered with the silicide block film BK, the natural oxide film formed over the source/drain region SD can be easily removed in the pre-deposition cleaning process of the metal film ME. As a result, the metal film ME can be formed such that the metal film ME is surely in contact with the source/drain region SD not covered with the silicide block film BK, which can accurately prevent the natural oxide film from interrupting the formation of the metal silicide layer SL.

The invention made by the inventors has been specifically described above based on the preferred embodiments, but is not limited to the above embodiments. It is apparent that various modifications and changes can be made to those embodiments without departing from the scope of the invention.

What is claimed is:

1. A manufacturing method of a semiconductor device having a first metal-insulator-semiconductor field-effect transistor (MISFET), the method comprising steps of:
   (a) providing a semiconductor substrate;
   (b) forming a first gate electrode for the first MISFET over the semiconductor substrate via a gate insulating film;
   (c) after the step (b), forming a first insulating film over the semiconductor substrate to cover the first gate electrode;
   (d) after the step (c), forming a second insulating film over the first insulating film;
   (e) after the step (d), forming a first sidewall spacer including the first insulating film and the second insulating film over a sidewall of the first gate electrode by etching back the second insulating film and the first insulating film;

(f) after the step (e), forming first source and drain regions for the first MISFET in the semiconductor substrate by performing ion-implantation in the semiconductor substrate using the first gate electrode and the first sidewall spacer as a mask;

(g) after the step (f), isotropically etching the first sidewall spacer under conditions in which the first insulating film is etched less than the second insulating film to decrease a thickness of the first sidewall spacer, wherein after the step (g), the first sidewall spacer is formed of the first insulating film and the second insulating film, and wherein in the step (g), an edge of a part of the first insulating film adjacent the source and drain regions forming the first sidewall spacer and extending over the semiconductor substrate protrudes from a side surface of the second insulating film forming the first sidewall spacer by the isotropic etching;

(h) after the step (g), forming a reaction layer resulting from a reaction between metal and the first source and drain regions over the first source and drain regions;

(i) after the step (h), forming a third insulating film over the semiconductor substrate to cover the first gate electrode and the first sidewall spacer;

(j) after the step (i), forming a fourth insulating film over the third insulating film; and (k) after the step (j), forming a contact hole in the fourth insulating film and the third insulating film.

2. The manufacturing method of a semiconductor device according to claim 1, the step (h) comprising steps of:
(h1) forming a metal film over the semiconductor substrate to cover the first gate electrode, the first sidewall spacer, and the first source and drain regions, in contact with the first source and drain regions;
(h2) reacting the metal film with the first source and drain regions by heat treatment to form the reaction layer resulting from a reaction between the metal film and the first source and drain regions over the first source and drain regions; and
(h3) removing unreacted parts of the metal film.

3. The manufacturing method of a semiconductor device according to claim 2, wherein in the step (g), the first sidewall spacer is
isotropically etched under conditions in which the first insulating film and the semiconductor substrate are etched less than the second insulating film.

4. The manufacturing method of a semiconductor device according to claim 3, wherein the first insulating film and the second insulating film are formed of different insulating materials.

5. The manufacturing method of a semiconductor device according to claim 4, wherein a thickness of the second insulating film formed in the step (d) is larger than a thickness of the first insulating film formed in the step (c).

6. The manufacturing method of a semiconductor device according to claim 5, wherein the first insulating film is a silicon oxide film, and the second insulating film is a silicon nitride film.

7. The manufacturing method of a semiconductor device according to claim 2, further comprising a step of:
(b1) after the step (b) and before the step (c), forming a first semiconductor region by performing ion-implantation in the semiconductor substrate using the first gate electrode as a mask, the first semiconductor region having a same conduction type as that of the first source and drain regions, and having a lower concentration of impurities than that of the first source and drain regions.

8. The manufacturing method of a semiconductor device according to claim 2, further comprising a step of:
(g1) after the step (g) and before the step (h), performing a heat treatment for activating impurities introduced into the first source and drain regions.

9. The manufacturing method of a semiconductor device according to claim 2, wherein the step (k) includes steps of:
(k1) forming the contact hole in the forth insulating film by etching the forth insulating film; and
(k2) after the step (k1), removing the third insulating film located at a bottom of the contact hole by etching,
wherein in the step (k1), the third insulating film serves as an etching stopper film.

10. A manufacturing method of a semiconductor device having a first metal-insulator-semiconductor field-effect transistor (MISFET) comprising steps of:
(a) providing a semiconductor substrate;
(b) forming a first gate electrode for the first MISFET over the semiconductor substrate via a gate insulating film;
(c) after the step (b), forming a first insulating film over the semiconductor substrate to cover the first gate electrode;
(d) after the step (c), forming a second insulating film over the first insulating film;
(e) after the step (d), forming a first sidewall spacer including the first insulating film and the second insulating film over a sidewall of the first gate electrode by etching back the second insulating film and the first insulating film;
(f) after the step (e), forming first source and drain regions for the first MISFET in the semiconductor substrate by performing ion-implantation in the semiconductor substrate using the first gate electrode and the first sidewall spacer as a mask, the step (f) comprising:
(f1) forming second source and drain regions for a second MISFET in the semiconductor substrate;
(g) after the step (f), isotropically etching the first sidewall spacer under conditions in which the first insulating film is etched less than the second insulating film to decrease a thickness of the first sidewall spacer, wherein after the step (g), the first sidewall spacer is formed of the first insulating film and the second insulating film, the step (g) comprising
(g2) after the step (g) forming a fifth insulating film over the semiconductor substrate to cover the first gate electrode, the first sidewall spacer, the first source and drain regions, and the second source and drain regions; and
(g3) after the step (g2), removing a part of the fifth insulating film by etching from over the first gate electrode, the first sidewall spacer, and the first source and drain regions to leave another part of the fifth insulating film over at least a part of the second source and drain regions,
(h) after the step (g), forming a reaction layer resulting from a reaction between metal and the first source and drain regions over the first source and drain regions, the step (h) comprising:
(h1) forming a metal film over the semiconductor substrate to cover the first gate electrode, the first sidewall spacer, and the first source and drain regions, in contact with the first source and drain regions, wherein in the step (h1), the metal film is formed over the semiconductor substrate to cover the first gate electrode, the first sidewall spacer, the first source and drain regions, and the second source and drain regions, in contact with the first source and drain regions;
(h2) reacting the metal film with the first source and drain regions by heat treatment to form the reaction layer resulting from a reaction between the metal film and the first source and drain regions over the first source and drain regions, wherein in the step (h2), the reaction layer resulting from the reaction between the second source and drain regions and the metal film is not formed over a part covered with the fifth insulating film at the second source and drain regions; and (h3) removing unreacted parts of the metal film;

(i) after the step (h), forming a third insulating film over the semiconductor substrate to cover the first gate electrode and the first sidewall spacer;

(j) after the step (i), forming a fourth insulating film over the third insulating film; and (k) after the step j), forming a contact hole in the fourth insulating film and the third insulating film.

11. The manufacturing method of a semiconductor device according to claim 10, wherein in the step (g3), a part of the first insulating film forming the first sidewall spacer and protruding from a side surface of the second insulating film forming the first sidewall spacer is etched.

12. A manufacturing method of a semiconductor device having a first metal-insulator-semiconductor field-effect transistor (MISFET) comprising steps of:

(a) providing a semiconductor substrate;

(b) forming a first gate electrode for the first MISFET over the semiconductor substrate via a gate insulating film;

(c) after the step (b), forming a first insulating film over the semiconductor substrate to cover the first gate electrode;

(d) after the step (c), forming a second insulating film over the first insulating film;

(e) after the step (d), forming a first sidewall spacer including the first insulating film and the second insulating film over a sidewall of the first gate electrode by etching back the second insulating film and the first insulating film;

(f) after the step (e), forming first source and drain regions for the first MISFET in the semiconductor substrate by performing ion-implantation in the semiconductor substrate using the first gate electrode and the first sidewall spacer as a mask, the step (f) comprising:

(f1) forming second source and drain regions for a second MISFET in the semiconductor substrate;

(f2) after the step (f1), forming a fifth insulating film over the semiconductor substrate to cover the first gate electrode, the first sidewall spacer, the first source and drain regions, and the second source and drain regions;

(f3) after the step (f2), removing the fifth insulating film by etching from over the first gate electrode, the first sidewall spacer, and the first source and drain regions to leave the fifth insulating film over at least one part of the second source and drain regions, (g) after the step (f), isotropically etching the first sidewall spacer under conditions in which the first insulating film is etched less than the second insulating film to decrease a thickness of the first sidewall spacer, wherein after the step (g), the first sidewall spacer is formed of the first insulating film and the second insulating film;

(h) after the step (g), forming a reaction layer resulting from a reaction between metal and the first source and drain regions over the first source and drain regions, the step (h) comprising:

(h1) forming a metal film over the semiconductor substrate to cover the first gate electrode, the first sidewall spacer, and the first source and drain regions, in contact with the first source and drain regions, wherein in the step (h1), the metal film is formed over the semiconductor substrate to cover the first gate electrode, the first sidewall spacer, the first source and drain regions, and the second source and drain regions, in contact with the first source and drain regions, and (h2) reacting the metal film with the first source and drain regions by heat treatment to form the reaction layer resulting from a reaction between the metal film and the first source and drain regions over the first source and drain regions, wherein in the step (h2), the reaction layer resulting from the reaction between the second source and drain regions and the metal film is not formed over a part covered with the fifth insulating film at the second source and drain regions;

(i) after the step (h), forming a third insulating film over the semiconductor substrate to cover the first gate electrode and the first sidewall spacer;

(j) after the step (i), forming a fourth insulating film over the third insulating film; and (k) after the step j), forming a contact hole in the fourth insulating film and the third insulating film.

13. The manufacturing method of a semiconductor device according to claim 12, further comprising a step of:

(f4) after the step (f) and the step (f1), and before the step (f2), performing a heat treatment for activating impurities introduced into the first source and drain regions.

14. The manufacturing method of a semiconductor device according to claim 12, the step (h) including a step of:

(h4) before the step (h1), performing a wet cleaning of the semiconductor substrate, wherein in the step (h4), a part of the first insulating film forming the first sidewall spacer and protruding from a side surface of the second insulating film forming the first sidewall spacer is etched.

* * * * *